US012727105B2

(12) United States Patent
Solheid et al.

(10) Patent No.: US 12,727,105 B2
(45) Date of Patent: Sep. 1, 2026

(54) COMMUNICATIONS PANEL SYSTEMS AND TRAYS THEREFORE

(71) Applicant: CommScope Technologies LLC, Hickory, NC (US)

(72) Inventors: James J. Solheid, Minneapolis, MN (US); Matthew J. Holmberg, Le Center, MN (US); Jacob C. Anderson, Chanhassen, MN (US); Rodney C. Schoenfelder, Shakopee, MN (US)

(73) Assignee: COMMSCOPE TECHNOLOGIES LLC, Claremount (NC)

( * ) Notice: Subject to any disclaimer, the term of this patent is extended or adjusted under 35 U.S.C. 154(b) by 197 days.

(21) Appl. No.: 18/552,639

(22) PCT Filed: Mar. 25, 2022

(86) PCT No.: PCT/US2022/021949
§ 371 (c)(1),
(2) Date: Sep. 26, 2023

(87) PCT Pub. No.: WO2022/204515
PCT Pub. Date: Sep. 29, 2022

(65) Prior Publication Data

US 2024/0172383 A1 May 23, 2024

Related U.S. Application Data

(60) Provisional application No. 63/166,636, filed on Mar. 26, 2021, provisional application No. 63/197,040,
(Continued)

(51) Int. Cl.
*G02B 6/00* (2006.01)
*H02G 3/04* (2006.01)
*H05K 7/14* (2006.01)

(52) U.S. Cl.
CPC ................ *H05K 7/14* (2013.01); *H02G 3/04* (2013.01)

(58) Field of Classification Search
CPC .......... H05K 7/14; H05K 7/1421; H02G 3/04; H04Q 1/06; G02B 6/00
See application file for complete search history.

(56) References Cited

U.S. PATENT DOCUMENTS 6,215,081 B1 4/2001 Jensen et al.
6,982,515 B2 1/2006 Howell et al.
(Continued)

FOREIGN PATENT DOCUMENTS

EP 3 757 641 A1 12/2020
WO 2005/017594 A2 2/2005
(Continued)

OTHER PUBLICATIONS

International Search Report and Written Opinion for Application No. PCT/US2022/021949 mailed Jun. 30, 2022.
(Continued)

*Primary Examiner* — Jennifer Doan
(74) *Attorney, Agent, or Firm* — Merchant & Gould P.C.

(57) ABSTRACT

A latching arrangement by which a tray arrangement is releasably held in one or more positions relative to a chassis is at least partially actuated by a cable guide extending forwardly from the tray arrangement. In some example latching arrangements, the cable guide is pivoted relative to the tray arrangement to release a stop member from the chassis. In other example latching arrangements, the cable guide is slid relative to the tray arrangement to release the stop member. Certain types of latching arrangements have a second stop member that is separately actuated by a different part (e.g., an actuation leg) of the latching arrangement.

18 Claims, 54 Drawing Sheets

Related U.S. Application Data filed on Jun. 4, 2021, provisional application No. 63/278,941, filed on Nov. 12, 2021.

(56) References Cited

U.S. PATENT DOCUMENTS

| | | | |
|---|---|---|---|
| 7,075,209 B2 | 7/2006 | Howell et al. | |
| 8,041,175 B2 * | 10/2011 | Krampotich | G02B 6/4453 70/85 |
| 9,709,765 B2 | 7/2017 | Wells et al. | |
| 9,841,574 B1 | 12/2017 | Pilon | |
| 10,670,822 B2 | 6/2020 | Vogel | |
| 11,635,579 B2 | 4/2023 | Campbell et al. | |
| 11,740,421 B2 | 8/2023 | Van Baelen et al. | |
| 11,815,727 B2 | 11/2023 | Wells et al. | |
| 12,164,169 B2 | 12/2024 | Wells et al. | |
| 2006/0018622 A1 | 1/2006 | Caveney et al. | |
| 2008/0175552 A1 * | 7/2008 | Smrha | G02B 6/44526 385/135 |
| 2011/0281459 A1 | 11/2011 | Metral et al. | |
| 2014/0003782 A1 | 1/2014 | Blackwell, Jr. et al. | |
| 2015/0370025 A1 * | 12/2015 | Wells | G02B 6/44526 385/135 |
| 2017/0235076 A1 | 8/2017 | Solheid et al. | |
| 2018/0335595 A1 | 11/2018 | Takeuchi et al. | |
| 2020/0174213 A1 | 6/2020 | Douglas et al. | |
| 2020/0200988 A1 | 6/2020 | Vogel | |
| 2023/0333342 A1 | 10/2023 | Campbell et al. | |
| 2023/0367090 A1 | 11/2023 | Van Baelen et al. | |

FOREIGN PATENT DOCUMENTS

| | | | |
|---|---|---|---|
| WO | WO-2020242852 A1 * | 12/2020 | G02B 6/4453 |
| WO | 2022/204527 A1 | 9/2022 | |

OTHER PUBLICATIONS

Extended European Search Report for Application No. 22776725.8 mailed Jan. 29, 2025.

* cited by examiner

S
181
186
188
182
184
185
172
184
188
182
186
189
180
181
188
172
182
185
184
182
188
186
189

COMMUNICATIONS PANEL SYSTEMS AND TRAYS THEREFORE

CROSS-REFERENCE TO RELATED APPLICATIONS

This application is a National Stage Application of PCT/US2022/021949, filed on Mar. 25, 2022, which claims the benefit of U.S. Patent Application Ser. No. 63/166,636, filed on Mar. 26, 2021, claims the benefit of U.S. Patent Application Ser. No. 63/197,040, filed on Jun. 4, 2021 and claims the benefit of U.S. Patent Application Ser. No. 63/278,941, filed on Nov. 12, 2021, the disclosures of which are incorporated herein by reference in their entireties. To the extent appropriate, a claim of priority is made to each of the above disclosed applications.

BACKGROUND

In the telecommunications industry, the demand for added capacity is growing rapidly. This demand is being met in part by the increasing use and density of fiber optic transmission equipment. Even though fiber optic equipment permits higher levels of transmission in the same or smaller footprint than traditional copper transmission equipment, the demand requires even higher levels of fiber density. This has led to the development of high-density fiber handling equipment.

In communications panel systems, port members (e.g., optical adapters, electrical jacks, hybrid port members, etc.) defining front ports are mounted to one or more trays that are disposable within a chassis. The front ports are configured to receive plug connectors at the fronts of the trays. The trays can either be stationary within a chassis or can slide forwardly of the chassis to enhance access to the port members.

Improvements are desired.

SUMMARY

Some aspects of the disclosure are directed to a latching arrangement by which a tray arrangement can be releasably held in one or more positions relative to a chassis, the positions aligned along a forward-rearward axis of the chassis. In certain implementations, the tray arrangement can be releasably held in a retracted position where the tray arrangement is fully disposed within the chassis and in an extended position where the tray arrangement extends through a front of the chassis.

In certain implementations, the latching arrangement is actuated by movement of a cable guide extending forwardly of the tray arrangement. In some implementations, the cable guide is pivoted relative to the tray arrangement to actuate the latching arrangement. In other implementations, the cable guide is slid along the forward-rearward axis. In certain examples, movement of the cable guide releases only one of multiple stop members of the latching arrangement.

In some implementations, the latching arrangement includes first and second deflection members that cooperate to releasably retain the tray arrangement in one of the one or more positions through engagement of one or more catch surfaces defined by the chassis. The first deflection member defines the cable guide to be moved to actuate the latching arrangement. The stop member actuated by the cable guide can be defined by either the first deflection member or the second deflection member.

In certain implementations, one of the first and second deflection members defines a biasing member to bias the first and second deflection members to neutral positions. Each of the first and second deflection members is moved to a respective actuated position against the bias of the biasing member. In an example, the biasing member includes a leaf spring.

In certain implementations, the second deflection member defines a stop member that is not actuated by the cable guide. Rather, this stop member is actuated by pressing against an actuation leg of the second deflection member. The stop member actuated by the actuation leg moves independent of the stop member actuated by the cable guide. In some examples, the actuation leg defines a biasing member. In an example, the biasing member has a convex curvature when not actuated. In another example, the biasing member has a concave curvature when not actuated. In other examples, the actuation leg is rigid.

In other implementations, the latching arrangement includes a deflection arrangement and an actuation member that cooperate to releasably retain the tray arrangement in one of the one or more positions through engagement of one or more catch surfaces defined by the chassis. The actuation member defines the cable guide to be moved to actuate the latching arrangement. The deflection arrangement defines the stop member actuated by the actuation member. The stop member moves along an axis transverse to the movement axis of the actuation member. In certain examples, the actuation member slides along the forward-rearward axis of the chassis.

In certain implementations, one of more cable guides (e.g., front cable guides, rear cable guides, etc.) can be magnetically mounted to the tray arrangement. In certain example, each cable guide holds one or more magnets within respective cavities defined within a body of the cable guide. As the term is used herein, a cable guide refers to a guide for cables, fibers, conductors, or other elongate media segment carrying data signals or power or conduit (e.g., buffer tube) surrounding the same.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

Figure 1:
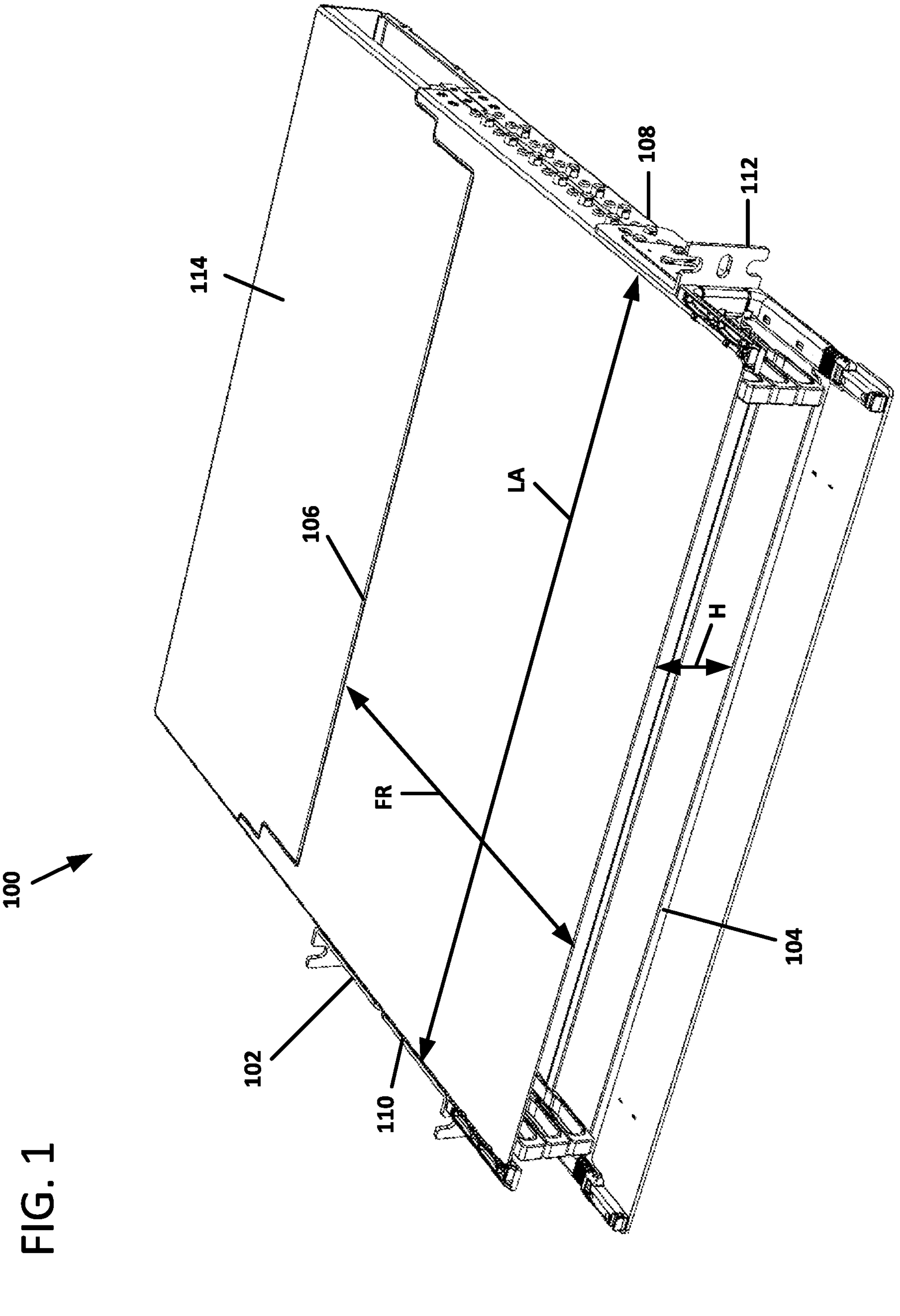
FIG. 1 is a perspective view of an example communications panel including a chassis configured to hold one or more tray arrangements and configured in accordance with the principles of the present disclosure.

Reference will now be made in detail to exemplary aspects of the present disclosure that are illustrated in the accompanying drawings. Wherever possible, the same reference numbers will be used throughout the drawings to refer to the same or like parts.

The present disclosure is directed to a communications panel 100 configured to mount to a rack. The communications panel 100 includes a chassis 102 holding one or more tray arrangements 120. The chassis 102 extends along a forward-rearward axis FR between a front 104 and a rear 106. The chassis 102 also extends along a lateral axis LA between opposite first and second sides 108, 110. The chassis 102 also has a height H extending between a bottom and a top. A cover may be mounted over the top of the chassis 102. In certain examples, the cover is removable. Example chassis 102 suitable for use with the tray arrangements 120 disclosed herein are described in co-pending U.S. provisional application No. 63/166,576, filed Mar. 26, 2021, titled "Communications Panel Systems," and U.S. provisional application No. 63/197,018, filed Jun. 4, 2021, and titled "Communications Panel Systems," the disclosures of which are hereby incorporated by reference in their entirety.

In certain implementations, mounting brackets 112 are disposed at the first and second sides 108, 110 and configured to mount the chassis 102 to the rack. In certain implementations, a cable management section is disposed at the rear 106 of the chassis 102 to manage cables extending to the chassis 102 from the rear. A removable cover 114 is mounted over the cable management section. In certain examples, the removable cover 114 is flush with the top of the chassis 102. In certain examples, sides of the cable management section remain uncovered to facilitate cable routing to the cable management section.

Figure 2:
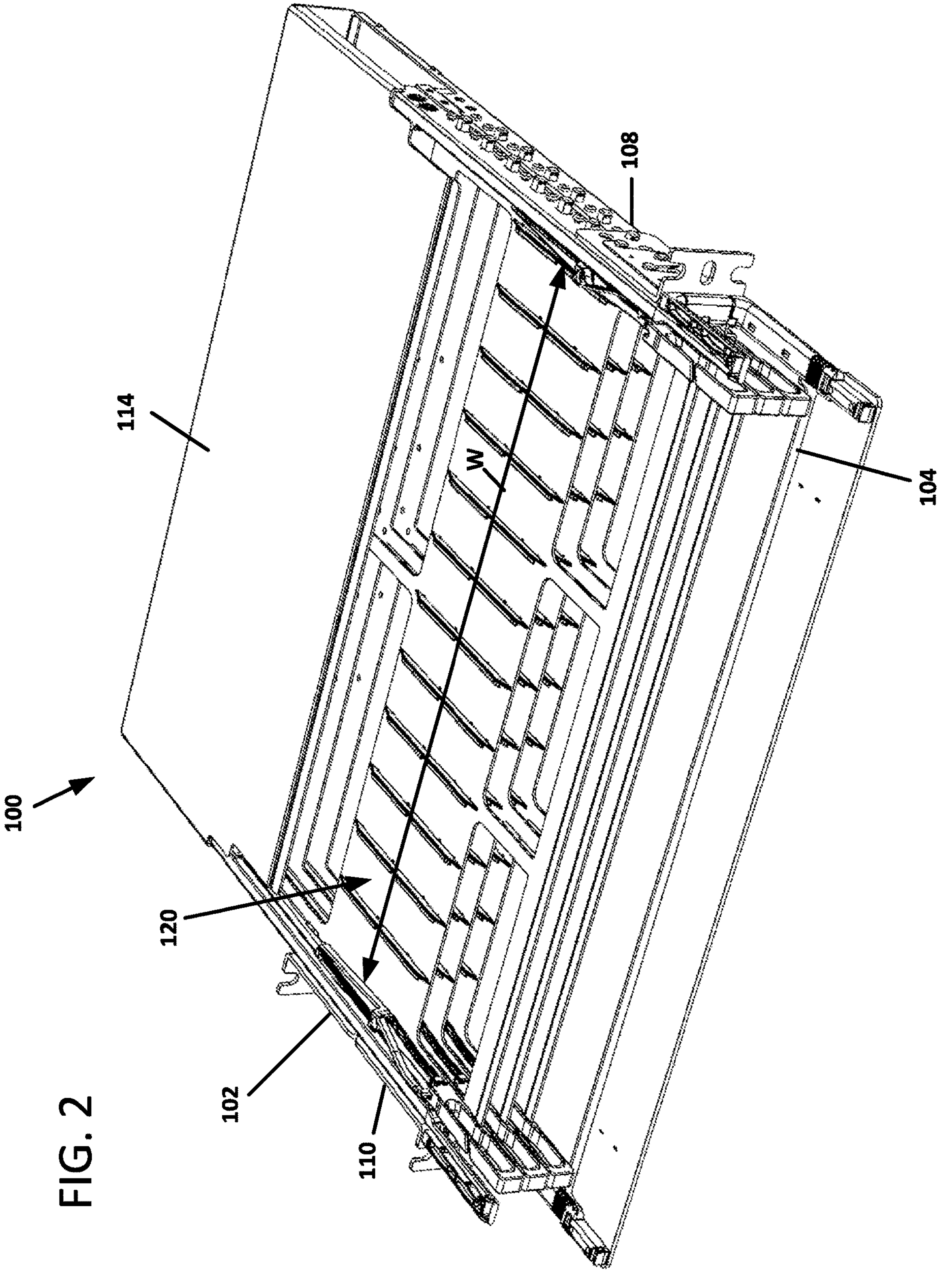
FIG. 2 shows the communications panel of FIG. 1 with atop of the chassis removed for ease in viewing the tray arrangements disposed within the interior of the chassis in retracted positions.

Referring to FIG. 2, each tray arrangement 120 spans a width W along the lateral axis LA of the chassis 102. In certain implementations, multiple tray arrangements 120 are received in a common chassis 102. For example, the tray arrangements 120 can be disposed one-above-the-other within an interior of the chassis 102. Each tray arrangement 120 includes a tray 121 configured to support one or more cassettes carrying optical equipment such as splices, splitters, and/or ports (e.g., optical ports, electrical ports, hybrid ports, etc.) configured to receive plug connectors. Examples cassettes and example interfaces between such cassettes and the tray are provided in co-pending U.S. Provisional Application No. 63/150,828, filed Feb. 18, 2021, and titled "Communications Panel System" and co-pending U.S. provisional application No. 63/214,106, filed Jun. 23, 2021, titled "Communications Panel System." the disclosures of which are hereby incorporated herein by reference in their entirety.

Figure 3:
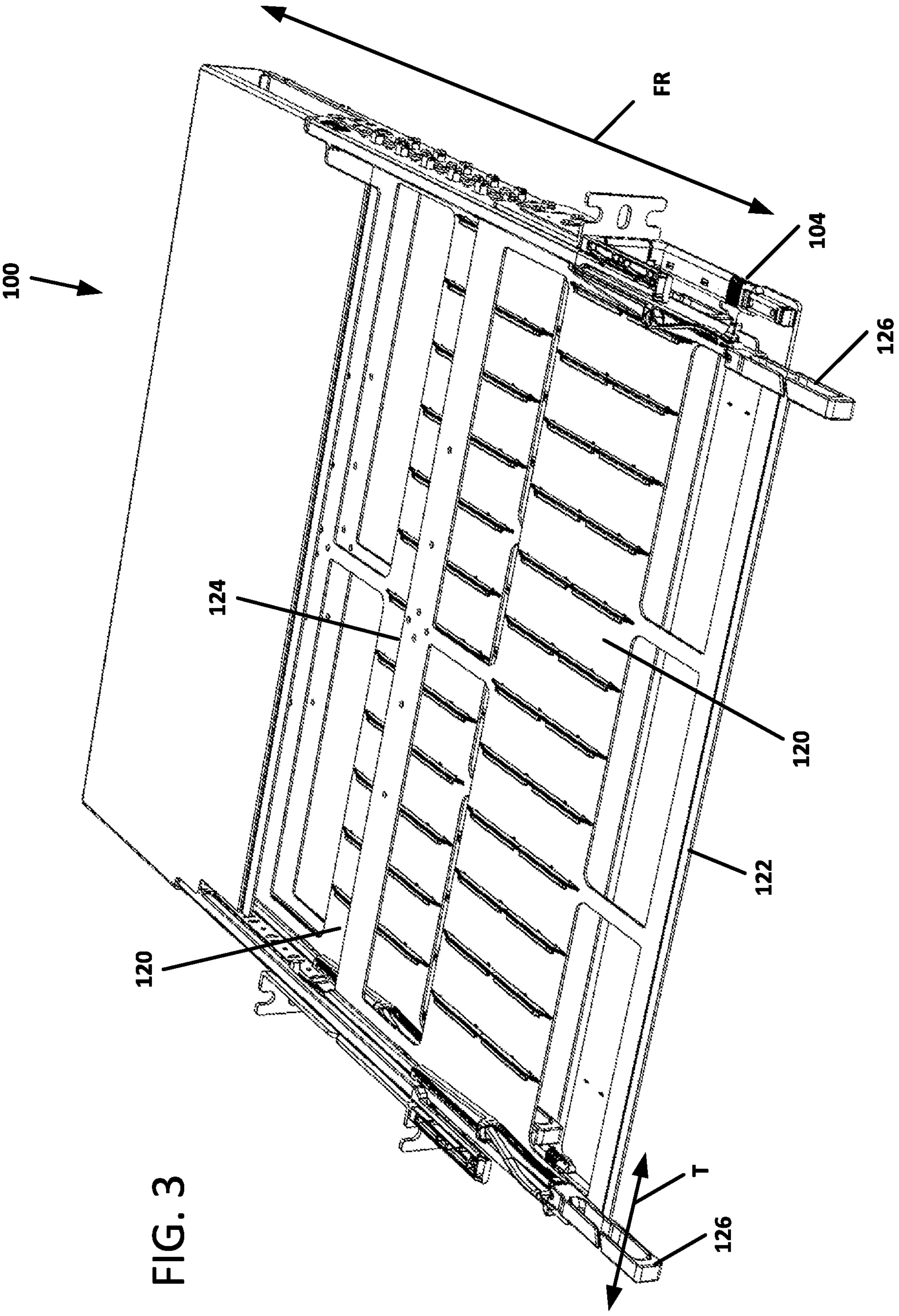
FIG. 3 shows one of the tray arrangements of FIG. 2 disposed in an extended position.

In some implementations, the tray arrangements 120 are stationary within the chassis 102. In other implementations, the tray arrangements 120 are slidable along the forward-rearward axis FR of the chassis 102 between two or more positions. For example, the tray arrangements 120 may be slidable between a retracted position (e.g., see FIG. 2) and an extended position (e.g., see FIG. 3). When disposed in the retracted position, the tray arrangement 120 is fully disposed within the chassis 102 (e.g., a front 122 of the tray arrangement 120 is disposed no further forward than the front 104 of the chassis 102 and a rear 124 of the tray arrangement 120 is disposed no further rearward than the rear 106 of the chassis 102). When disposed in the extended position, a portion of the tray arrangement 120 (e.g., the front 122) is disposed external of the chassis 102 (e.g., forward of the front 104 of the chassis 102).

In certain implementations, the tray arrangement 120 includes one or more cable guides 126 extending forwardly of the front 122 of the tray arrangement 120. Each cable guide 126 defines a through-passage T along which one or more cables can be guided. In certain examples, the through-passage T extends parallel with the lateral axis LA of the tray arrangement 120. In certain implementations, the tray arrangement 120 can be transitioned between the retracted position and the extended position by using one or more of the cable guides 126 as a handle to pull or push the tray 120 relative to the chassis 102.

Figure 4:
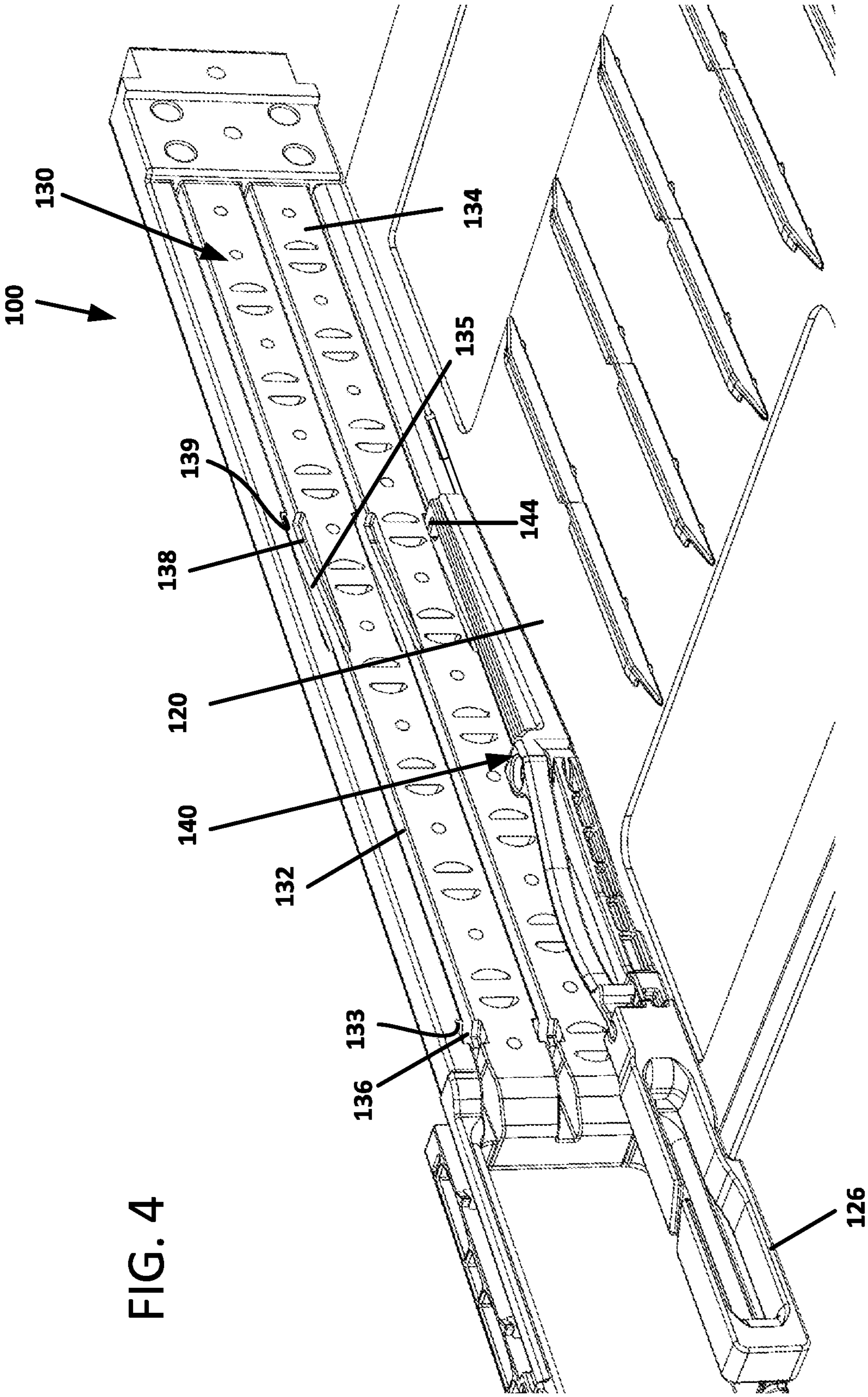
FIG. 4 shows part of the interior of the chassis of FIG. 2 with two of the tray arrangements removed for case in viewing one of the sidewalls of the chassis.
Figure 5:
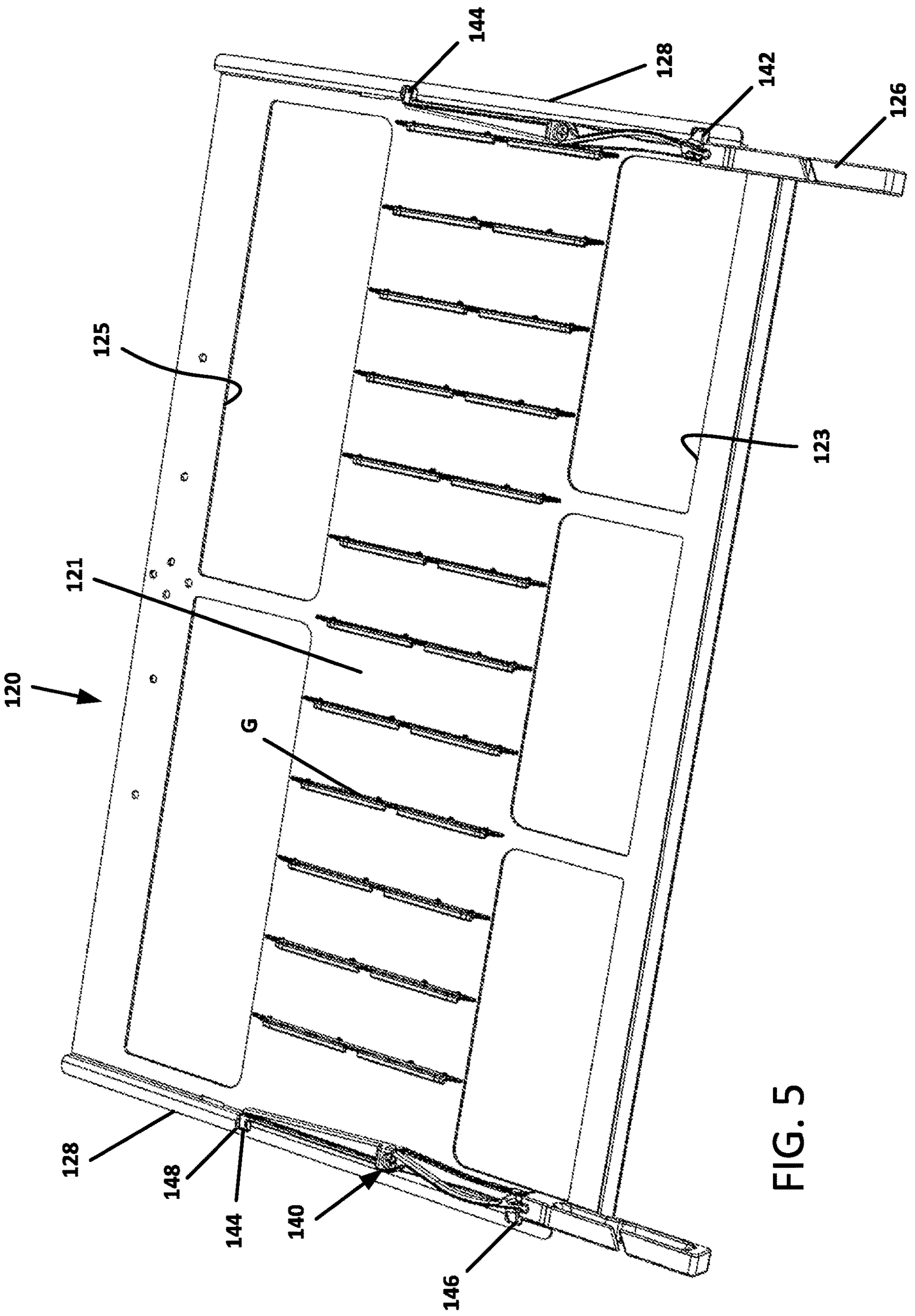
FIG. 5 is a perspective view of an example tray arrangement having a first type of latching arrangement disposed at opposite sides of the tray arrangement.
Figure 6:
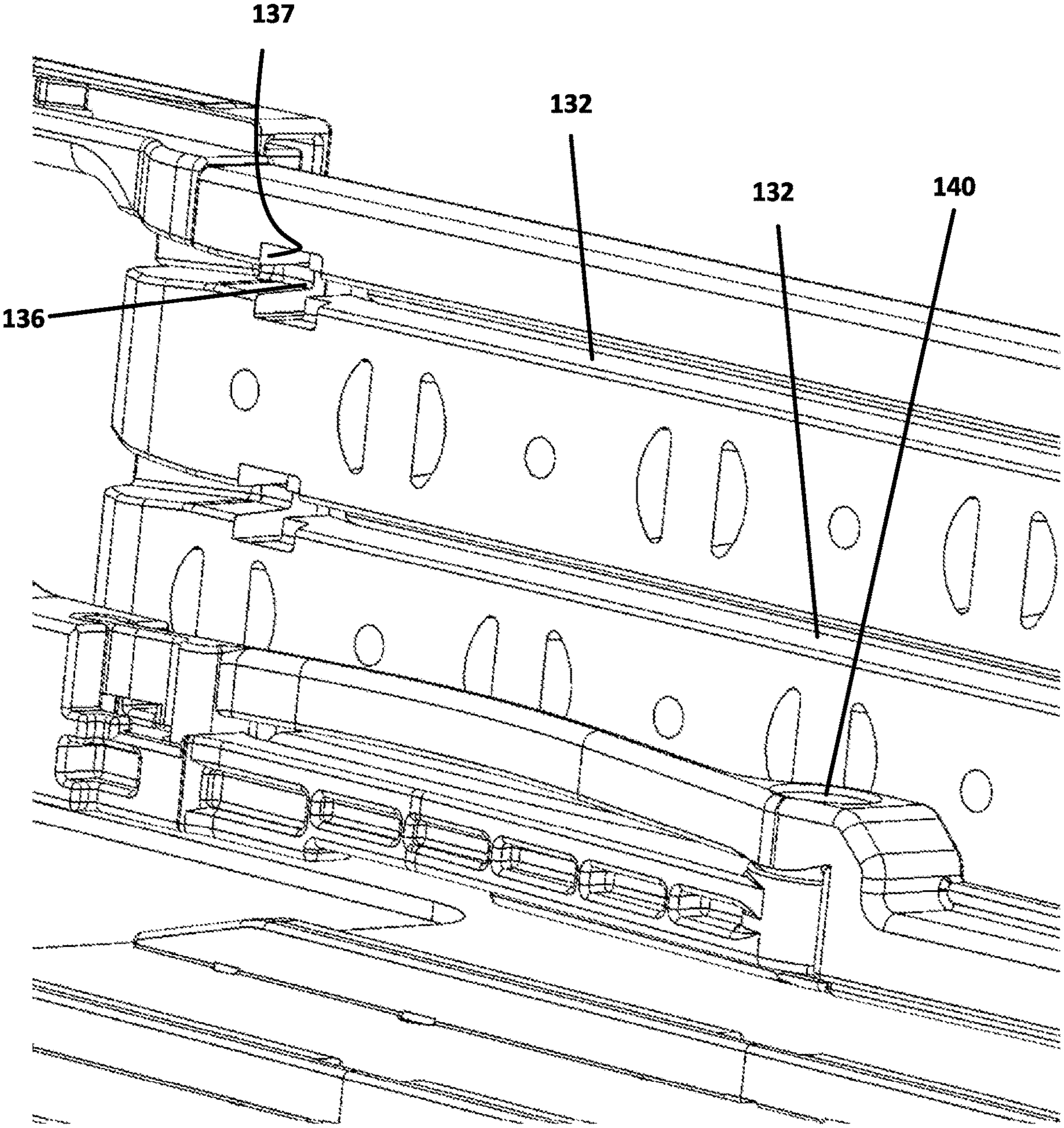
FIG. 6 is a perspective view of a portion of the sidewall of FIG. 4.
Figure 7:
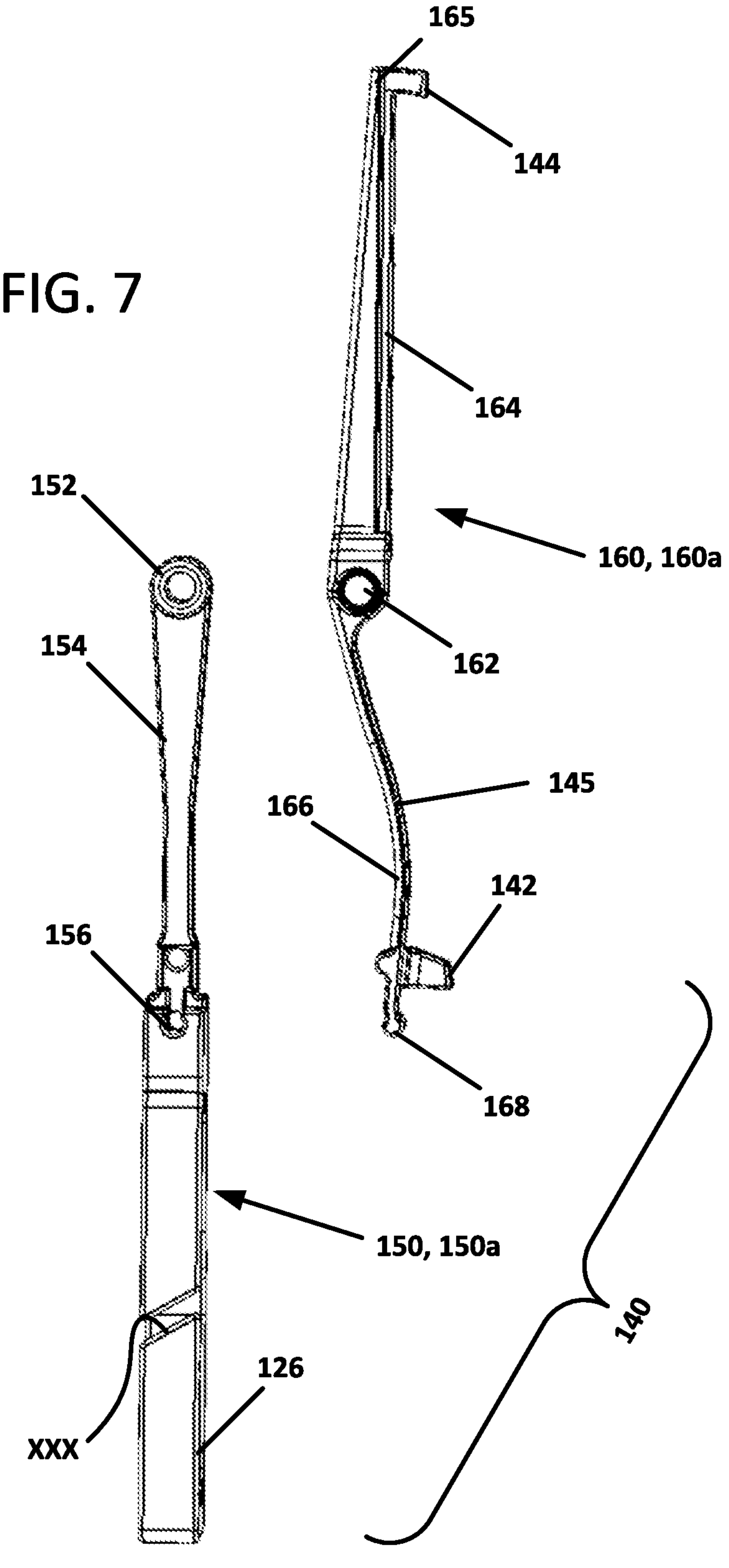
FIG. 7 is an exploded view of the first type of latching arrangement of FIG. 5 including first and second deflection members.

FIG. 4 illustrates an interior 130 of the chassis 102. The chassis 102 includes guides 132 disposed at interior sidewalls 134 at the sides 108, 110 of the chassis 102. The guides 132 extend along the forward-rearward axis FR of the chassis 102. As shown in FIG. 5, the tray arrangement 120 includes rails 128 disposed at opposite first and second sides of the tray 120. The rails 128 extend laterally outwardly from the tray arrangement 120 in opposite directions. Each of the rails 128 is sized to fit within one of the guides 132 of the chassis 102.

In certain implementations, the chassis 102 may include a plurality of pairs of opposing guides 132. Each of the pairs of opposing guides 132 is configured to receive the rails 128 of a respective tray arrangement 120 to enable the tray arrangement 120 to glide along the guides 132 between the retracted and extended positions. In certain implementations, the tray arrangement 120 can be inserted into and/or removed from the chassis 102 by sliding the tray arrangement along the guides 132.

In certain implementations, the tray arrangement 120 is releasably lockable relative to the chassis 102 to retain the tray arrangement 120 in at least one position. In certain examples, the tray arrangement 120 is releasably lockable relative to the chassis 102 in multiple positions (e.g., the retracted position and the extended position). In certain implementations, the tray arrangement 120 carries a latching arrangement 140 including a stop member 142, 144 configured to releasably engage a catch surface 137, 139 of the chassis 102. In certain implementations, the latching arrangement 140 is configured to be actuated by movement of the cable guide 126 relative to the chassis 102.

In certain implementations, the chassis 102 defines a catch surface corresponding to each lockable position of the tray arrangement 120. In certain examples, the chassis 102 defines a front catch surface 137 and a rear catch surface 139. In certain examples, the front catch surface 137 faces rearward and the rear catch surface 139 faces forward. In certain implementations, each catch surface 137, 139 is offset from a respective guide 132 along the height H of the chassis 102. In certain examples, each catch surface 137, 139 is continuous with the guide 132. In the example shown, each catch surface 137, 139 extends upwardly and downwardly from the respective guide 132 to form a respective pocket 136, 138 along the guide 132.

In certain implementations, the latching arrangement 140 includes a first stop member 142 and a second stop member 144. Each stop member 142, 144 is moveable between a latch position and a release position. In certain examples, each stop member 142, 144 is biased to the latch position. In certain implementations, the first and second stop members 142, 144 align with corresponding apertures 146, 148 defined through the tray of the tray arrangement 120. The stop members 142, 144 extend through the corresponding apertures 146, 148 when biased to the latch positions (e.g., see FIG. 5). Accordingly, each stop member 142, 144 automatically engages the front catch surface 137 through the respective aperture 146, 148 when aligned with the pocket 136.

In certain implementations, the latching arrangement 140 includes a first deflection member 150 and a second deflection member 160. Both the first deflection member 150 and the second deflection member 160 are carried by the respective tray arrangement 120 relative to the chassis 102. The first deflection member 150 defines the cable guide 126. The second deflection member 160 defines a stop member (e.g., the second stop member 144). In some implementations, the second deflection member 160 also defines the first stop member 142. In other implementations, the first deflection member 150 defines the first stop member 142.

The first deflection member 150 is configured to be manually moved by a user against a biasing force to move the first stop member 142 from the latch position to the release position. The second deflection member 160 is configured to be manually moved by a user against a biasing force to move the second stop member 144 from the latch position to the release position. In certain examples, a common biasing member 145 provides the biasing force to both the first deflection member 150 and the second deflection member 160. In certain examples, the biasing member 145 includes a leaf spring. In some examples, the first deflection member 150 defines the biasing member 145. In other examples, the second deflection member 160 defines the biasing member 145.

In use, the first stop member 142 of the latching arrangement 140 inhibits forward movement of the tray arrangement 120 relative to the chassis 102 when the tray arrangement 120 is disposed in the retracted position within the chassis 102. In particular, the first stop member 142 engages a respective rearward-facing first catch surface 137 defined at the first pocket 136. In certain examples, the first stop member 142 also may engage a forward-facing third catch surface 133 disposed in the same pocket 136 as the first catch-surface 137. Engagement between the first stop member 142 and the third catch surface 133 inhibits rearward movement of the tray arrangement 120 relative to the chassis 102. In certain examples, the second stop member 144 engages a respective forward-facing second catch surface 139 at the second pocket 138 when the tray arrangement 120 is disposed in the retracted position to inhibit rearward movement of the tray arrangement 120 relative to the chassis 102.

To move the tray arrangement 120 to the extended position, the first deflection member 150 of the latching arrangement 140 is actuated to move the first stop member 142 to the release position so that the first stop member 142 no longer engages the first catch surface 137. Accordingly, the tray arrangement 120 can be moved forwardly relative to the chassis 102. In certain implementations, the sidewalls 134 of the chassis 102 define ramps 135 along which the second stop member 144 cams to move the second stop member 144 to the release position as the tray arrangement 120 is moved forwardly towards the extended position. When the tray arrangement 120 is disposed in the extended position, the second stop member 144 aligns with the pocket 136 and snaps into engagement with the first catch surface 137 to inhibit further forward movement. The second stop member 144 also may engage the third catch surface 133 to inhibit rearward movement of the tray arrangement 120 back to the retracted position. In certain examples, the front stop member 142 does not engage the chassis 102 when the tray arrangement 120 is disposed in the extended position.

To move the tray arrangement 120 from the extended position to the retracted position (or to remove the tray arrangement 120 from the chassis 102 through the front of the chassis 102), the second deflection member 160 of the latching arrangement 140 is actuated to move the second stop member 144 to the release position so that the second stop member 144 no longer engages the first and third catch surfaces 137, 133. With the second stop member 144 released, the tray 120 is freely slidable along the guides 132 either rearwardly back to the retracted position or forwardly out of the chassis 102.

In some implementations, a latching arrangement 140 is only disposed at one side of the tray arrangement 120 (i.e., near only one of the rails 128). In other implementations, each tray arrangement 120 carries a first latching arrangement 140 at the first side of the tray arrangement 120 and a second latching arrangement at the second side of the tray arrangement 120 (e.g., see FIG. 5). In some examples, the second latching arrangement is identical to the first latching arrangement. In such examples, the actuation of the first and second stop members 142, 144 discussed above is performed on both latching arrangements simultaneously to move the tray arrangement 120. In other examples, the second latching arrangement includes the second stop member 144, but not the first stop member 142. In such examples, only the first latching arrangement 140 is actuated to move the tray arrangement 120 from the retracted position to the extended position, but both latching arrangements are actuated to move the tray arrangement 120 from the extended position.

Figure 8:
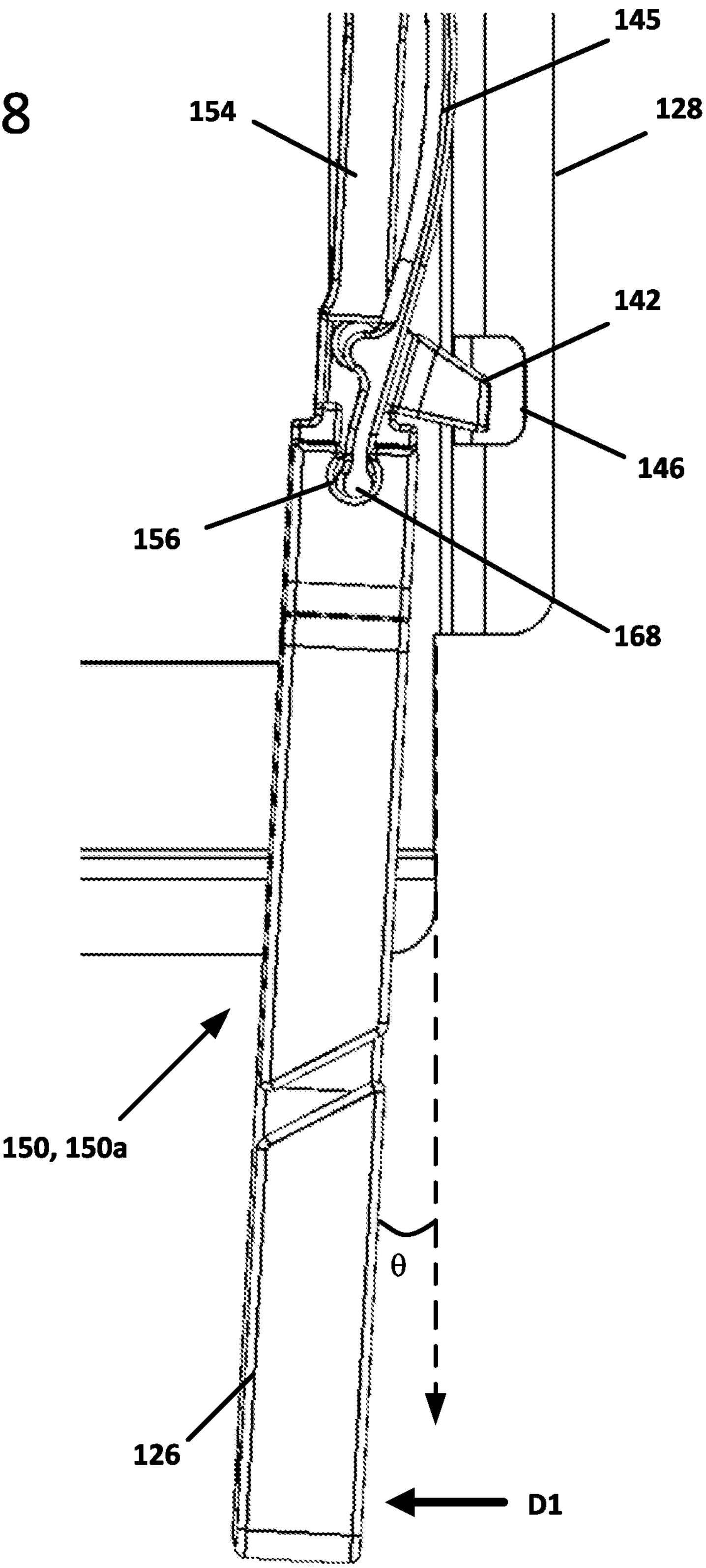
FIG. 8 shows the first type of latching arrangement of FIG. 7 assembled and with the first deflection member moved to an actuated position relative to the tray arrangement.
Figure 10:
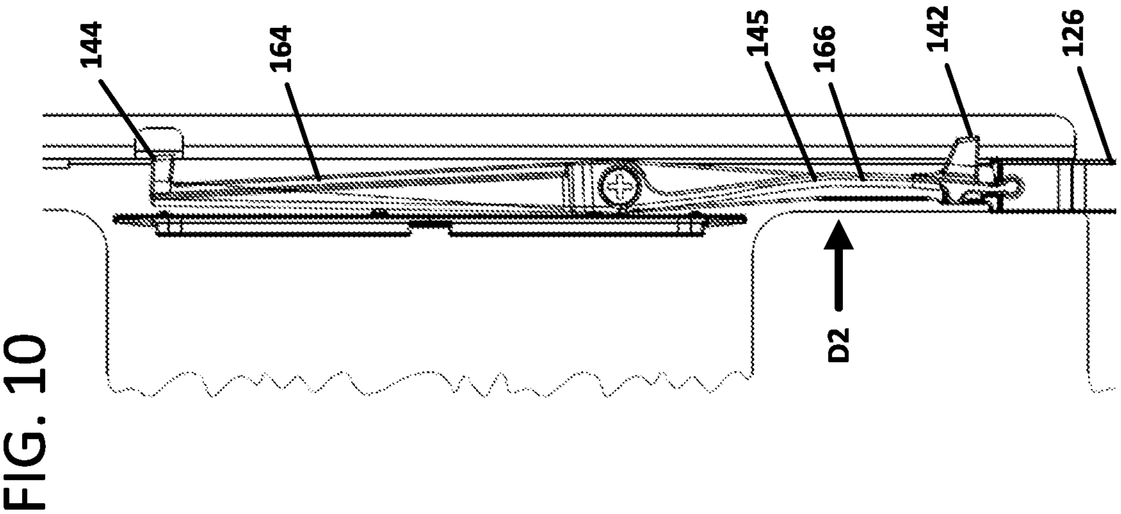
FIG. 10 illustrates the first type of latching arrangement of FIG. 7 with the first deflection member disposed in the neutral position and the second deflection member disposed in the actuated position.
Figure 9:
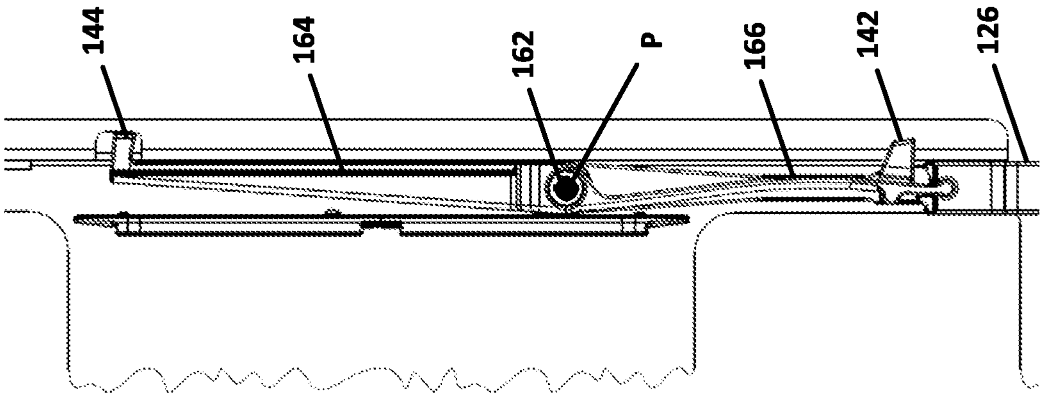
FIG. 9 illustrates the first type of latching arrangement of FIG. 7 with both deflection members disposed in neutral positions.
Figure 11:
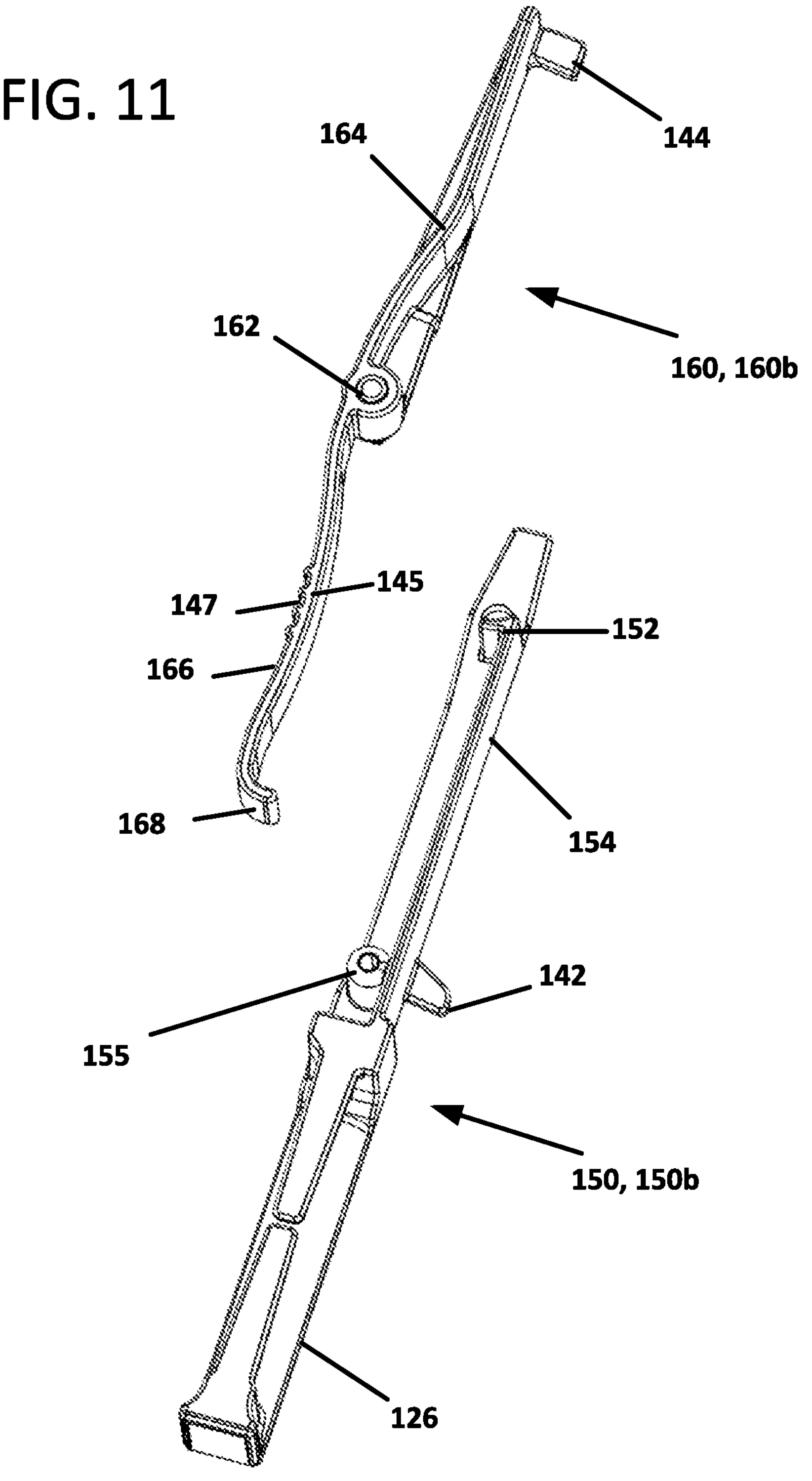
FIG. 11 is a top perspective view of a second type of latching arrangement including first and second deflection members exploded from each other, the second type of latching arrangement being suitable for mounting to one or both sides of a tray arrangement.
Figure 12:
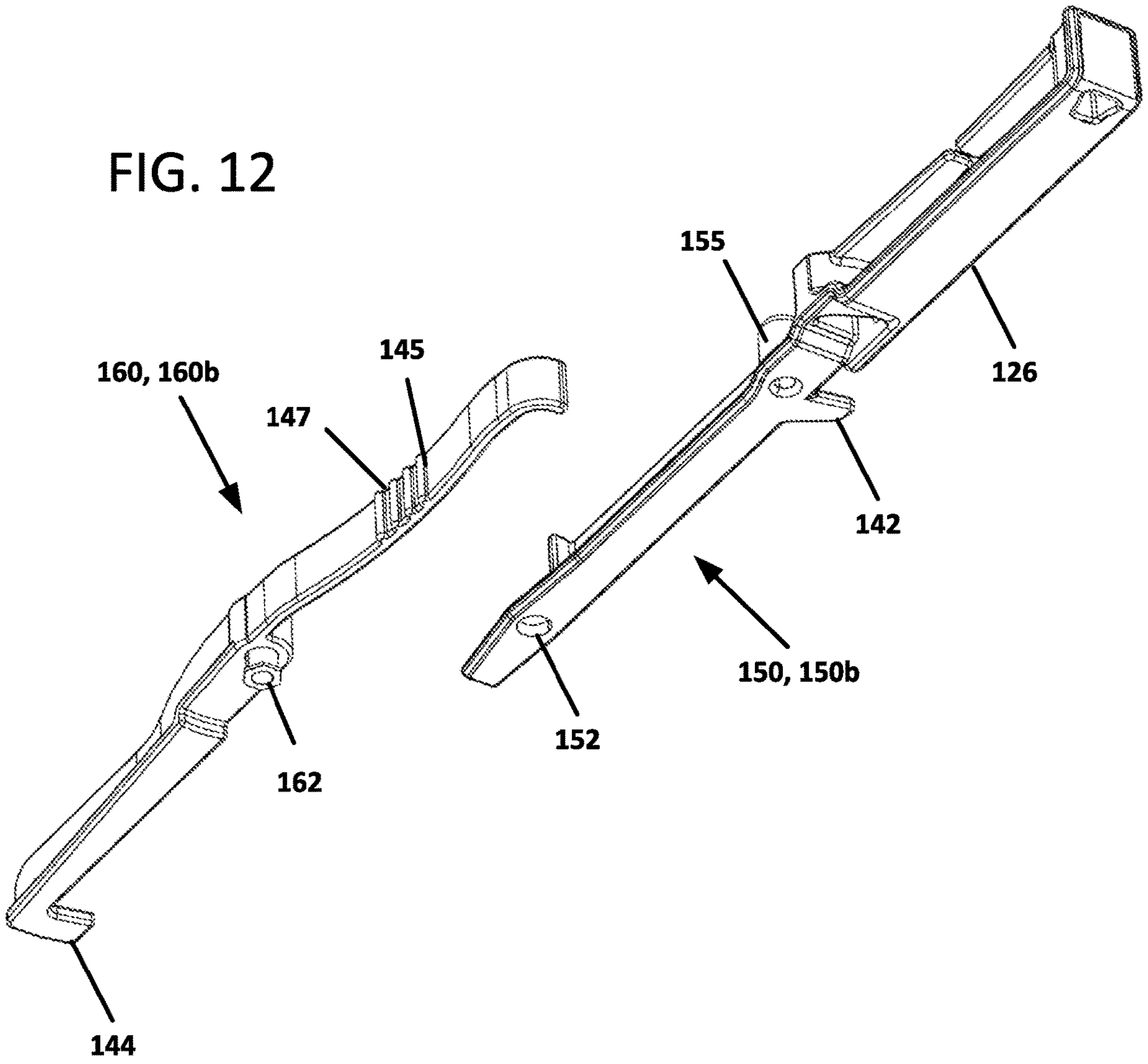
FIG. 12 is a bottom perspective view of the second type of latching arrangement of FIG. 11.
Figure 13:
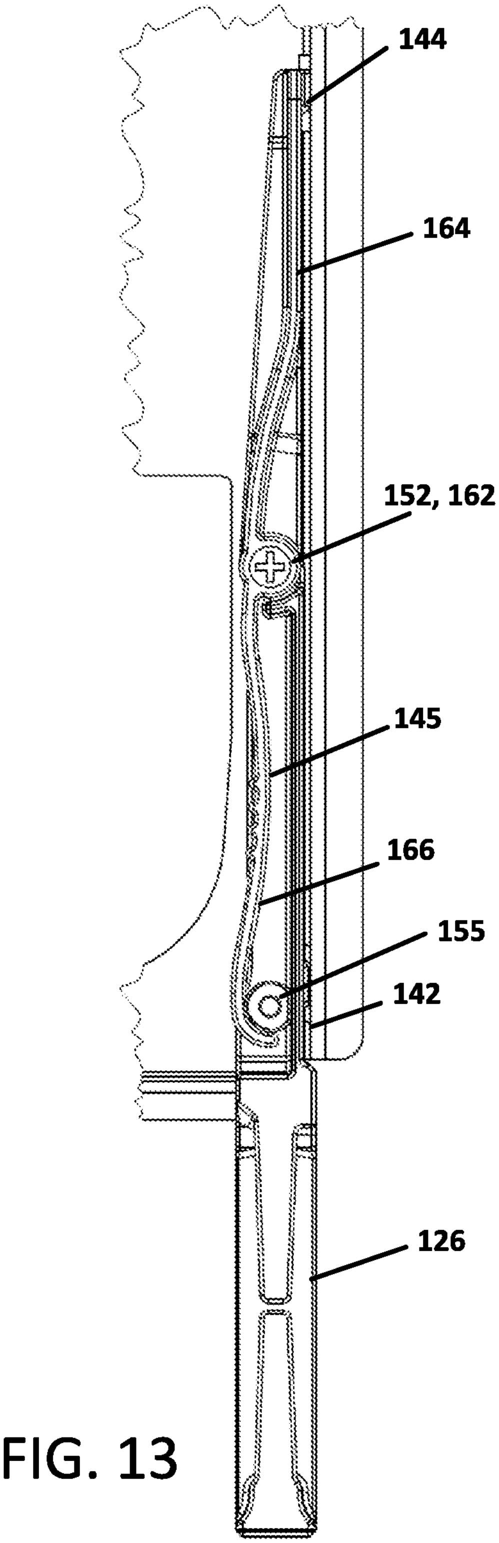
FIG. 13 is a top plan view of the second type of latching arrangement of FIG. 11 with both the first and second deflection members disposed in neutral positions.

Referring to FIGS. 7-10, the first deflection member 150 includes a base 152 at which the first deflection member 150 is pivotally mounted to the tray 121 of the tray arrangement 120 about a pivot axis P (e.g., see FIG. 9). In certain implementations, the base 152 is disposed at an opposite end of the first deflection member 150 from the cable guide 126. For example, a beam 154 may extend between the base 152 and the cable guide 126. In certain examples, the beam 154 is rigid so that the cable guide 126 is movable about the pivot axis P between a neutral position (e.g., see FIG. 5) and an actuated position (e.g., see FIG. 8). The cable guide 126 moves along an angle θ in a deflection direction D1 between the neutral and actuated positions to actuate the first deflection member 150. In certain examples, the cable guide 126 moves inwardly along the deflection direction D1 towards the opposite side of the tray 121 when moved from the neutral position to the actuated position (e.g., see FIG. 8).

The second deflection member 160 includes a base 162 at which the second deflection member 160 is pivotally mounted to the tray 121 of the tray arrangement 120 about the pivot axis P. The base 162 of the second deflection member 160 aligns with the base 152 of the first deflection member 150 along the pivot axis P. The second deflection member 160 includes a beam 164 extending outwardly from the base 162 to a free end 165 carrying the second stop member 144. In certain examples, the beam 164 is rigid so that the second stop member 144 is carried between the latch position (e.g., see FIG. 9) and the release position (e.g., see FIG. 10) when the second deflection member 160 pivots about the pivot axis P. The second deflection member 160 also includes an actuation leg 166 extending outwardly from the base 162 to an end 168 opposite the free end 165. The second deflection member 160 is configured to pivot about the pivot axis P when the actuation leg 166 is manipulated by a user.

In some examples, the second deflection member 160 defines the first stop member 142 and the biasing member 145 (e.g., see FIGS. 7-10). In other examples, the first deflection member 150 defines the first stop member 142 and the second deflection member 160 defines the biasing member 145 (e.g., see FIGS. 11-14). In other examples, the first deflection member 150 defines the first stop member 142 and the biasing member 145 (e.g., see FIGS. 17-21). Four example implementations of the first deflection member **150*a*, 150*b*, 150*c*, 150*d* and the second deflection member 160*a*, 160*b*, 160*c*, 160*d* are shown herein in FIGS. 7-21**.

Referring to FIGS. 7-10, a first implementation **160*a* of the second deflection member 160 defines the first stop member 142 towards the end 168 of the actuation leg 166. The actuation leg 166 is configured so that the first stop member 142 does not pivot with the second stop member 144. Rather, the actuation leg 166 is configured to that the first stop member 142 is entrained by the first deflection member 150*a*. For example, the end 168 of the actuation leg 166 may fit into a notch 156 defined in a first implementation 150*a* of the first deflection member 150. In the example shown, the notch 156 is defined at one end of the cable guide 126 so that the first end 168 of the actuation leg 166 moves in unison with the cable guide 126 as the cable guide 126 is pivoted between the neutral and actuated positions. Accordingly, actuating the first deflection member 150*a* moves the first stop member 142** to the release position.

In certain implementations, the actuation leg 166 defines the biasing member 145. Accordingly, the actuation leg 166 biases the first stop member 142 to the latch position. Because the actuation leg 166 is entrained with the cable guide 126, the actuation leg 166 also biases the cable guide 126 to the neutral position. Accordingly, when the cable guide 126 is released by the user, the actuation leg 166 biases the first stop member 142 back to the latch position. In the example shown, the biasing member 145 also biases the second stop member 144 to the latch position (e.g., see FIG. 9).

The second stop member 144 does not move when the cable guide 126 of the first deflection member **150*a* is actuated. Rather, the second stop member 144 moves when the actuation leg 166 of the second deflection member 160*a* is actuated. For example, deforming or deflecting the actuation leg 166 in a second deflection direction D2 moves the second stop member 144 from the latch position to the release position. In the example shown in FIG. 10, the second deflection direction D2 extends opposite the first deflection direction D1 (FIG. 8). Accordingly, a user presses the actuation leg 166 outwardly towards the closest rail 128 of the tray arrangement 120 to actuate the second deflection member 160*a*, thereby moving the second stop member 144 to the release position. Because the actuation leg 166 defines the biasing member 145, releasing the actuation leg 166 causes the second stop member 144** to transition back to the latch position.

Referring to FIGS. 11-14, a second implementation **150*b* of the first deflection member 150 carries the first stop member 142. In certain implementations, the first stop member 142 moves in unison with the first deflection member 150*a* as the first deflection member 150*a* pivots between the neutral and actuated positions. In certain examples, the first stop member 144 is disposed along the beam 154 between the cable guide 126 and the base 152. In the example shown, the first stop member 144 is disposed closer to the cable guide 126 than to the base 152**.

The actuation leg 166 of a second implementation **160*b* of the second deflection member 160 defines the biasing member 145. However, the end 168 of the actuation leg 166 is not entrained with the first deflection member 150*b*. Rather, the end 168 of the actuation leg 166 abuts the beam 154 of the first deflection member 150*b* to bias the first deflection member 150*b* to the neutral position. In certain examples, the first deflection member 150*b* includes a tensioner 155 about which the end 168 of the actuation leg 166 curls. The tensioner 155 pre-tensions the biasing member 145**.

The first deflection member **150*b* is actuated as discussed above by deflecting the cable guide 126. The second deflection member 160*b* is actuated as discussed above by pressing the actuation leg 166 in the second deflection direction D2 towards the closest rail 128 of the tray arrangement 120 (e.g., compare FIGS. 13 and 14). In certain examples, the actuation leg 166 defines an indicator 147 (e.g., textured surface such as bumps or ridges, textual indicia, printed symbol, color-coded region, etc.) that identifies a region of the actuation leg 166 to press to actuate the second deflection member 160*b*. In the example shown, the actuation leg 166 defines a leaf spring biasing member 145 having a concave curvature so that an intermediate portion of the actuation leg 166 curves towards the closest rail 128**.

Figure 16:
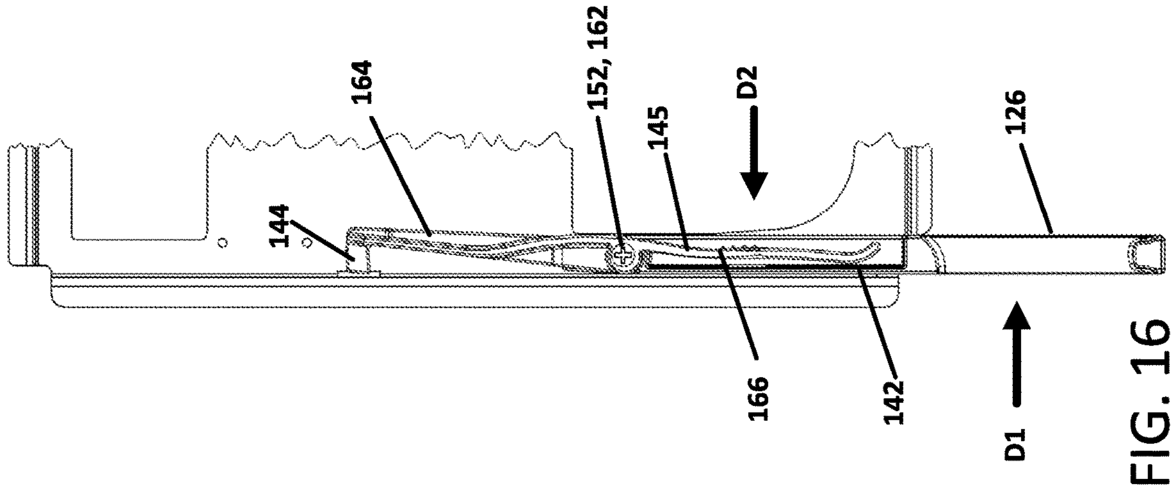
FIG. 16 is a top plan view of the third type of latching arrangement of FIG. 15 with the first deflection member disposed in the neutral position and the second deflection member disposed in the actuated position.
Figure 15:
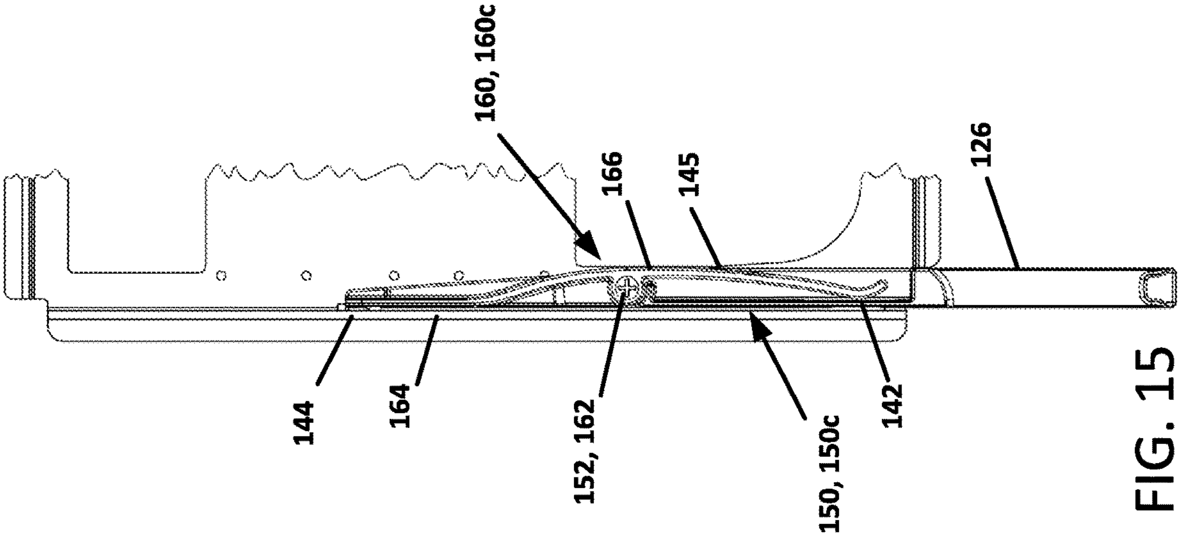
FIG. 15 is a top plan view of a third type of latching arrangement suitable for mounting to one or both sides of the tray arrangement, the third type of latching arrangement including first and second deflection members shown in the neutral position.
Figure 17:
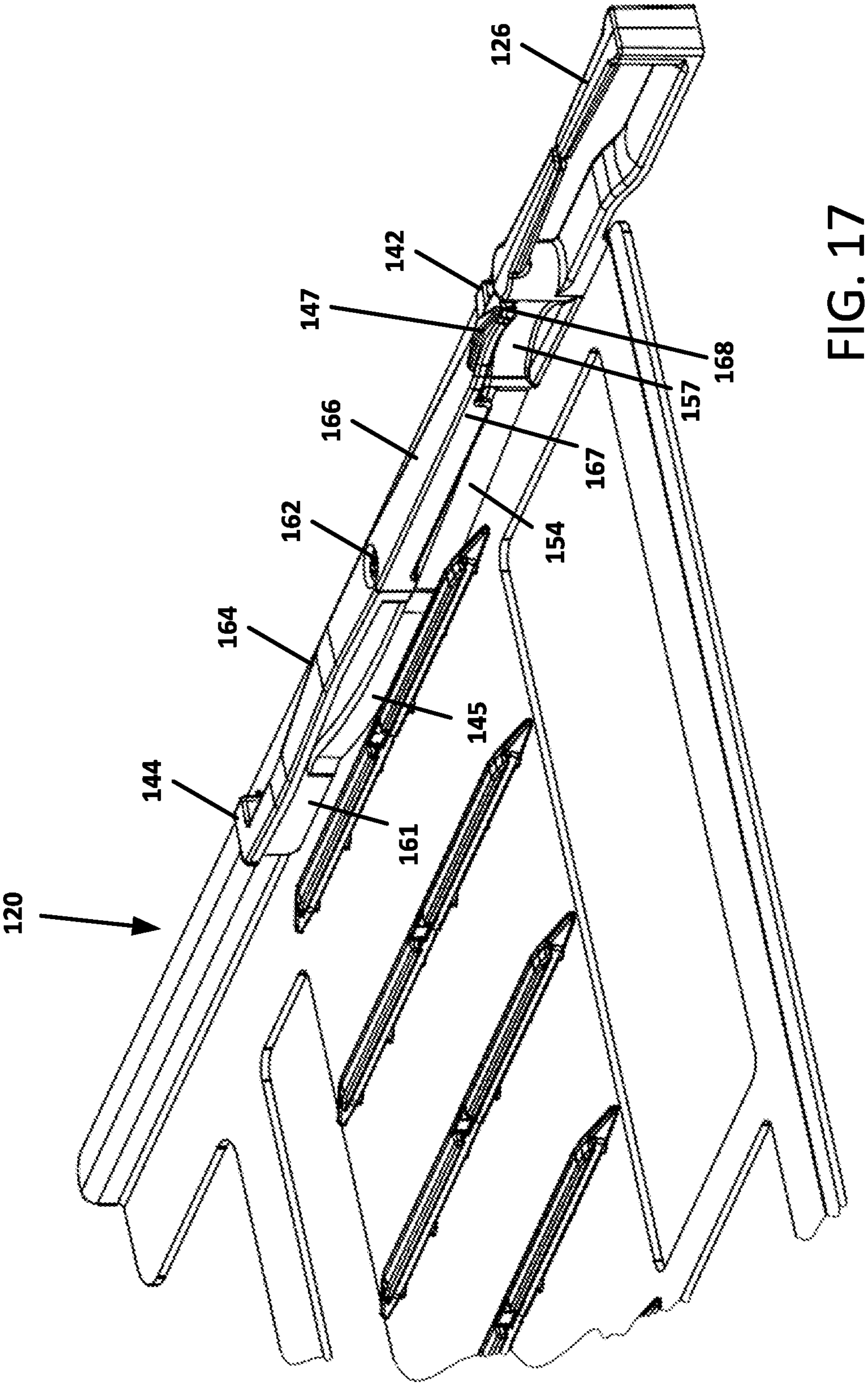
FIG. 17 is a perspective view of a fourth type of latching arrangement suitable for mounting to one or both sides of the tray arrangement, the fourth type of latching arrangement including first and second deflection members shown in the neutral position.
Figure 18:
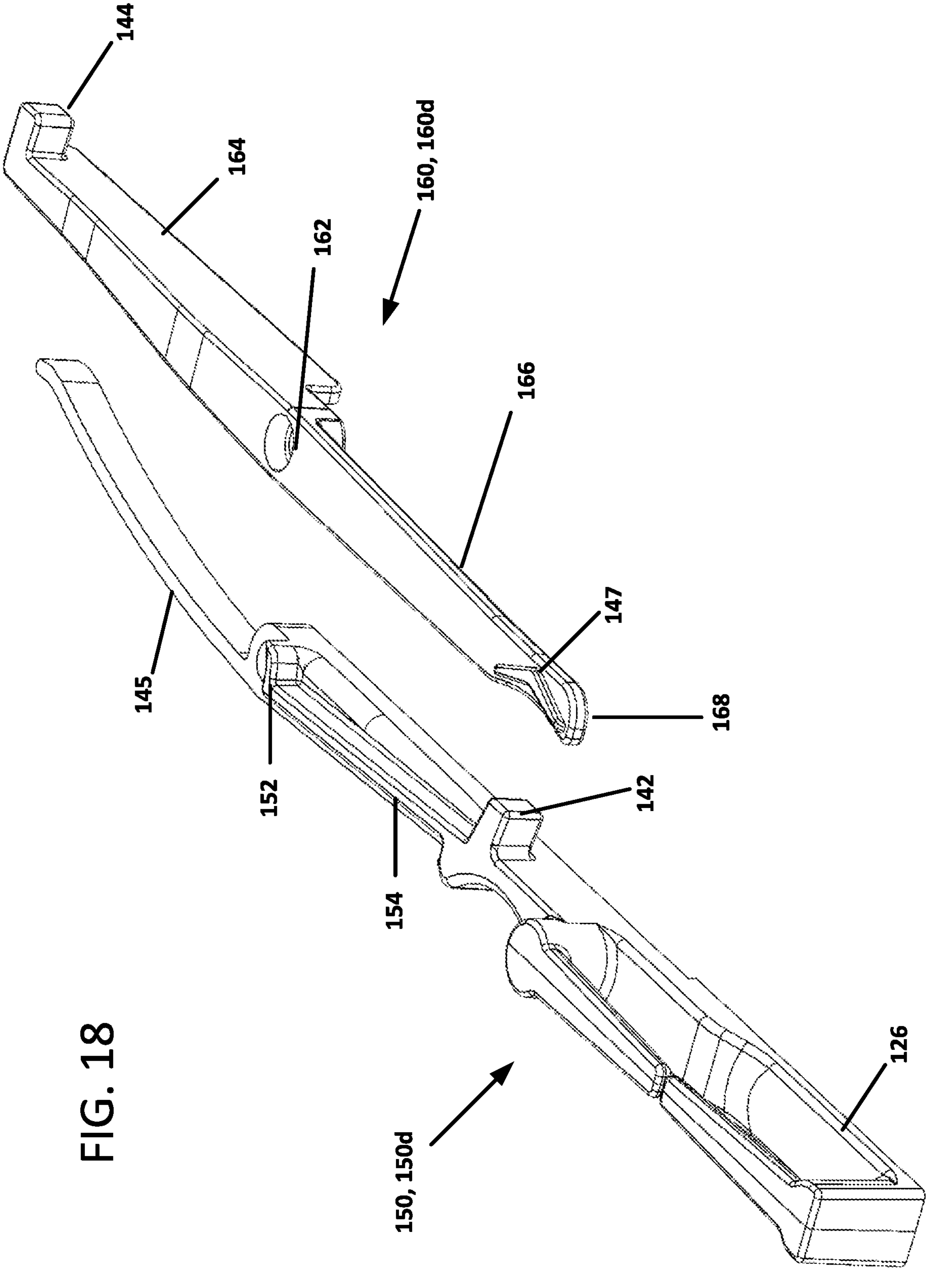
FIG. 18 is a first perspective view of the fourth type of latching arrangement of FIG. 17 with the first and second deflection members shown exploded from each other.
Figure 19:
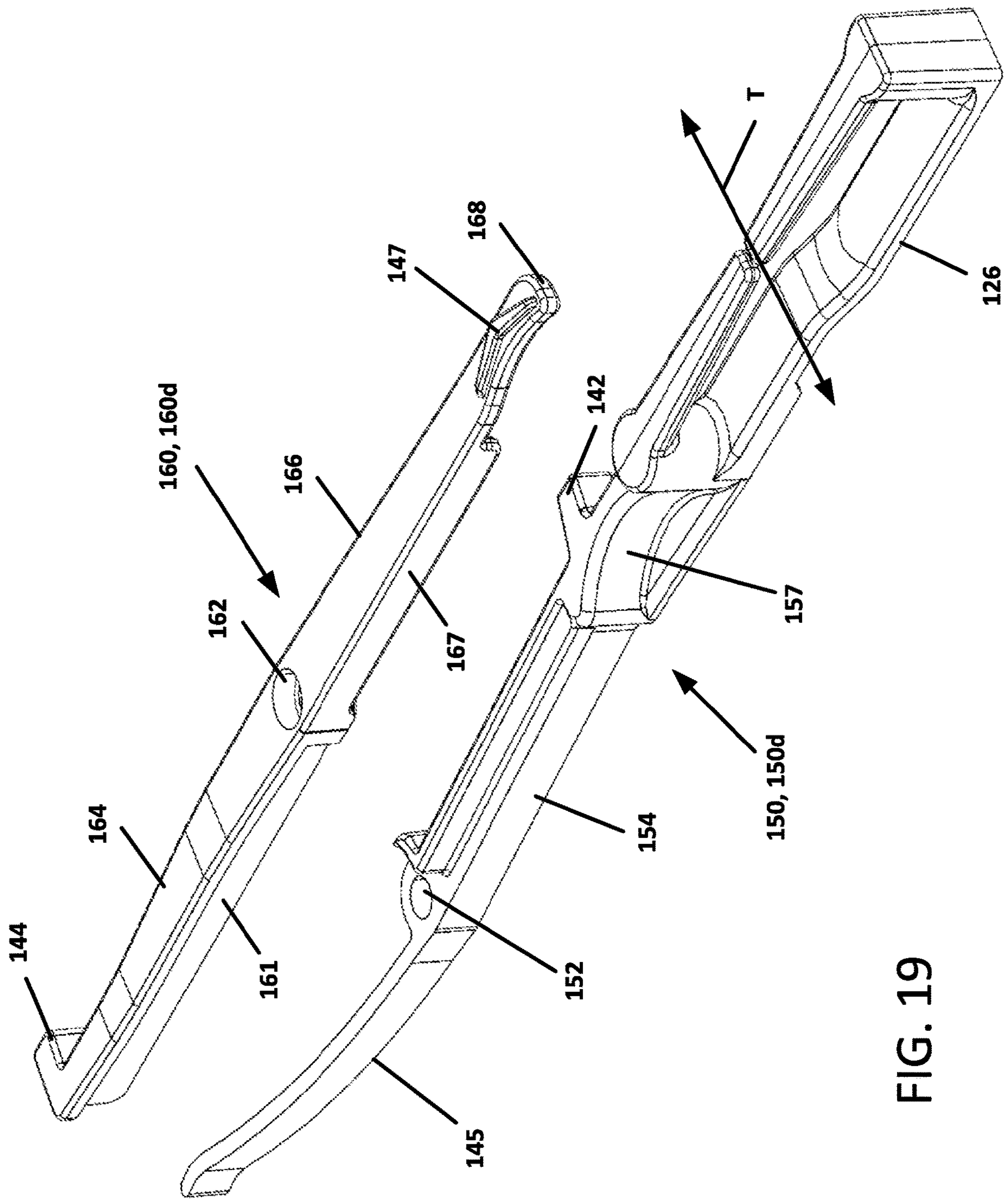
FIG. 19 is a second perspective view of the fourth type of latching arrangement of FIG. 17 with the first and second deflection members shown exploded from each other.
Figure 21:
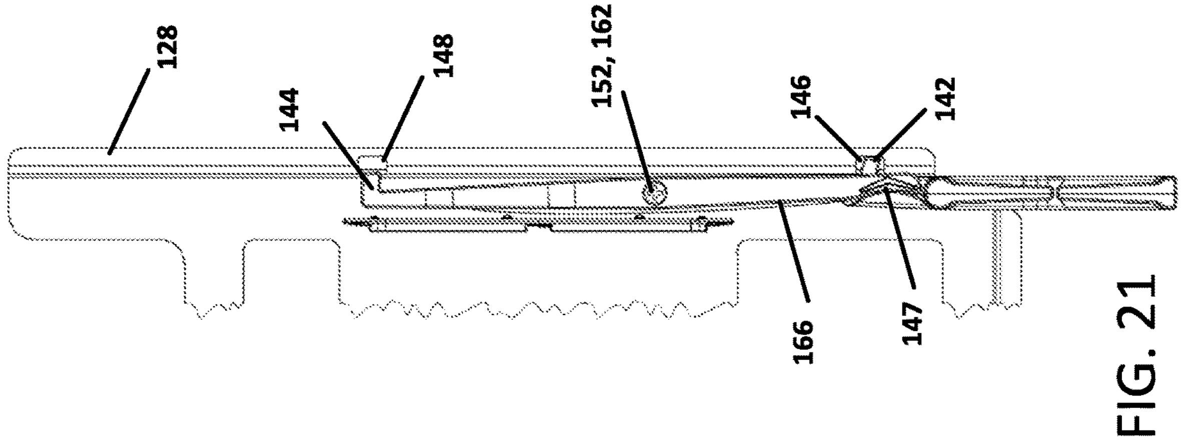
FIG. 21 is a top plan view of the fourth type of latching arrangement with the first deflection member shown in the neutral position and the second deflection member shown in the actuated position.
Figure 20:
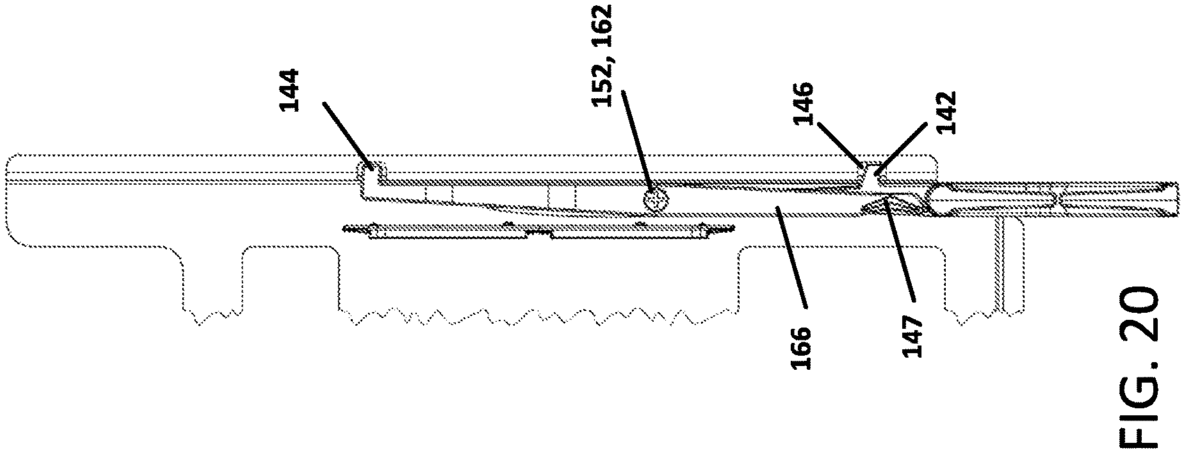
FIG. 20 is a top plan view of the fourth type of latching arrangement of FIG. 17 with both deflection members shown in the neutral position.
Figure 22:
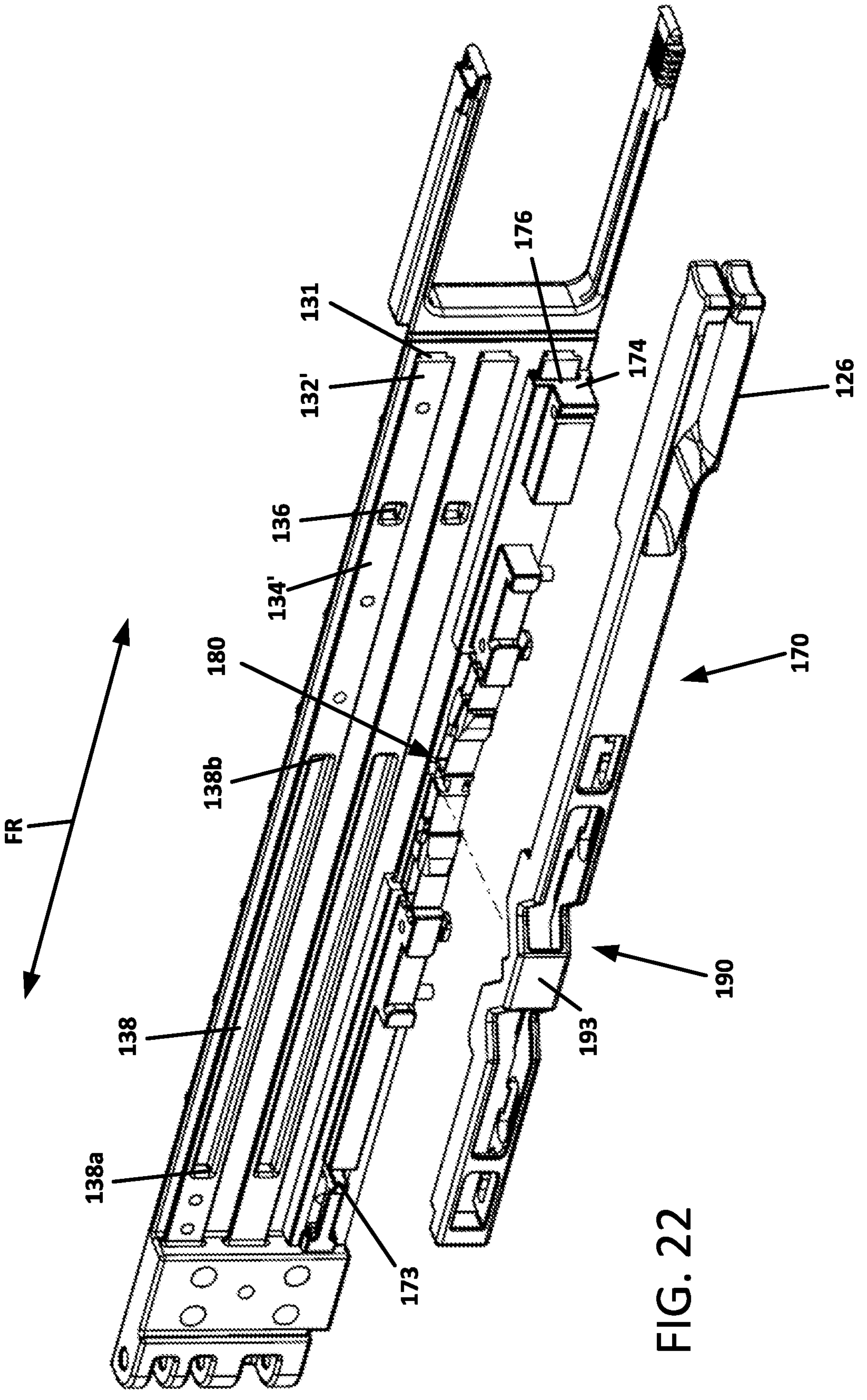
FIG. 22 is a perspective view of a fifth type of latching arrangement suitable for mounting to one or both sides of the tray arrangement, the fifth type of latching arrangement including a deflection arrangement and an actuation member.
Figure 23:
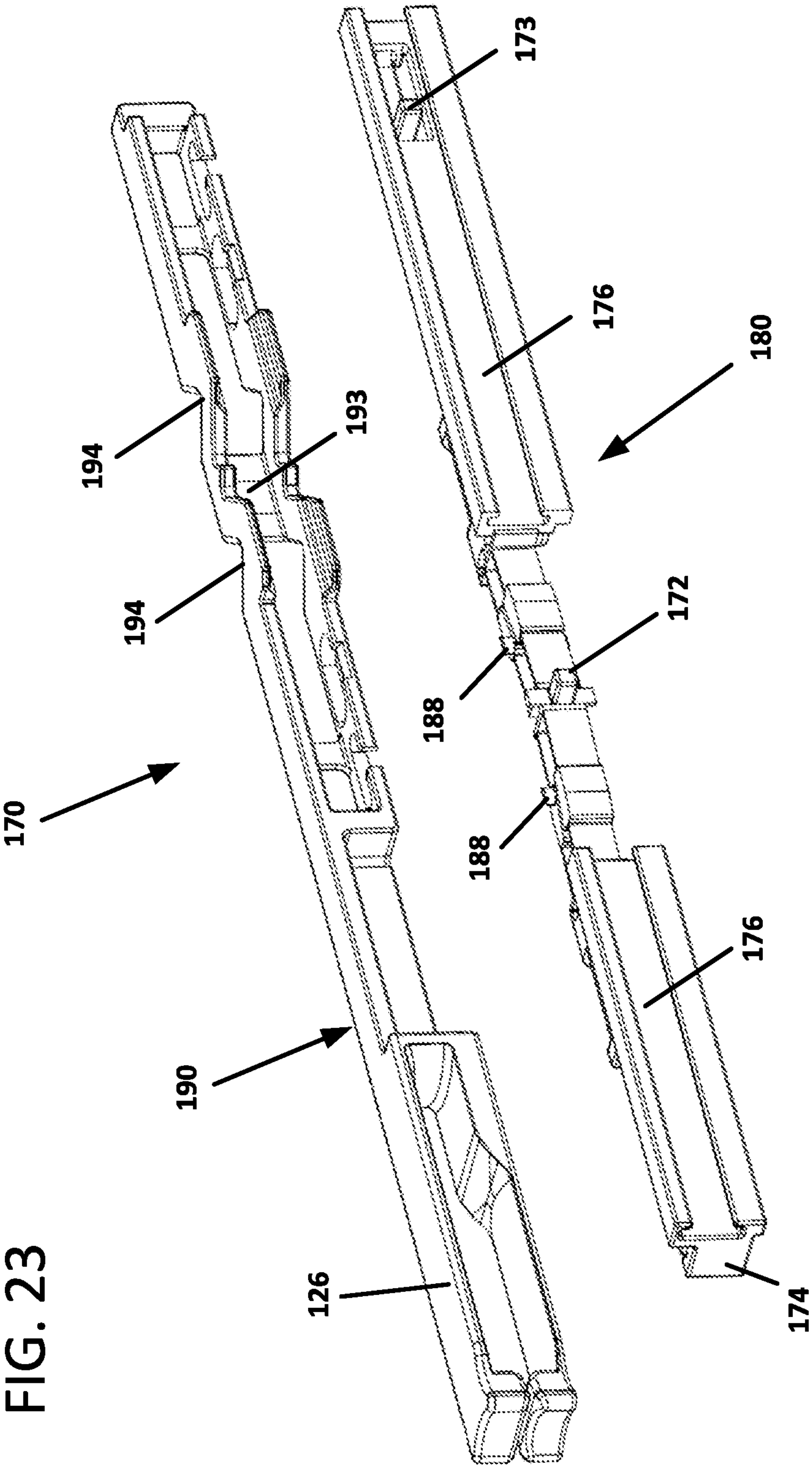
FIG. 23 is a perspective view of the deflection arrangement and actuation member of FIG. 22.

FIGS. 15-16 show example implementations **150*c*, 160*c* of the first and second deflection members 150, 160 where the actuation leg 166 of the second deflection member 160 has a convex shape before actuation (e.g., see FIG. 15). Pressing on the actuation leg 166 deflects the biasing member 145 into having a concave shape (e.g., see FIG. 16). The concave shape may increase the deflection distance for the actuation leg 166, which may provide a greater lateral distance between the latch and release positions of the second stop member 144**.

Figure 14:
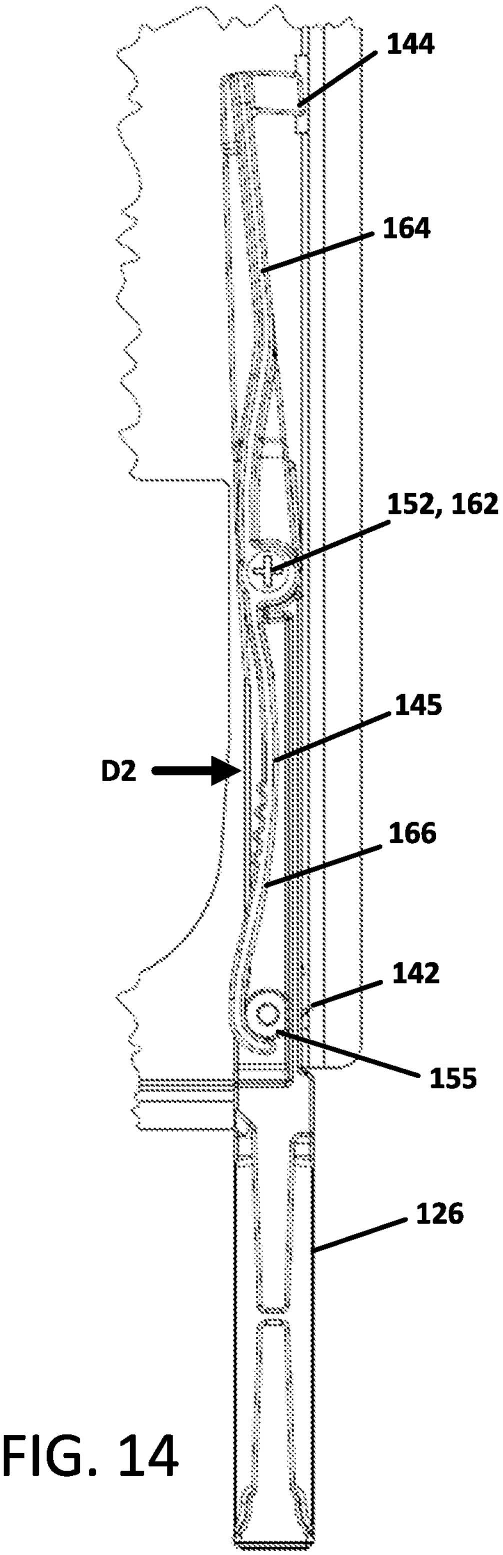
FIG. 14 shows the second deflection member disposed in the actuated position while the first deflection member is disposed in the neutral position.

FIGS. 15 and 16 also illustrate the latching arrangement 140 disposed at an opposite side of the tray arrangement 120 than what is shown in FIGS. 7-14. Accordingly, the second deflection direction D2 shown in FIG. 16 faces in the opposite direction than what is shown in FIG. 14. However, in both FIGS. 14 and 16, the second deflection direction D2 extends towards the nearest rail 128 of the tray arrangement 120 (i.e., towards an exterior of the tray arrangement instead of towards an interior of the tray arrangement). Accordingly, if both latching arrangements 140 of the tray arrangement 120 include the first stop member 142, then the cable guide 126 shown in FIG. 15 would deflect inwardly in the first deflection direction D1. Alternatively, if the latching arrangement shown in FIGS. 15 and 16 does not include a first stop member, then the cable guide 126 may be stationary relative to the tray arrangement 120.

FIGS. 17-21 illustrate fourth example implementations **150*d*, 160*d* of first and second deflection members 150, 160. The first deflection member 150*d* carries the first stop member 142 and defines the biasing member 145. For example, the first stop member 142 is disposed along the beam 154 between the base 152 and the cable guide 126. The biasing member 145 extends outwardly from the base 152 opposite the beam 154. In certain examples, the biasing member 145 includes a leaf spring. The first deflection member 150*d* is actuated by deflecting the cable guide 126** inwardly as discussed above.

The second deflection member **160*d* includes a rigid actuation leg 166 extending outwardly from the base 162 opposite the beam 164 carrying the second stop member 144. Pressing on the end 168 of the actuation leg 166 causes the second deflection member 160*d* to rotate about the base 162, which moves the second stop member 144 from the latch position (e.g., see FIG. 20) to the release position (e.g., see FIG. 21). In certain examples, an indicator 147 (e.g., a raised arrow, a textures surface, a colored section, textual indicia, etc.) is disposed at the end 168 of the actuation leg 166 to indicate to a user where to press to actuate the second deflection member 160*d*. In certain examples, the beam 154 of the first deflection member 150*d* defines a notch 157 aligned with the indicator 147 to facilitate finger access to the second end 168 of the second deflection member 160*d***.

In certain implementations, the beam 164 of the second deflection member **160*d* has a surface 161 against which the biasing member 145 presses to hold the second stop member 144 in the latch position. In certain examples, the biasing member 145 also holds the first deflection member 150*d* in the neutral position through engagement which the surface 161. In certain implementations, the second deflection member 160*d* defines an abutment wall 167 that extends downwardly from the actuation leg 166. Engagement between the abutment wall 167 and the beam 154 of the first deflection member 150*d* inhibits continued rotation of the second deflection member 160*d* after the second stop member 144** reaches the release position.

FIGS. 22-26 illustrate another example latching arrangement 170 including a stop member 172 that is movable between a latch position and a release position. The latching arrangement 170 is actuated (e.g., the stop member 172 is moved between the latch and release positions) by movement of a cable guide 126 relative to the tray arrangement 120. In certain examples, the cable guide 126 is movable along the forward-rearward axis FR relative to the tray arrangement 120. Accordingly, the tray arrangement 120 can be moved from the retracted position to the extended position by pulling forwardly on the cable guide 126 until the stop member 172 transitions to the release position and continuing to pull on the cable guide 126 until the tray arrangement 120 slides along the chassis 102 to the extended position. Similarly, the tray arrangement 120 can be moved from the extended position back to the retracted position by pushing rearward on the cable guide 126 until the stop member 172 transitions to the release position and continuing to push on the cable guide 126 until the tray arrangement 120 slides along the chassis 102 to the retracted position.

In certain implementations, the chassis 102 includes sidewalls 134' that define protruding guides 132' instead of the channel guides 132 of FIG. 4. In such implementations, the latching arrangement 170 includes a body 174 defining a channel 176 that receives one of the guides 132'. In certain examples, the channel 176 and guides 132' may be shaped to fit together (e.g., with a dovetail). The body 174 is secured to the tray arrangement 120 to move in unison with the tray arrangement 120. Accordingly, the tray arrangement 120 slides along the chassis 102 by gliding over one of the guides 132'. In certain examples, the chassis 102 defines multiple pairs of guides 132' and each pair of guides 132' is configured to support a respective tray arrangement 120.

In certain implementations, the guides 132' define one or more pockets 136, 138 sized to receive the stop member 172. In certain examples, each guide 132' defines a forward pocket 136 and a rearward pocket 138. In the example shown, the rearward pocket 138 is longer than the forward pocket 136. In other examples, the forward and rearward pockets 136, 138 are a common size. In other examples, the each guide 132' defines only the rearward pocket 138. When the tray arrangement 120 is disposed in the retracted position, the stop member 172 is disposed in the rearward pocket 138.

In some implementations, the stop member 172 is disposed in the forward pocket 136 when the tray arrangement 120 is disposed in the extended position. In other implementations, the stop member 172 abuts against an edge 131 of the guide 132' when the tray arrangement 120 is disposed in the extended position. In certain implementations, the tray arrangement 120 is configured to latch to the chassis 102 in either of two extended positions. In the example shown, the stop member 172 engages the forward pocket 136 when the tray arrangement 120 is disposed in the first extended position and the stop member 172 abuts the edge 131 of the guide 132' when the tray arrangement 120 is disposed in the second extended position.

In certain implementations, travel between the latching arrangement body 174 and the guide 132' is limited. For example, the body 174 may include a limiter 173 extending outwardly from the body 174. In certain examples, the limiter 173 protrudes through the channel 176 defined by the body 174 (e.g., see FIG. 23). The limiter 173 rides along the elongate rearward pocket 138 as the tray arrangement 120 is slid relative to the chassis 102. When the tray arrangement 120 is disposed in the retracted position, the limiter 173 is disposed at a rearward edge of the elongate pocket 138. When the tray arrangement 120 is disposed in an extended position, the limiter 173 is disposed at a forward edge of the elongate pocket 138. In certain examples, the limiter 173 is configured to be manually retracted from the rearward pocket 138 to remove the tray arrangement 120 from the chassis 102 (e.g., through the front 104).

In accordance with certain aspects of the disclosure, the latching arrangement 170 includes a deflection arrangement 180 and an actuation member 190. The deflection arrangement 180 includes the stop member 172. The actuation member 190 includes the cable guide 126. The actuation member 190 is movable (e.g., slidable) relative to the deflection arrangement 180. In certain implementations, the cable guide 126 is movable along the forward-rearward axis while the stop member 172 is movable along an axis S that is transverse to the forward-rearward axis FR.

In certain implementations, the deflection arrangement 180 is a bistable mechanism including a shuttle 185 that is movable relative to a first base 181 and a second base 189 along the axis S. The shuttle 185 carries the stop member 172 between the latch position (e.g., see FIG. 23) and the release position (e.g., see FIG. 24). The shuttle 185 is coupled to the first and second bases 181, 189 by arms 182. The first and second bases 181, 189 are fixed relative to each other. One end of each arm 182 couples to the shuttle 185 at a first flexural pivot 184 and the other end of each arm 182 couples to the respective base 181, 189 at a second flexural pivot 186.

The bases 181, 189 are positioned sufficiently close together to cause the arms 182 to bow outward. Accordingly, absent external forces, the flexural pivots 184, 186 cooperate to hold the shuttle 185 in one of two stable positions-a first flexed position (e.g., see FIG. 24A) and a second flexed position (not shown) in which the arms 182 bow in an opposite direction. When the shuttle 185 is disposed in either flexed position, the shuttle 185 will not move absent external forces. If an external force is applied to shift the shuttle 185 along the axis S (e.g., see FIG. 24B), then the arms 182 will bias the shuttle 185 towards the nearest of the two stable positions. Accordingly, the arms 182 bias the shuttle 185 in a first direction along the axis S until the shuttle 185 passes over a centerline upon which the arms 182 bias the shuttle 185 in an opposite second direction along the axis S.

The stop member 172 is disposed in the latch position when the shuttle 185 is disposed in the first flexed position. In certain implementations, the release position of the stop member 172 is not one of the stable positions of the deflection arrangement 180. Rather, the stop member 172 is held in the release position by the actuation member 190 as will be described herein. In certain examples, the release position is located between the first flexed position and the centerline.

Figures 24A, 24B:
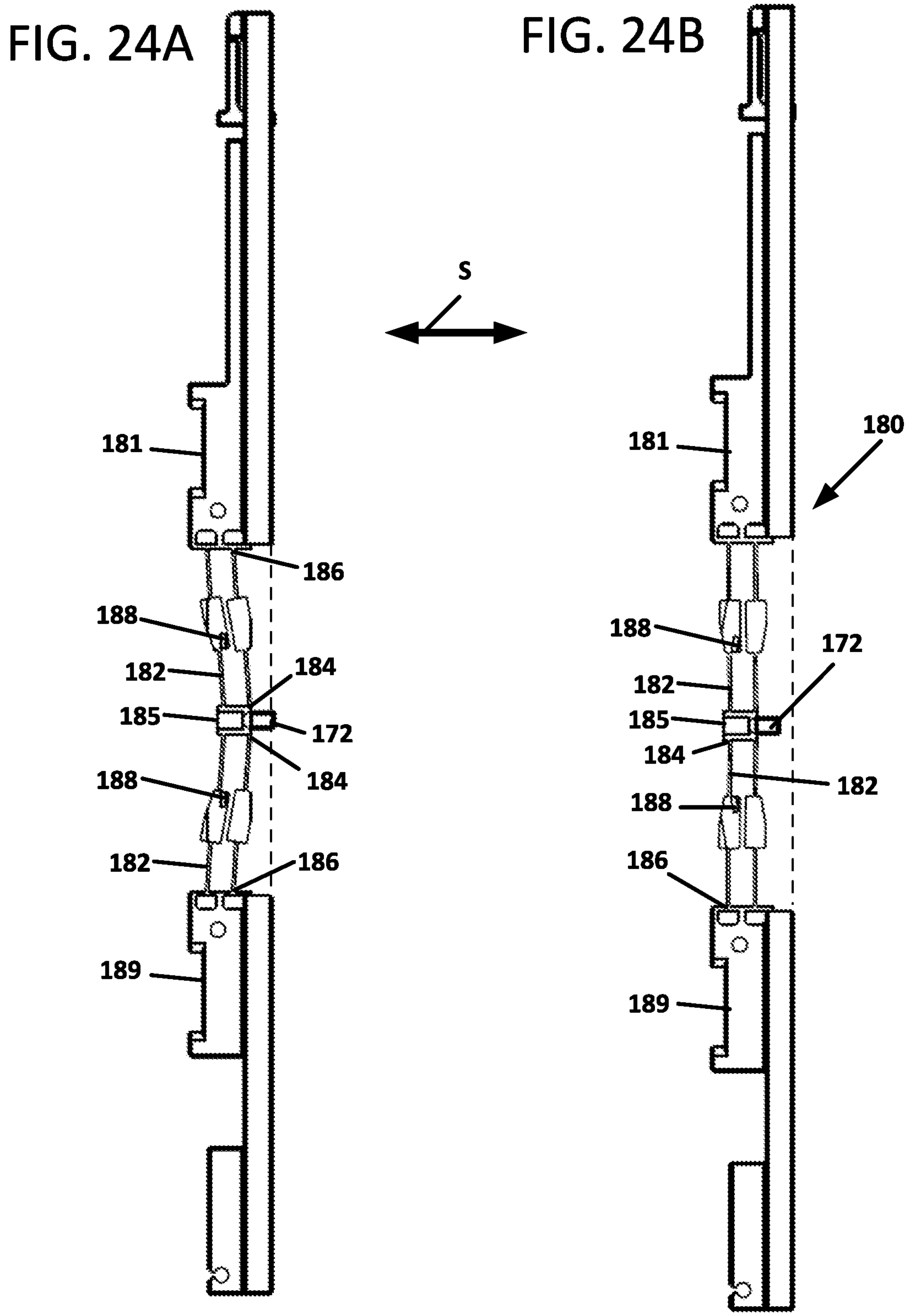
FIGS. 24A and 24B illustrate the latching member of the fifth type of latching arrangement of FIG. 22 in the release and latching positions, respectively.

In the example shown in FIGS. 24A and 24B, the shuttle 185 is coupled to each base 181, 189 by two arms 182. In other examples, however, the shuttle 185 may be coupled to each base 181, 189 by a greater or lesser number (e.g., three, one, etc.) number of arms 182. In certain examples, one or more of the arms 182 may carry a cam follower 188 at an intermediate location between the first and second flexural pivots 184, 186. In the example shown, a first arm 182 extending between the shuttle 185 and the first base 181 carries a first cam follower 188 and a second arm 182 extending between the shuttle 185 and the second base 189 carries a second cam follower 188.

Figures 25, 26:
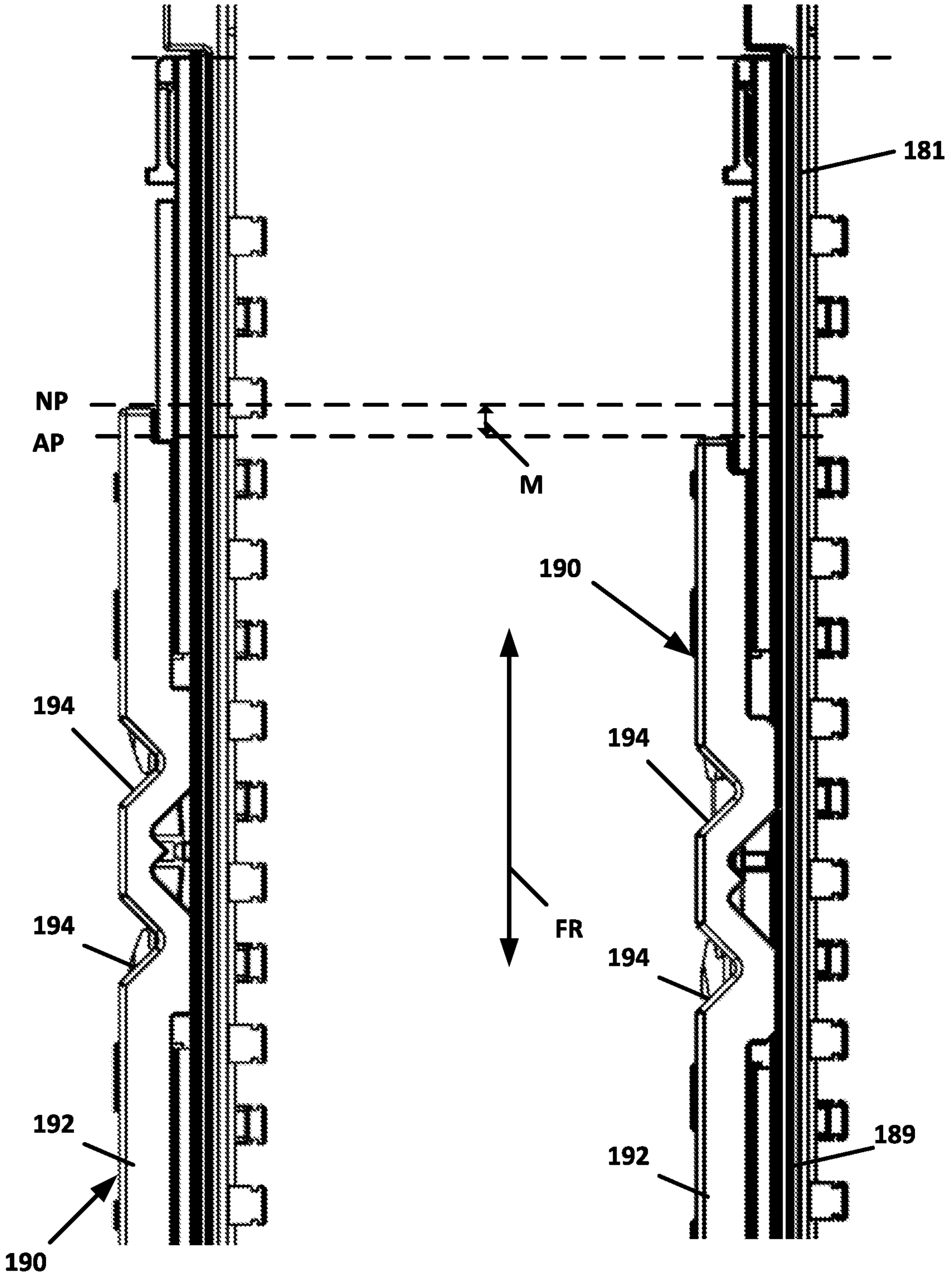
FIGS. 25 and 26 illustrate the actuation member of the fifth type of latching arrangement of FIG. 22 in the neutral and actuated positions, respectively.
Figure 27:
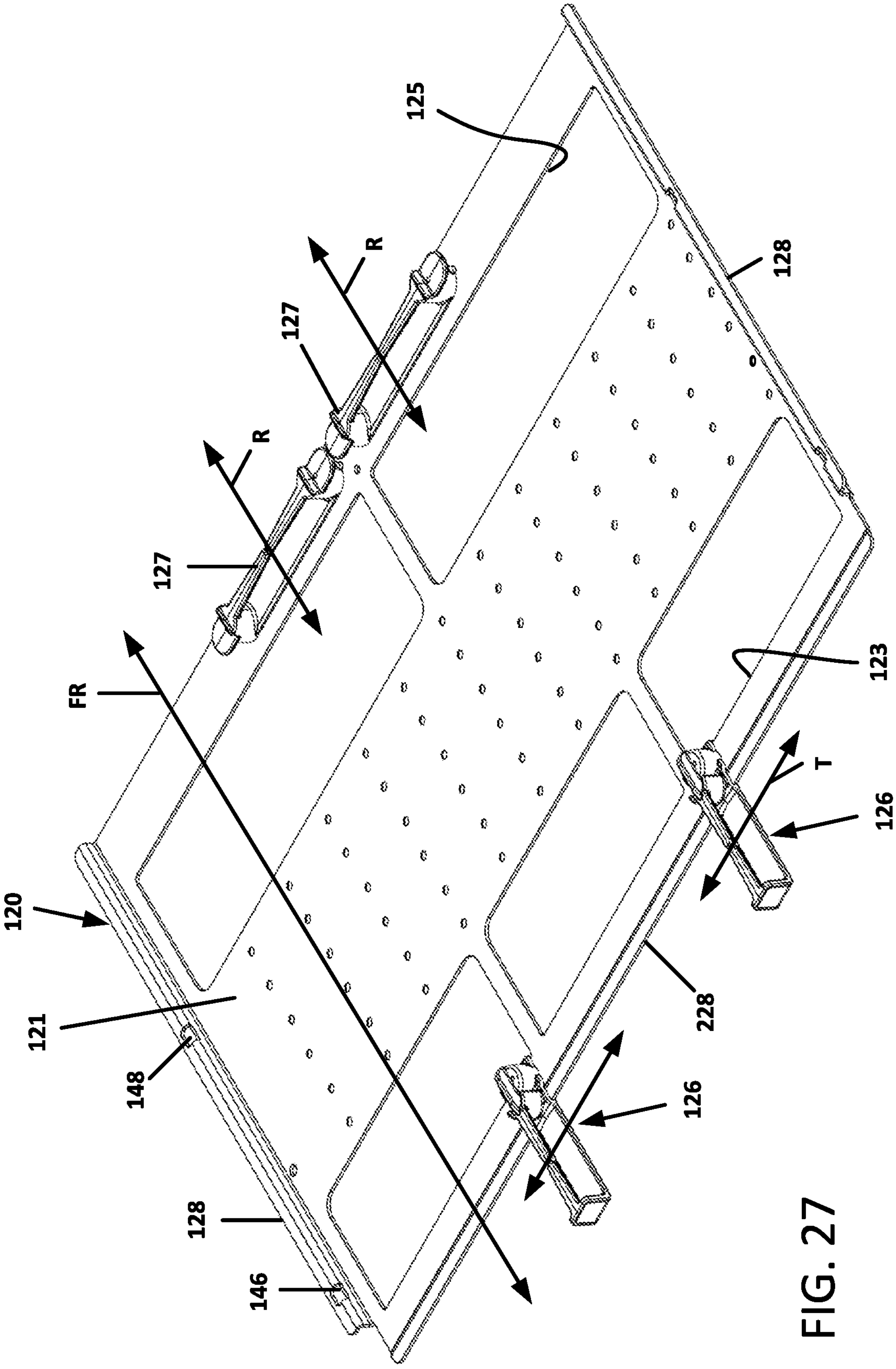
FIG. 27 is a perspective view of the tray arrangement of FIG. 5 with the latching arrangements removed and various example cable guides and rear cable guides shown in a first configuration.

As shown in FIGS. 25 and 26, the actuation member 190 is slidable along the forward-rearward axis FR between a neutral position NP (e.g., FIG. 25) and an actuated position AP (e.g., FIG. 26). In certain examples, the actuation member 190 slides a distance M between the two positions NP, AP. The actuation member 190 includes a body 192 that defines a camming surface 194 for each cam follower 188 of the deflection arrangement 180. When the body 192 of the actuation member 190 slides along the forward-rearward axis FR, each cam follower 188 rides along the respective camming surface 194 to shift the cam follower 188 along the axis S against the bias of the deflection arrangement 180. Shifting the cam followers 188 deflects the respective arms 182, which translates the shuttle 185 along the axis S.

In certain examples, the camming surfaces 194 are V-shaped. The cam followers 188 are disposed at a center of the V-shape when disposed in the neutral position. The cam followers 188 move over a first half of the V-shape of the respective camming surface 194 when the actuation body 192 is pulled in a first direction (e.g., forward) along the forward-rearward axis FR and move over a second-half of the V-shape of the respective camming surface 194 when the actuation body 192 is pushed in an opposite second direction (e.g., rearward) along the forward-rearward axis FR. Accordingly, the stop member 172 can be transitioned away from the latch position by either pushing or pulling on the actuation member 190 (e.g., on the cable guide 126).

In certain implementations, the deflection arrangement 180 and actuation member 190 are configured to inhibit the shuttle 185 from reaching the second stable position when the shuttle 185 is moved along the axis S away from the first stable position. For example, the actuation member 190 includes a limiter wall 193 against which the shuttle 185 abuts when entrained by the camming members 188 away from the first flexed position. Engagement between the shuttle 185 and the limiter wall 193 inhibits the shuttle 185 from crossing the centerline. Accordingly, the arms 182 will bias the shuttle 185 (and hence the stop member 172) back towards the first flexed (latched) position.

When the tray arrangement 120 reaches one of the discrete positions (e.g., the retracted position, the extended position, etc.), the user releases the actuation member 190. Without the force applied by the user to counteract the bias of the deflection arrangement 180, the shuttle 185 (and hence stop member 172) translates back towards the stable position (the latch position). Therefore, the stop member 172 will snap into the pocket 136, 138 or over the edge 131 upon reaching one of the discrete positions of the tray arrangement 120. Further, the translation movement of the camming members 188 back along the axis S pushes (via camming surfaces 194) the actuation member 190 back towards the neutral position.

Referring now to FIGS. 27-32, the tray arrangement 120 can be equipped with various types of cable management to route cables towards and away from the tray arrangement 120. For example, one or more cable guides 126 can be disposed at a front of the tray arrangement 120 while one or more rear cable guides 127 are disposed at a rear of the tray arrangement 120. In the example shown, the cable guides 126 are oriented to define through-passages T transverse to the forward-rearward axis FR and the rear cable guides 127 are oriented to define passages R extending along the forward-rearward axis FR.

In certain implementations, the cable guides 126 are disposed along the front of the tray arrangement 120 in alignment with cassette guides G (see FIG. 5). In certain implementations, the cable guides 126 are disposed between finger access openings 123 defined through the tray arrangement 120 at the front. In the example shown in FIG. 27, the tray arrangement 120 defines two cable guides 126 disposed between three finger access openings 123 so that each cable guide 126 is disposed between an adjacent pair of the finger access openings 123. In certain examples, the latching arrangement(s) 140 mounted to the tray arrangement 120 add cable guides 126 to the opposite sides of the tray arrangement 120 (e.g., see FIG. 5) in addition to the cable guides 126 shown in FIG. 27.

Figure 32:
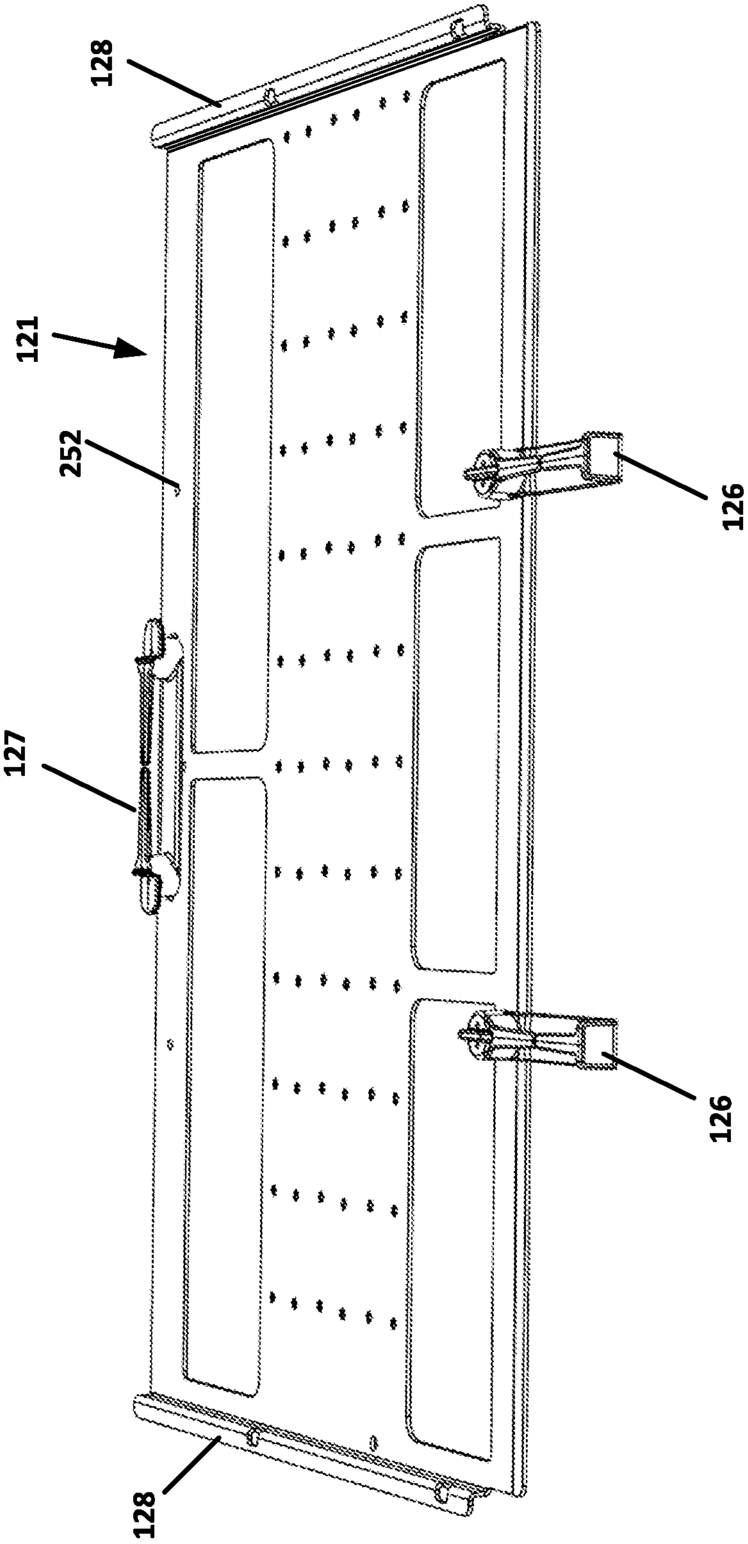
FIG. 32 is a perspective view of the tray arrangement of FIG. 27 with the cable guides and rear cable guide shown in a second configuration.

In some implementations, a rear cable guide 127 is provided for each rear finger access opening 125 is defined at the rear of the tray arrangement 120. In other implementations, a greater or lesser number of rear cable guides 127 are provided on the tray arrangement 120. For example, FIG. 32 shows a single rear cable guide 127 mounted to the tray arrangement 120. In the example shown in FIG. 32, the rear cable guide 127 is mounted to a central portion of the rear of the tray arrangement 120.

Figure 28:
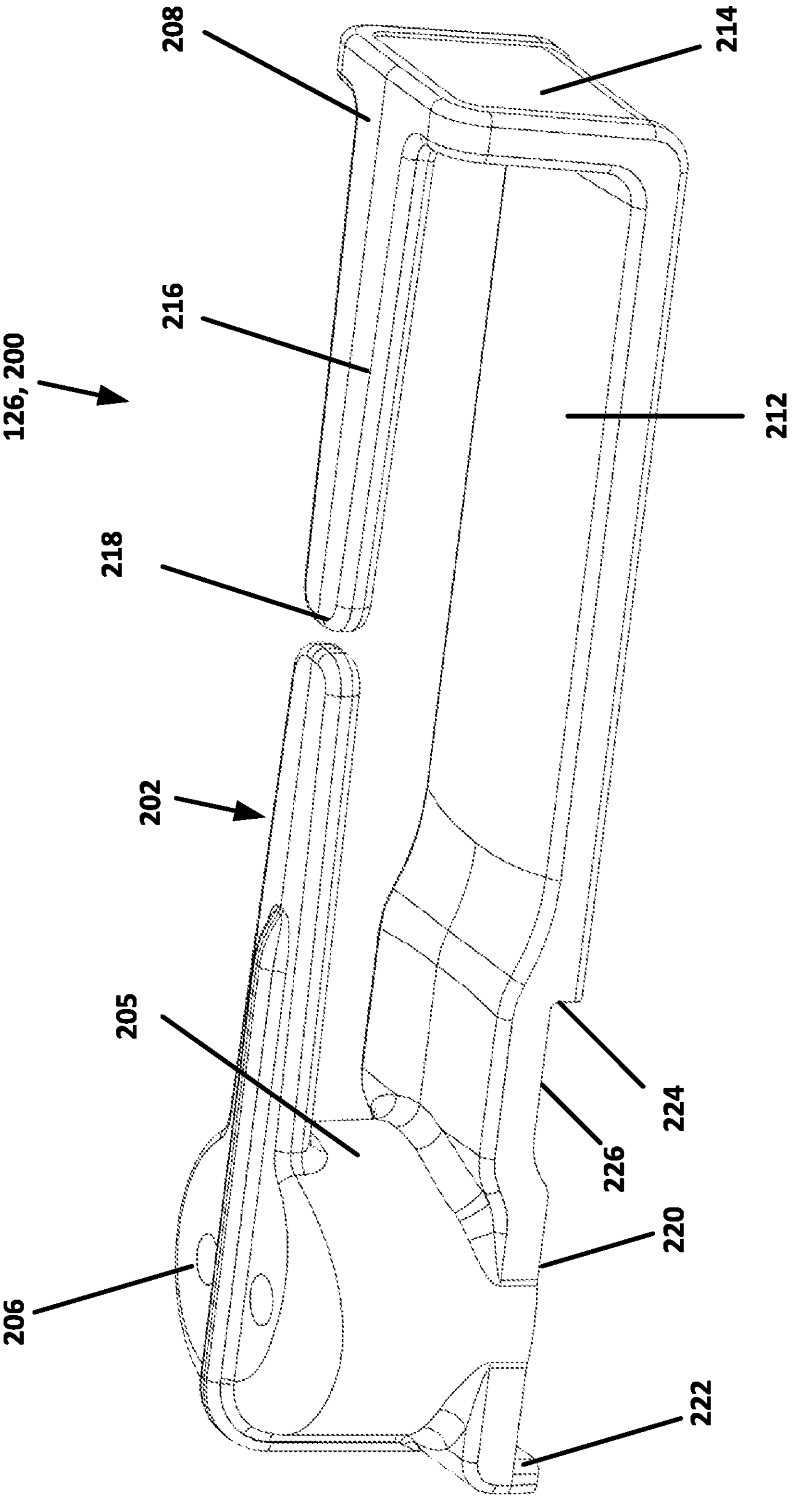
FIG. 28 is atop perspective view of an example cable guide.
Figure 29:
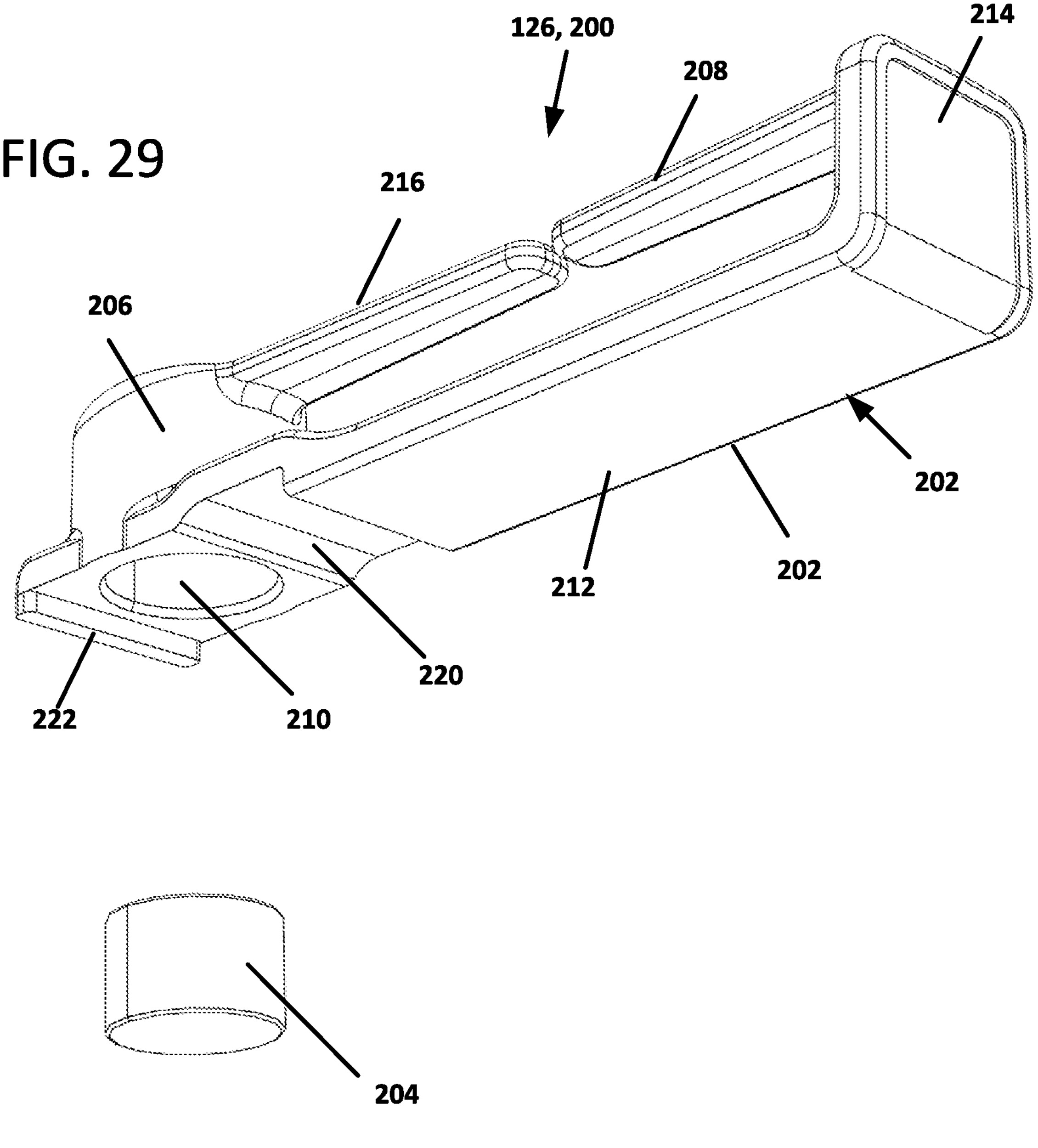
FIG. 29 is a bottom perspective view of the example cable guide of FIG. 28 shown with a magnet exploded therefrom.

In certain implementations, the various types of cable guides 126, 127 not forming part of the latching arrangement 140, 170 can be magnetically mounted to the tray arrangement 120. For example, FIGS. 28 and 29 show an example implementation 200 of a cable guide 126 suitable for mounting at the front of the tray arrangement 120. The cable guide 200 includes a guide body 202 and a magnet 204 coupled to the guide body 202. The magnet 204 is configured to be magnetically attracted to the tray arrangement 120 (e.g., to the tray 121).

The magnet 204 is mounted within a base 206 of the guide body 202. For example, the magnet 204 can be disposed within a cavity 210 defined in the base 206 and accessible from a bottom of the guide body 202. In some examples, the magnet 204 is adhesively coupled within the cavity 210. In other examples, the magnet 204 may be fiction fit, latched, enclosed, or otherwise secured within the cavity 210.

A passage-defining member 208 extends outwardly from the base 206 to define the through-passage T. The base 206 defines a bend radius limiting surface 205 forming part of the through-passage T. The passage-defining member 208 includes a bottom wall 212 and an end wall 214 coupled to the bottom wall 212 opposite the base 206. The bottom wall 212 is longer than the end wall 214 is tall so that the through-passage T is elongate along the forward-rearward axis FR. The passage-defining member 208 also may include a top wall 216. In certain examples, the top wall 216 is slit to enable one or more fibers or cables to enter the passage T through the slit instead of being threaded through the passage T.

In certain implementations, the guide body 202 is configured to mate with the tray arrangement 120 to assist in holding the guide body 202 to the tray arrangement 120. In certain examples, the guide body 202 defines a bottom recess 220 extending along the forward-rearward axis FR between a forward-facing wall 222 and a rearward-facing wall 224. The guide body 202 can be mounted so that the forward-facing wall 222 extends into one of the finger access openings 123 and the rearward-facing wall 224 extends over a front edge of the tray arrangement 120. In certain examples, the guide body 202 defines a further notch or groove 226 within the bottom recess 220 to accommodate a raised front flange 228 (FIG. 27) at the front edge of the tray arrangement 120.

Figure 30:
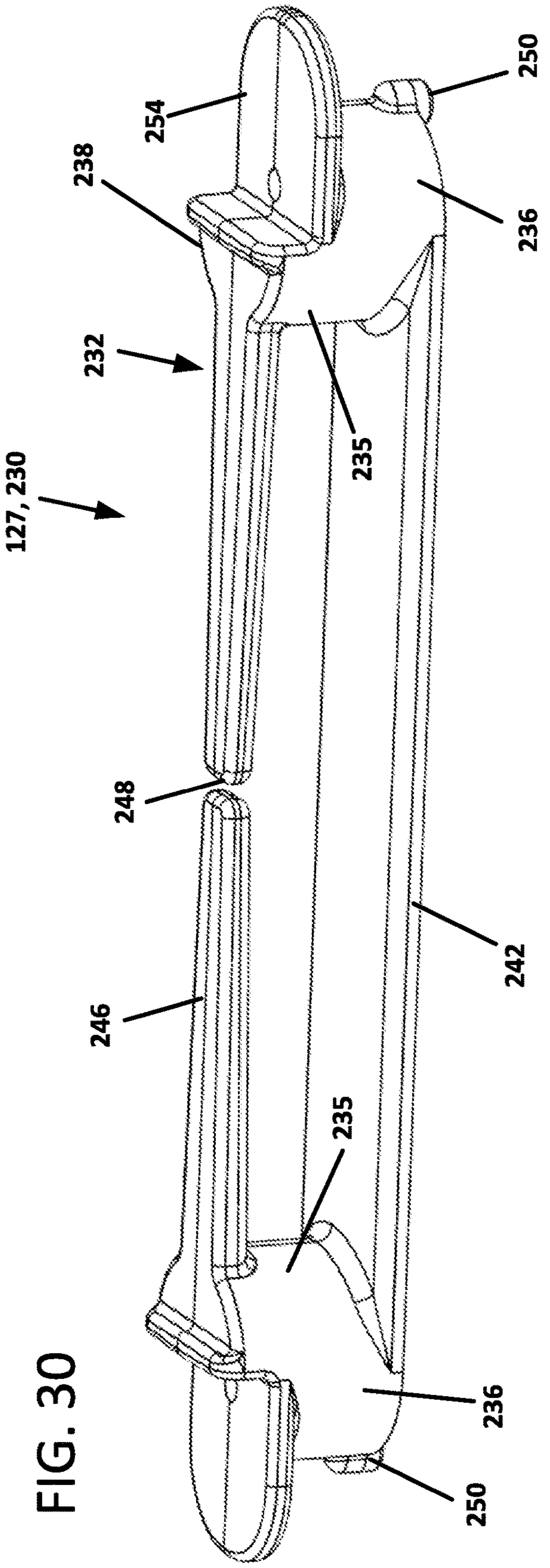
FIG. 30 is a top perspective view of an example rear cable guide.
Figure 31:
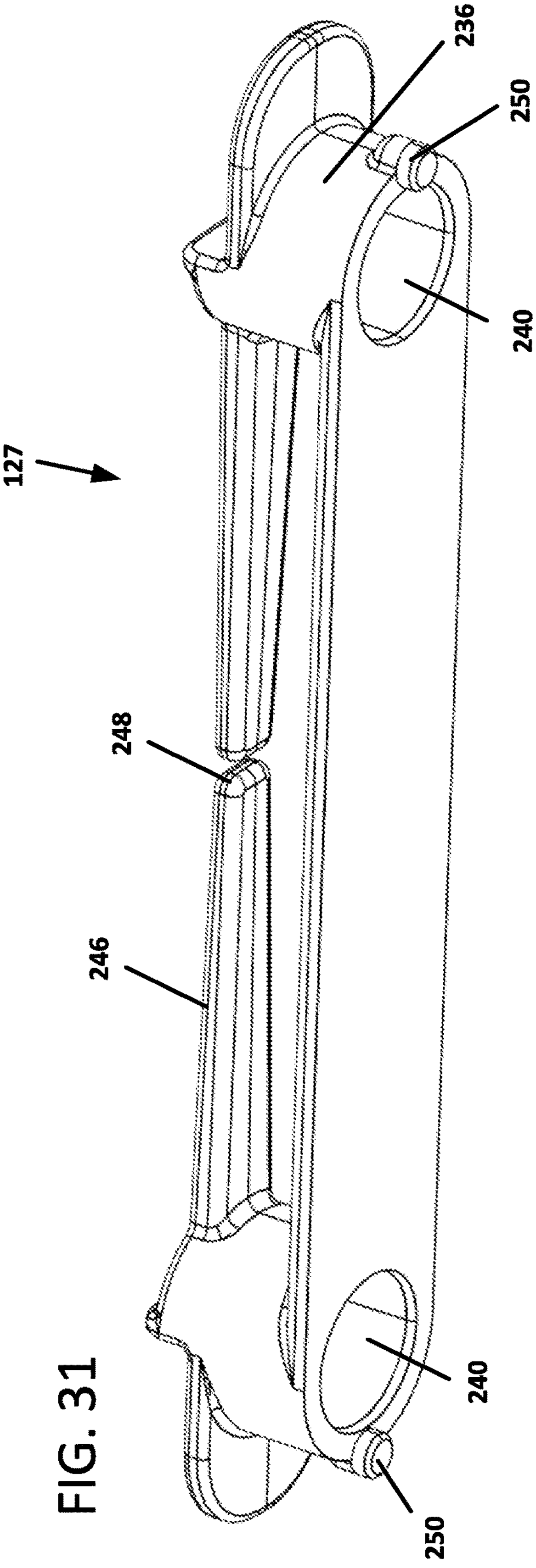
FIG. 31 is a bottom perspective view of the example rear cable guide of FIG. 30.

FIGS. 30 and 31 show an example implementation 230 of a rear cable guide 127 suitable for mounting at the rear of the tray arrangement 120. The rear cable guide 230 includes a guide body 232 and one or more magnets coupled to the guide body 232. The one or more magnets are configured to be magnetically attracted to the tray arrangement 120 (e.g., to the tray 121). In the example shown, the guide body 232 defines a through-passage R extending between opposite first and second bases 236. Each base 236 defines a cavity 240 in which one of the magnets can be mounted (e.g., adhesively, frictionally, etc.). The bases 236 define opposing bend radius limiting surfaces 235 that form part of the through-passage R.

The bases 236 are coupled together by a bottom wall 242. In certain examples, a top wall 246 extends from the first base 236 towards the second base 236. In some examples, a single top wall 246 connects the bases 236. In other examples, a respective top wall 246 extends from each base 236 so that ends of the top walls 246 oppose each other to define a lateral slit through which the through-passage R is accessible.

In certain examples, the rear cable guide 230 includes flanges 254 extending outwardly from the bases 236. The flanges 254 may facilitate mounting the rear cable guides 230 (e.g., a user may press on the flanges 254 to mount the guide 230 to the tray arrangement 120). The flanges 254 also may aid in routing cables around the rear cable guides 230. The flanges 254 also may aid in handing the rear cable guides 230 during installation.

In some implementations, the cable guides 126, 127 are mountable at any position along the tray arrangement 120. In other implementations, the cable guides 126, 127 are mountable at pre-determined positions along the tray arrangement 120. For example, the cable guides 126, 127 and the tray arrangement 120 may cooperate to form an alignment arrangement to position the cable guides 126, 127 at the predetermined positions. For example, the rear cable guide 230 shown in FIGS. 30 and 31 includes alignment pegs 250 that fit within alignment holes 252 (e.g., see FIG. 32) defined by the tray arrangement 120.

Figure 33:
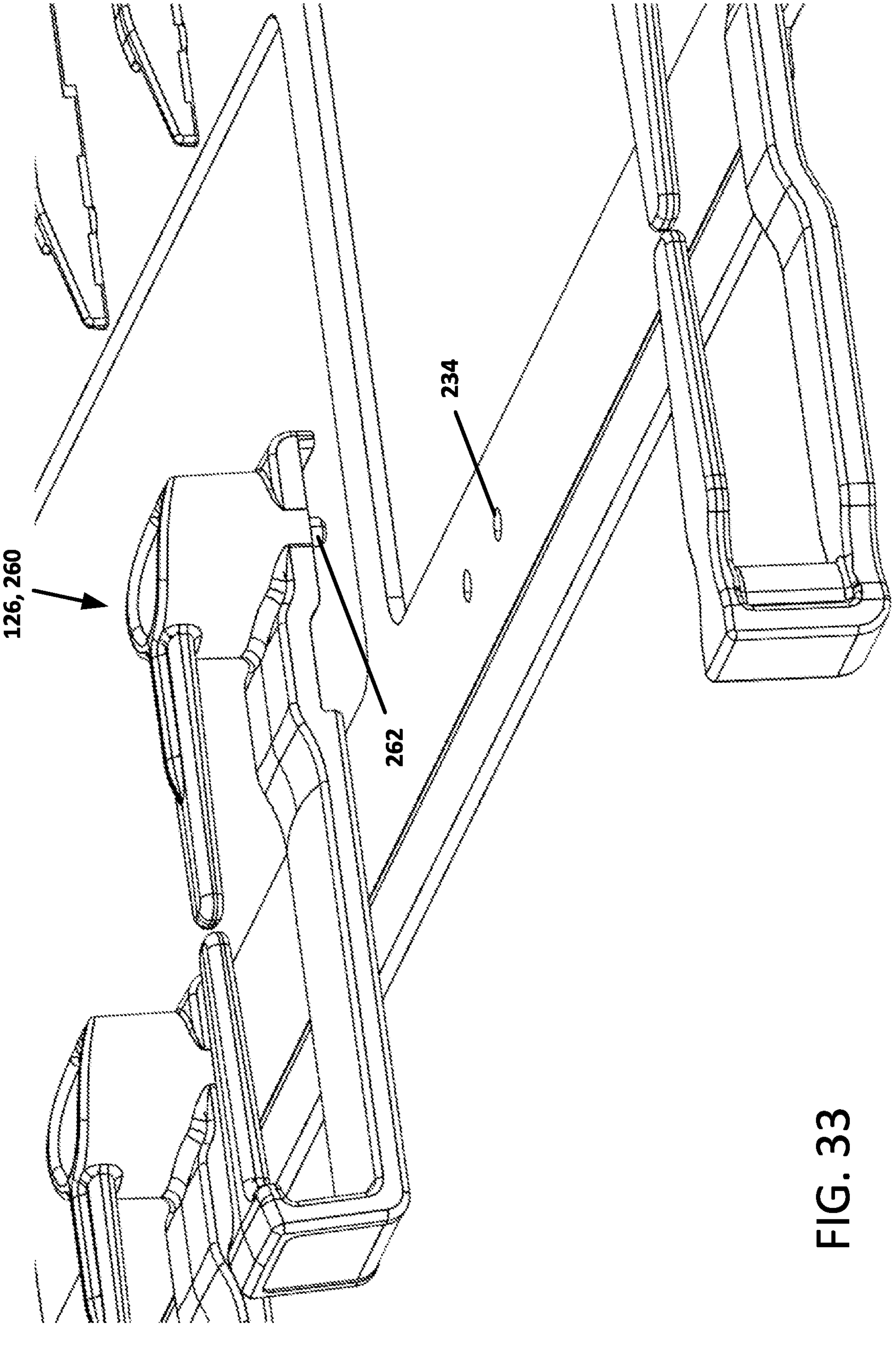
FIG. 33 shows another implementation of the cable management guide configured to be mounted to the tray arrangement.
Figure 34:
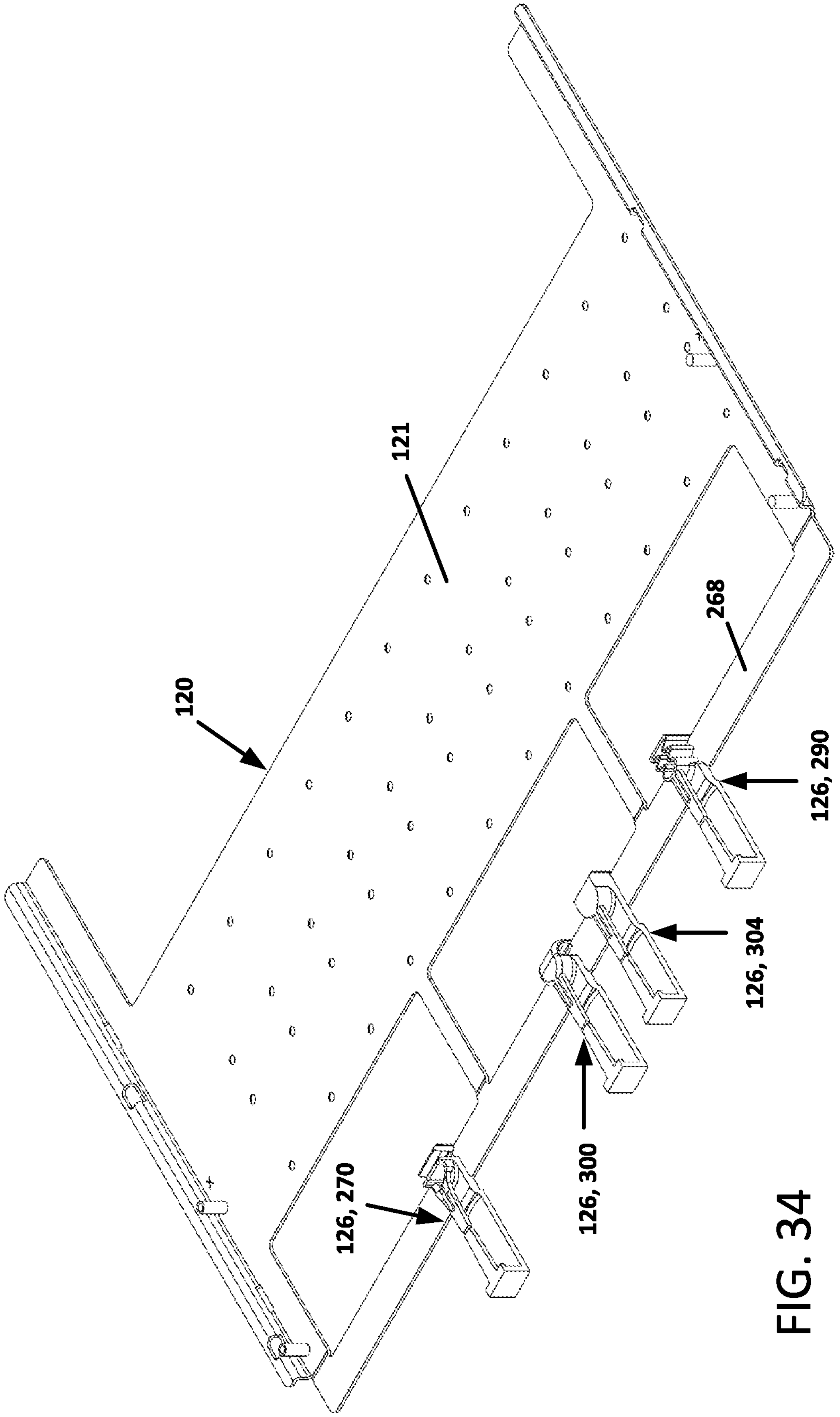
FIG. 34 illustrates four alternative implementations of a cable management guide configured to be mounted to the tray arrangement without a magnet.

FIG. 33 shows another implementation 260 of the cable management guide 126 configured to be mounted to the tray arrangement 120 (e.g., at a front edge of the tray arrangement 120). The guide 260 is substantially similar to the cable guide 126 shown in FIGS. 28 and 29, except the guide 260 includes alignment pegs 262 that fit into alignment holes 234 to help position the guide 260.

Figure 35:
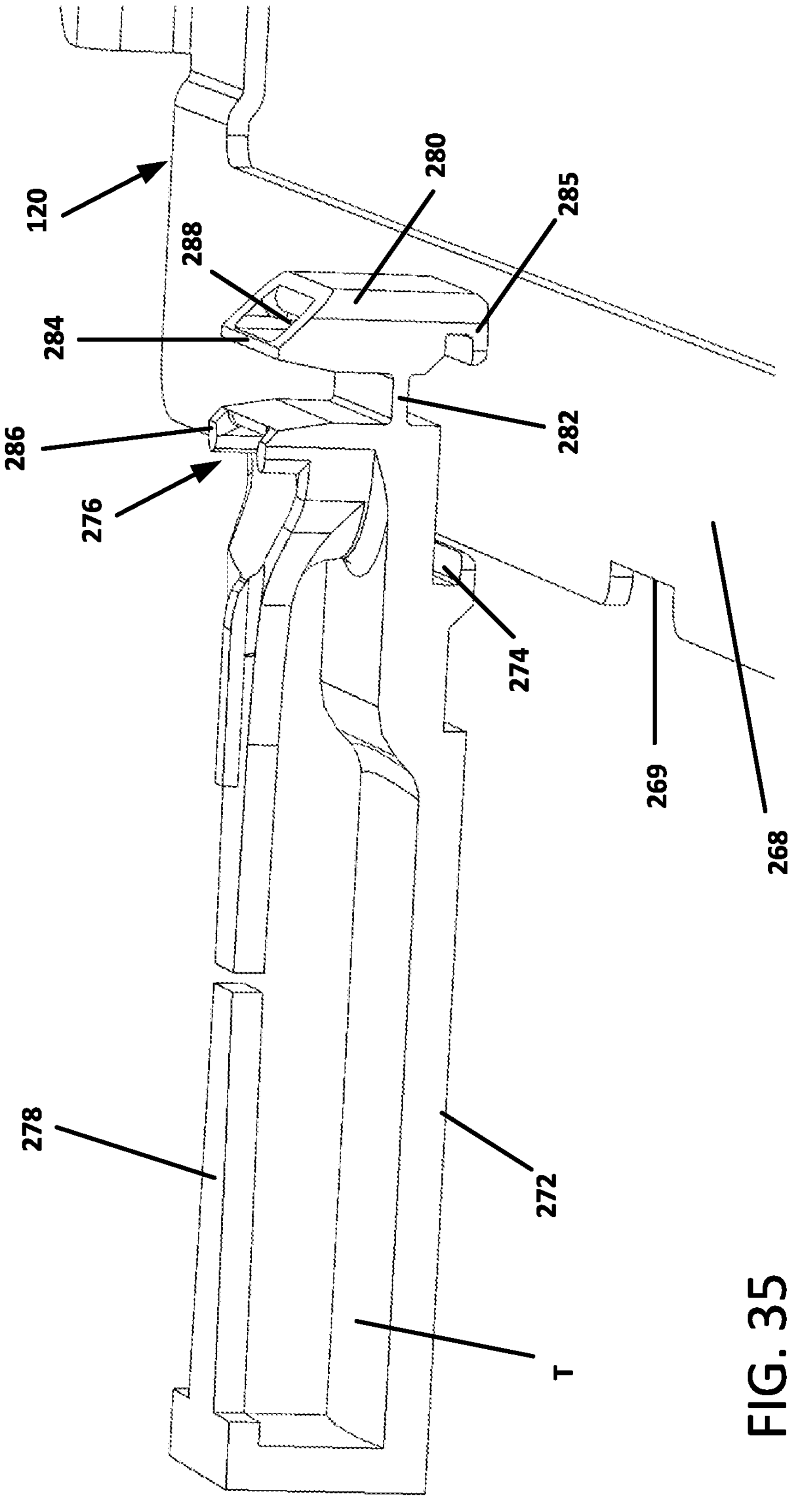
FIG. 35 is a top perspective view of a first non-magnetic implementation of a cable guide having a pinchable release member.
Figure 36:
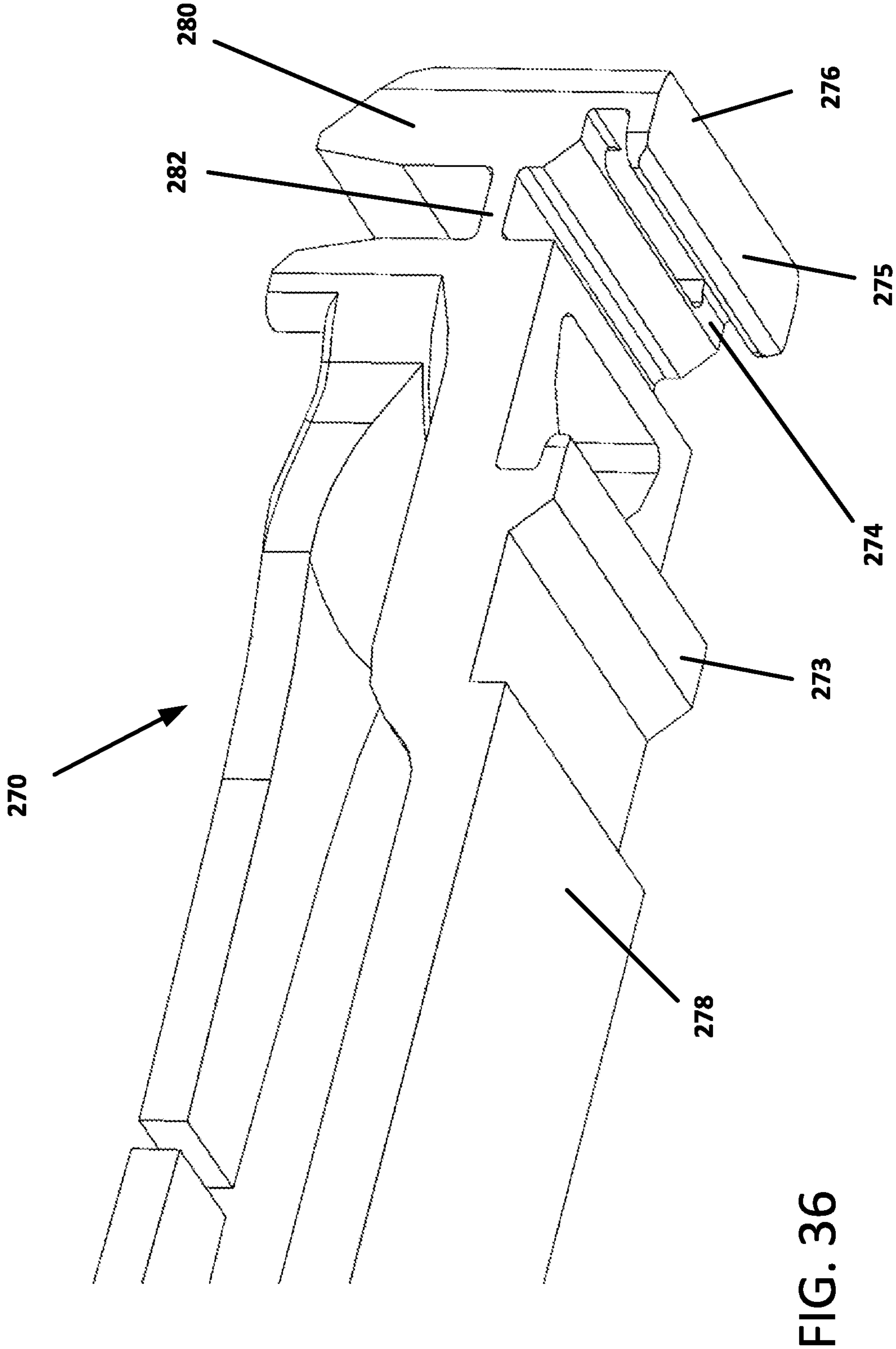
FIG. 36 is a bottom perspective view of the cable guide of FIG. 35.
Figure 37:
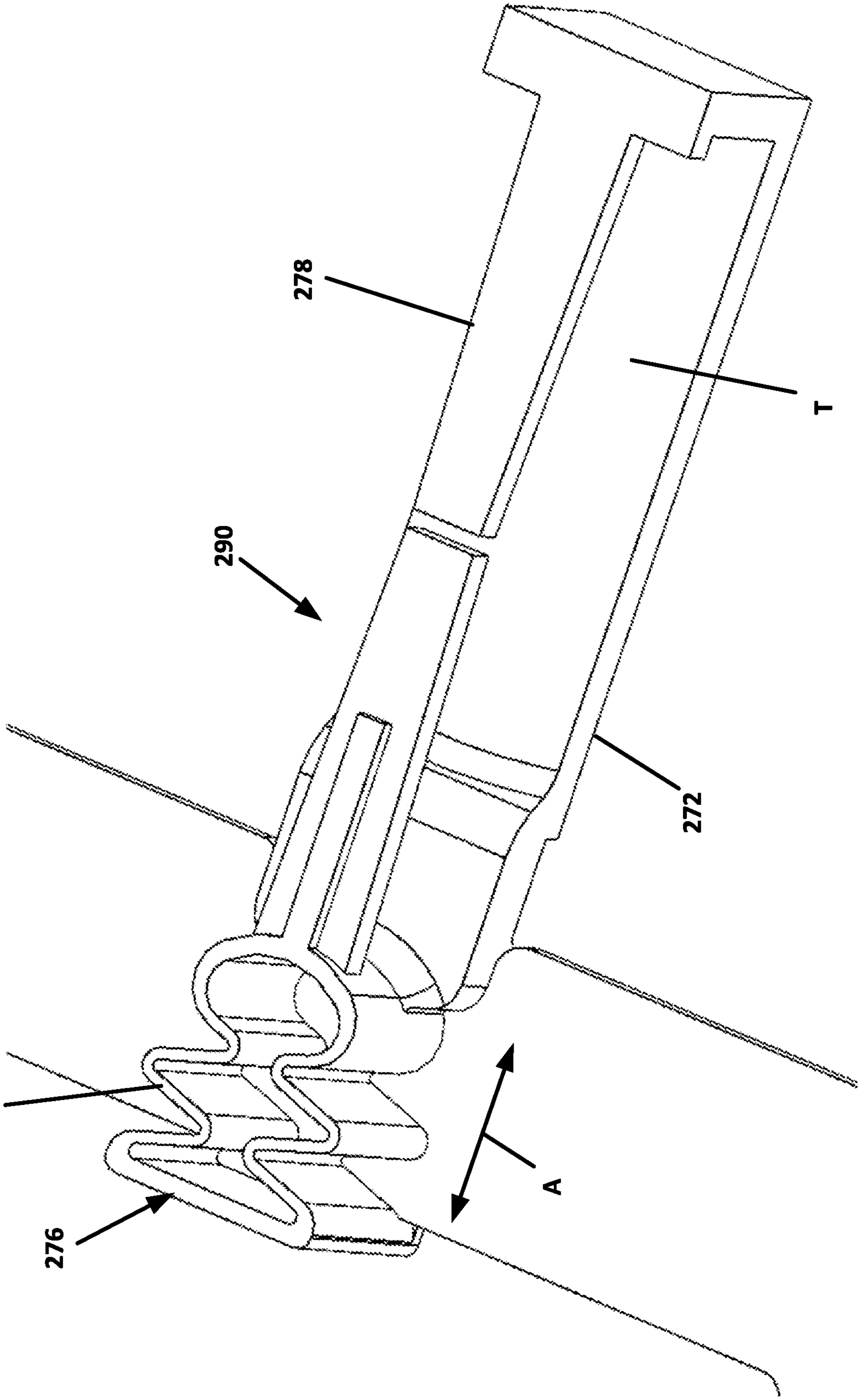
FIG. 37 is a top perspective view of a second non-magnetic implementation of a cable guide having a pull-to-release configuration where a user pulls on the through-passage defining portion of the cable guide to release the cable guide from the tray.
Figure 38:
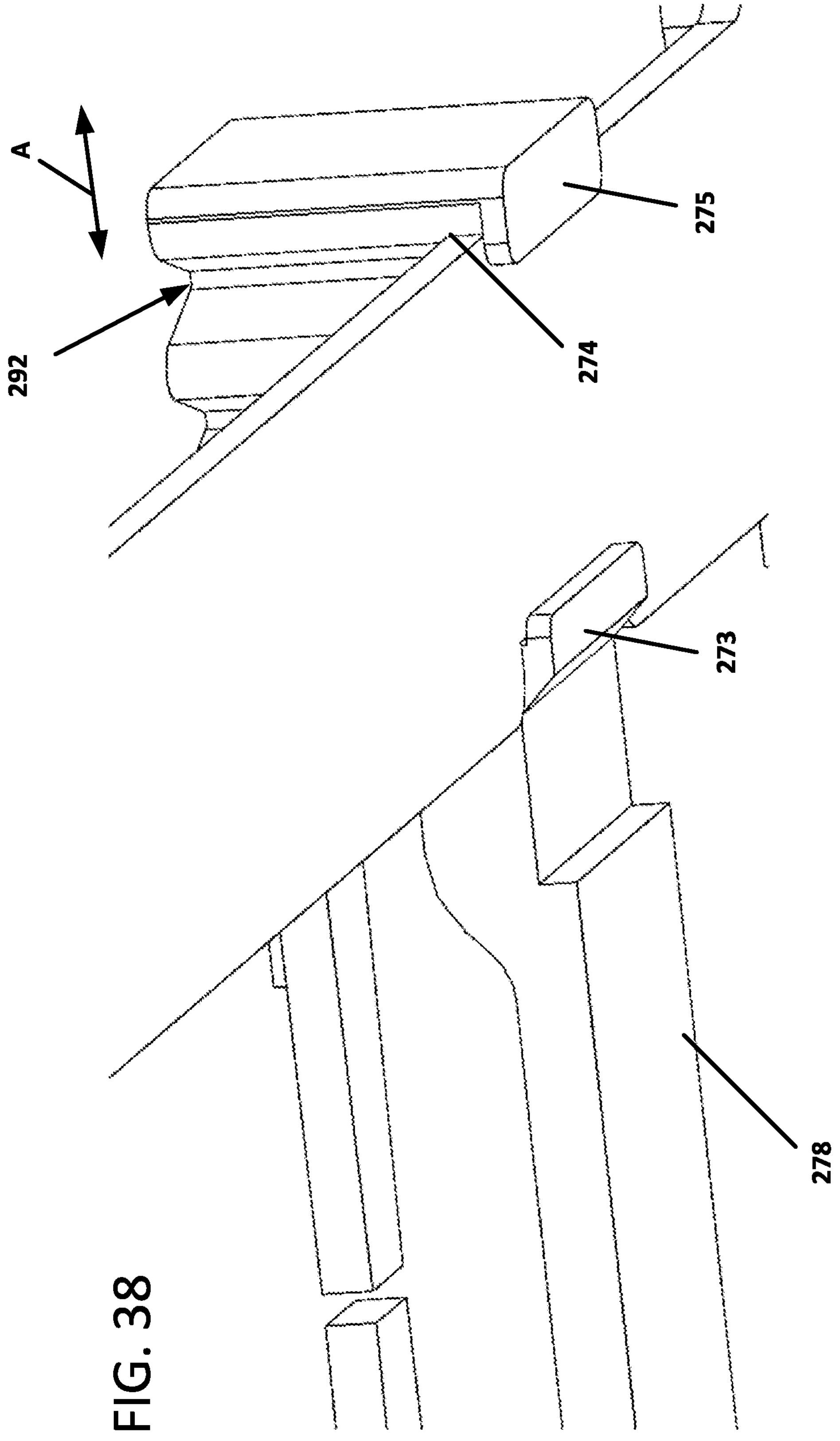
FIG. 38 is a bottom perspective view of the cable guide of FIG. 37 mounted to a tray arrangement.
Figure 39:
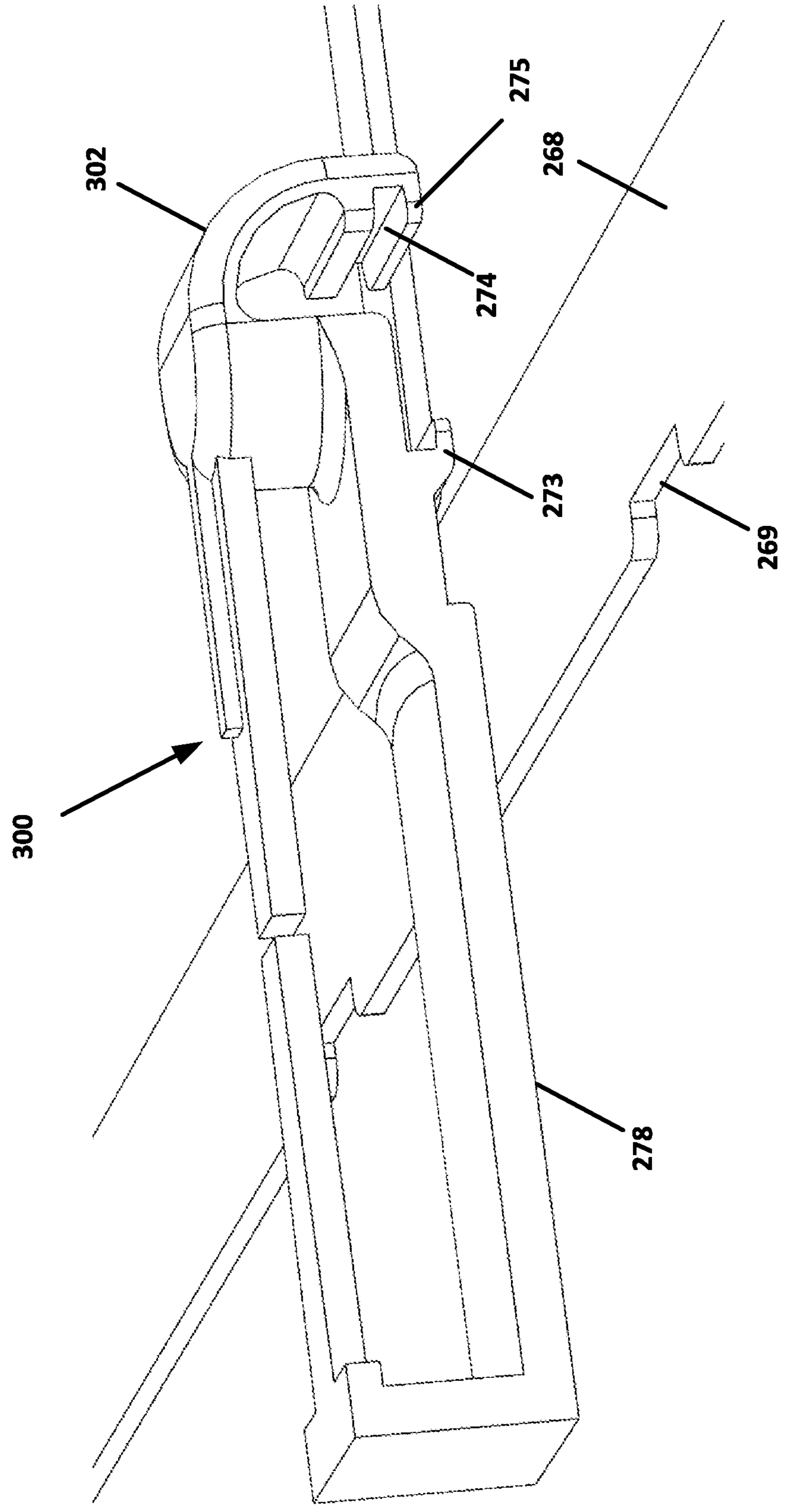
FIG. 39 is a top perspective view of a third non-magnetic implementation of a cable guide having a pull-to-release configuration wherein a user pulls on the release member to release the cable guide from the tray.
Figure 40:
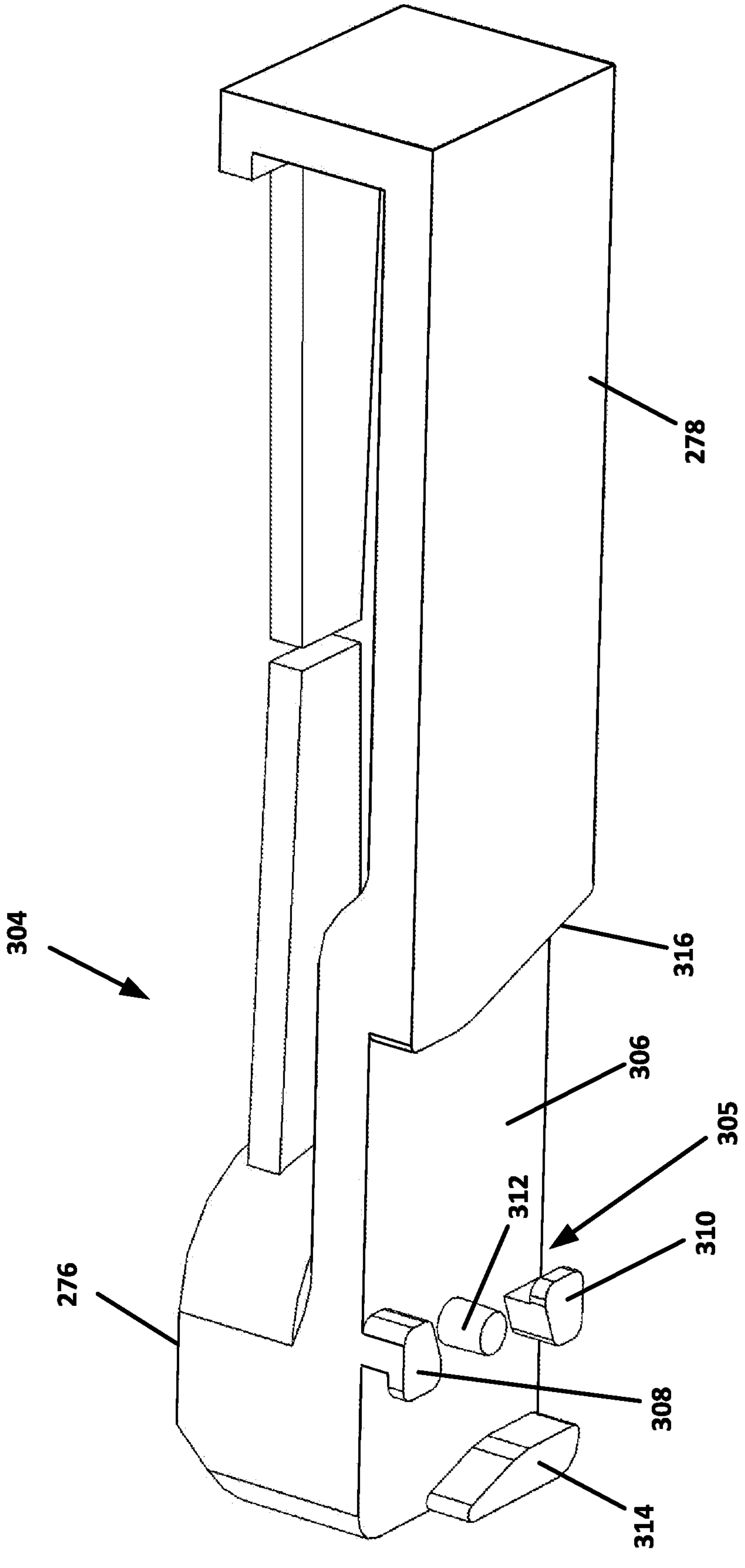
FIG. 40 is a bottom perspective view of a fourth non-magnetic implementation of a cable guide having a twist-to-mount configuration.

FIGS. 34-43 illustrate four alternative implementations 270, 290, 300, 304 of the cable management guide 126 configured to be mounted to the tray arrangement 120 without a magnet. Each of the cable guides 270, 290, 300, 304 is configured to mount to a front strip 268 defining a front edge of the tray arrangement 120. A first alternative guide 270 is shown in FIGS. 35 and 36. A second alternative guide 290 is shown in FIGS. 37 and 38. A third alternative guide 300 is shown in FIG. 39. A fourth alternative guide 304 is shown in FIGS. 40-43.

Each of the cable guides 270 includes a guide body 272 having a passage-defining section 278 extending outwardly from a mounting section 276 to define the through-passage T. The mounting section 276 defines a slot 274 extending parallel to the through-passage T. The slot 274 is sized to receive the front strip 268 of the tray arrangement 120. The slot 274 is partially defined by opposing retaining tabs 273, 275. The passage-defining section 278 of each cable guide 270, 290, 300, 304 is about the same, but the mounting sections 276 differ from each other.

FIGS. 35-36 illustrate a first non-magnetic cable guide 270 where the mounting section 276 includes a release member 280 attached to the passage-defining section 278 by a web 282. Accordingly, the release member 280 is configured to flex or pivot relative to the passage-defining section 278 to change the shape of the slot 274. For example, a top 284 of the release member 280 can be deflected towards the passage-defining section 278 to move a bottom 285 of the release member 280, which includes the retaining tab 275, away from the passage-defining section 278 to enlarge the slot 274. In an example, the passage-defining section 278 may define a grip member 286 to enable a user to pinch the top 284 of the release member 280 towards the grip member 286 to enlarge the slot 274. In certain examples, the release member 280 defines a slot 288 in which a tool (e.g., a screw driver, part of a tweezer, etc.) can be inserted to aid in deflecting the release member 280.

In certain examples, the front strip 268 defines a notch 269 (e.g., a forwardly-facing notch) at which the first non-magnetic cable guide 270 can mount. If the cable guide 270 is sized to mount at the notch 269, then the cable guide 270 would not be able to slide along the front strip 268. Rather, the sides of the notch 269 would retain the cable guide 270 in position.

FIGS. 37 and 38 illustrate a second non-magnetic cable guide 290, which includes a release member 292 defining the second retaining tab 275. The release member 292 is configured to flex along an axis A (e.g., transverse to the through-passage T) to enlarge the slot 174. In certain examples, the release member 292 has an accordion shape to enable movement of the second retaining tab 275 away from the first retaining tab 273 of the passage-defining section 278 along the axis A. In certain implementations, the second non-magnetic cable guide 290 can be mounted at a notch 269 in the front strip 268 to inhibit lateral movement of the cable guide 290 along the front strip 268.

FIG. 39 illustrates a third non-magnetic cable guide 300, which includes a release member 302 defining the second retaining tab 275. The release member 302 includes a flexible arm cantilevered from the passage-defining section 278. The release member 302 curves so that deflection of the release arm 302 moves the second retaining tab 275 axially relative to the first retaining tab 273, thereby allowing a user to enlarge the slot 274 to assist in mounting the cable guide 300. In certain implementations, the third non-magnetic cable guide 300 can be mounted at a notch 269 in the front strip 268 to inhibit lateral movement of the cable guide 300 along the front strip 268.

FIGS. 40-43 illustrate a fourth non-magnetic cable guide 304, which has a mounting section 276 that does not include a movable component. Rather, the mounting section 276 includes a mounting member arrangement 305 that is configured to be secured to the front strip 268 of the tray arrangement 120 through a twisting action. By not including moving or flexible components, the cable guide 304 may be more stable and less likely to break.

In certain implementations, the mounting section 276 defines a flat bottom surface 306 extending between a ramped wall 316 and a wedge member 314. In certain examples, the wedge member 314 does not extend fully across a width of the mounting section 276 to facilitate the twisting motion for mounting the cable guide 304. In certain implementations, the mounting member arrangement 305 includes a first foot 308, a second foot 310, and an alignment peg 312. In certain examples, the first foot 308, the second foot 310, and the alignment peg 312 are aligned across the width of the mounting section 276. In certain examples, the alignment peg 312 is disposed between the first and second foot 308, 310. In certain examples, the first foot 308 faces in an opposite direction to the second foot 310.

Figure 41:
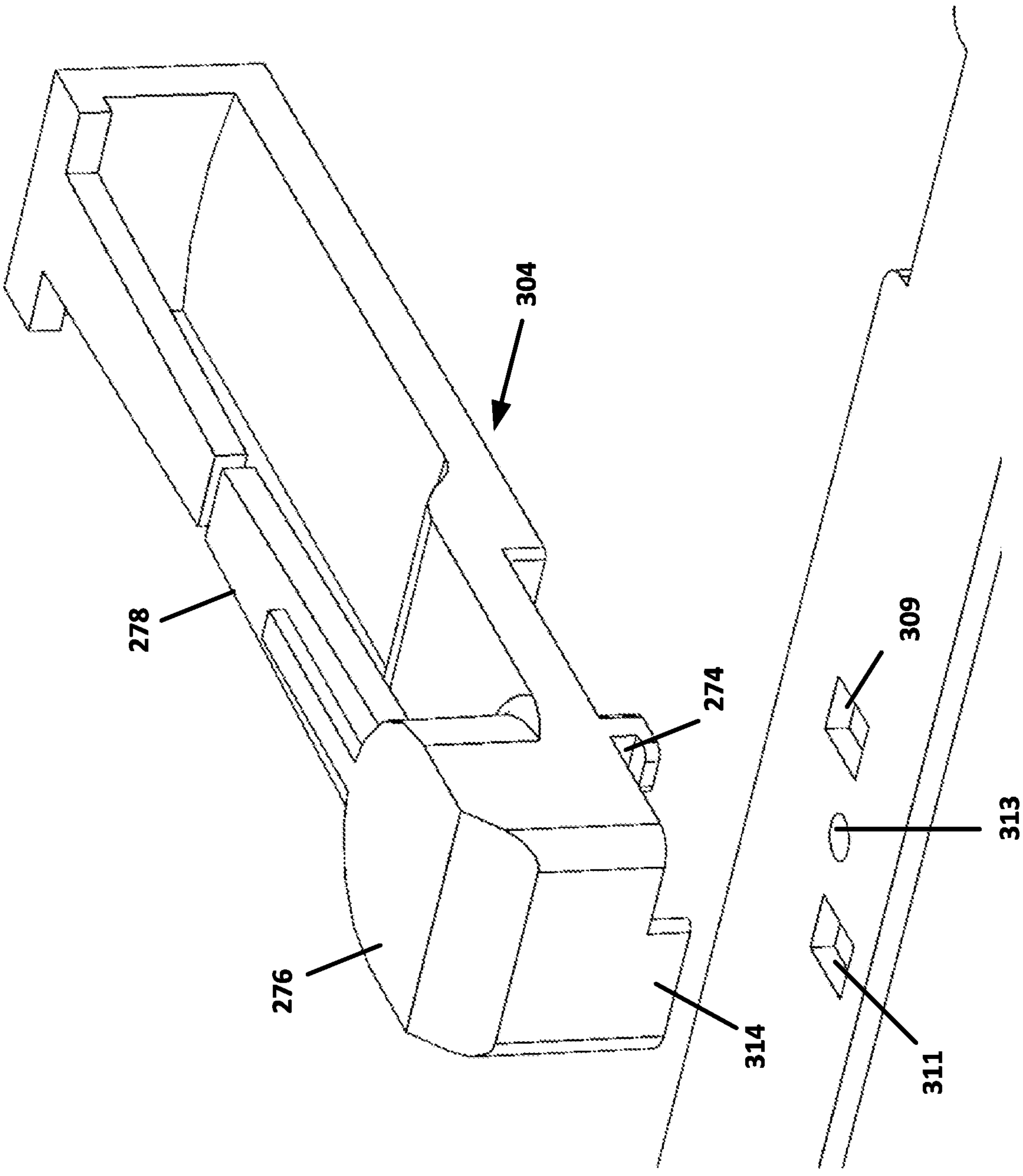
FIG. 41 is a top perspective view showing the cable guide of FIG. 40 exploded outwardly from a tray arrangement.
Figure 42:
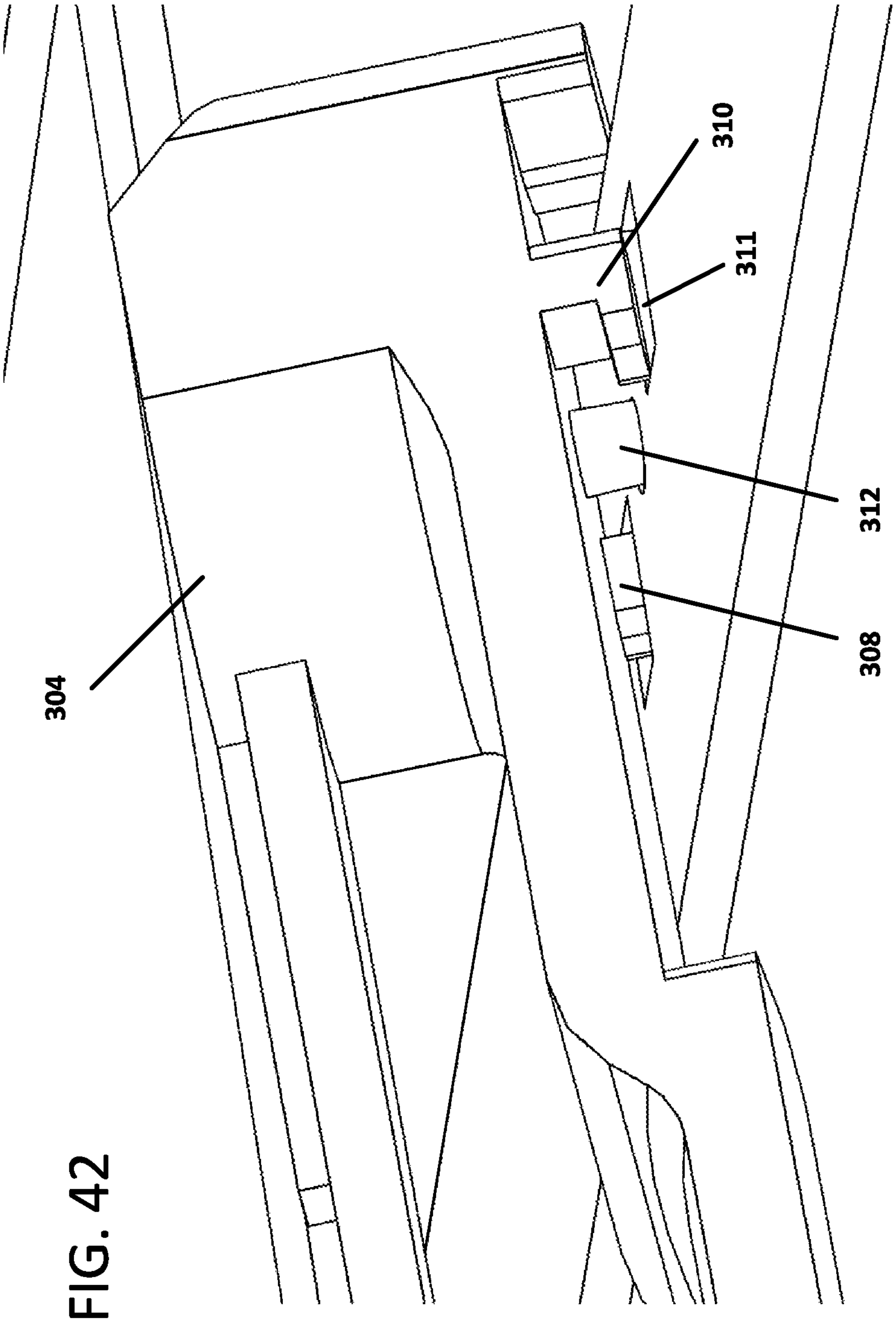
FIG. 42 shows the cable guide of FIG. 40 tilted to partially mount the cable guide to the tray arrangement.

As shown in FIG. 41, the front strip 268 of the tray arrangement 120 defines a first aperture 309 configured to receive the first foot 308, a second aperture 311 configured to receive the second foot 310, and a third aperture 313 configured to receive the alignment peg 312. In certain examples, the first aperture 309 is offset from the second aperture 311 along the forward-rearward axis FR. As shown in FIG. 42, the cable guide 304 is mounted to the strip 268 by first inserting the first foot 308 into the first aperture 309 and the alignment peg 312 into the third aperture 313. Because the first and second apertures 309, 311 are offset and the first and second feet 308, 310 are not, the cable guide 304 is tilted along a longitudinal axis of the cable guide 304 (which extends parallel to the forward-rearward axis FR of the tray arrangement 120) to enable insertion of the first foot 308 into the first aperture 309. The shapes of the ramped wall 316 and wedge member 314 accommodate this tilting.

Figure 43:
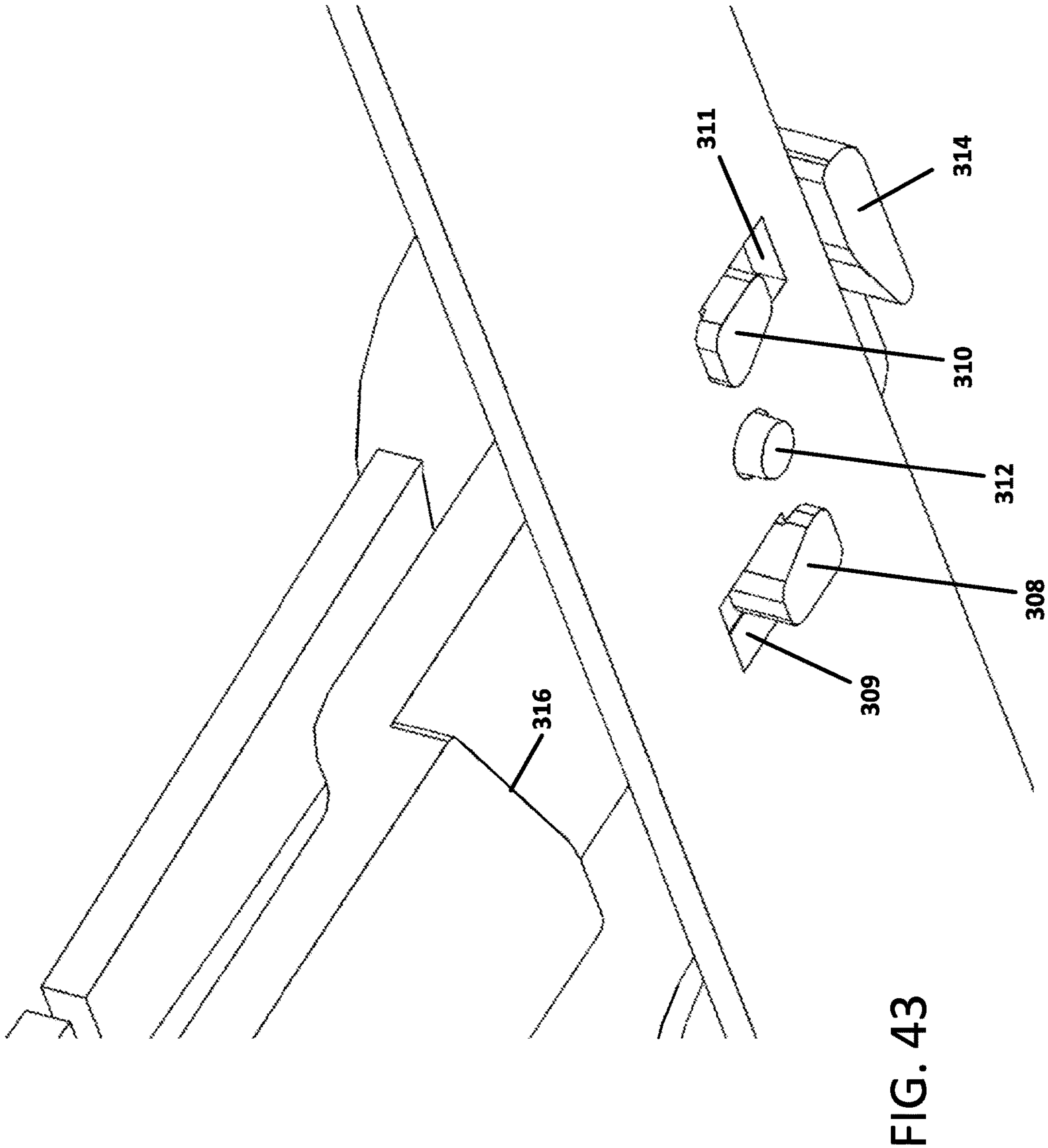
FIG. 43 shows the cable guide of FIG. 42 fully mounted to the tray arrangement.
Figure 44:
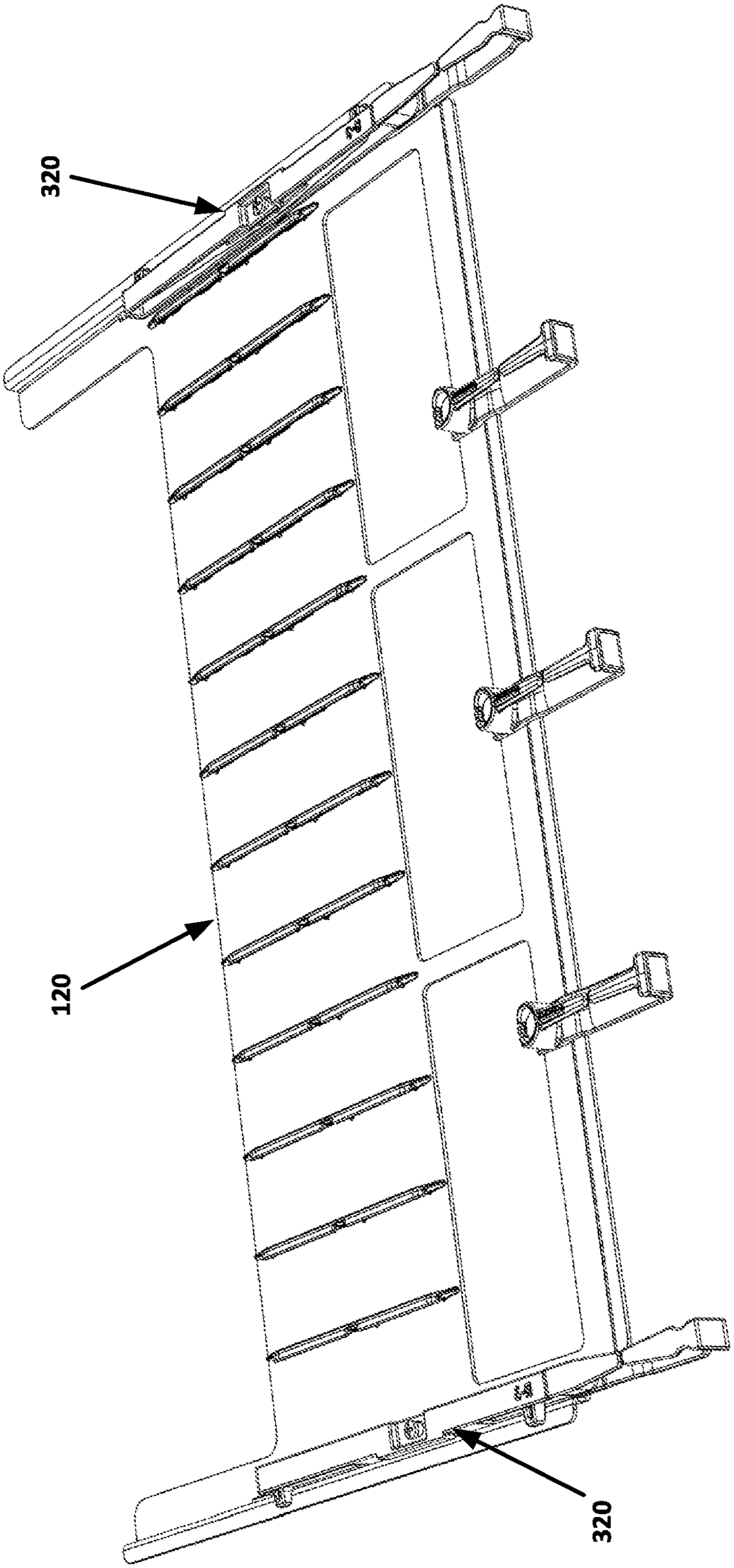
FIG. 44 is a perspective view of a tray arrangement carrying another example implementation of a latching arrangement to releasably secure the tray arrangement at the chassis, the latching arrangement being configured in accordance with the principles of the present disclosure.

As the cable guide 304 is untilted, the cable guide 304 is twisted about an axis extending parallel to the height H of the chassis 102. Twisting the cable guide 304 aligns the second foot 310 with the second aperture 311 to allow the second foot 310 to be inserted into the second aperture 311 as the cable guide 304 is untilted. The first and second apertures 309, 311 are sized to accommodate movement of the feet 308, 310 within the apertures 309, 311 during the twisting motion. In certain examples, the alignment peg 312 and third aperture 313 are rounded to accommodate the twisting motion. As shown in FIG. 43, when the second foot 310 is fully inserted into the aperture 311, the cable guide 304 can be twisted back until the feet 308, 310 abut oppositely-facing sides of the respective apertures 309, 311. The feet 308, 310 hold the cable guide 304 to the tray arrangement 120.

FIGS. 44-52 illustrate another example tray latching arrangement 320 including first and second stop members 322, 324 that are each movable between a latch position and a release position. The latching arrangement 320 is actuated (e.g., one of the stop members 322, 324 is moved from the latch position to the release position) by movement of a cable guide 326 relative to the tray arrangement 120. In certain examples, the cable guide 326 is movable along the forward-rearward axis FR relative to the tray arrangement 120. In some implementations, first and second tray latching arrangements 320 are disposed at opposite sides of the tray arrangement 120. In other implementations, only one side of the tray arrangement 120 has a tray latching arrangement 320.

Each tray arrangement 120 is moved from the retracted position to the extended position by pulling forwardly on the cable guide 326 until the first stop member 322 transitions to the release position and continuing to pull on the cable guide 326 until the tray arrangement 120 slides along the chassis 102 to the extended position. Similarly, the tray arrangement 120 can be moved from the extended position back to the retracted position by pushing rearward on the cable guide 326 until the second stop member 324 transitions to the release position and continuing to push on the cable guide 326 until the tray arrangement 120 slides along the chassis 102 to the retracted position.

In certain examples, each stop member 322, 324 is biased to the latch position. In certain implementations, the first and second stop members 322, 324 align with corresponding apertures 146, 148 defined through the tray of the tray arrangement 120. The stop members 322, 324 extend through the corresponding apertures 146, 148 when biased to the latch positions (e.g., see FIG. 49). Accordingly, each stop member 322, 324 automatically engages a chassis catch surface 137, 366 through the respective aperture 146, 148 when in the retracted position.

Figure 45:
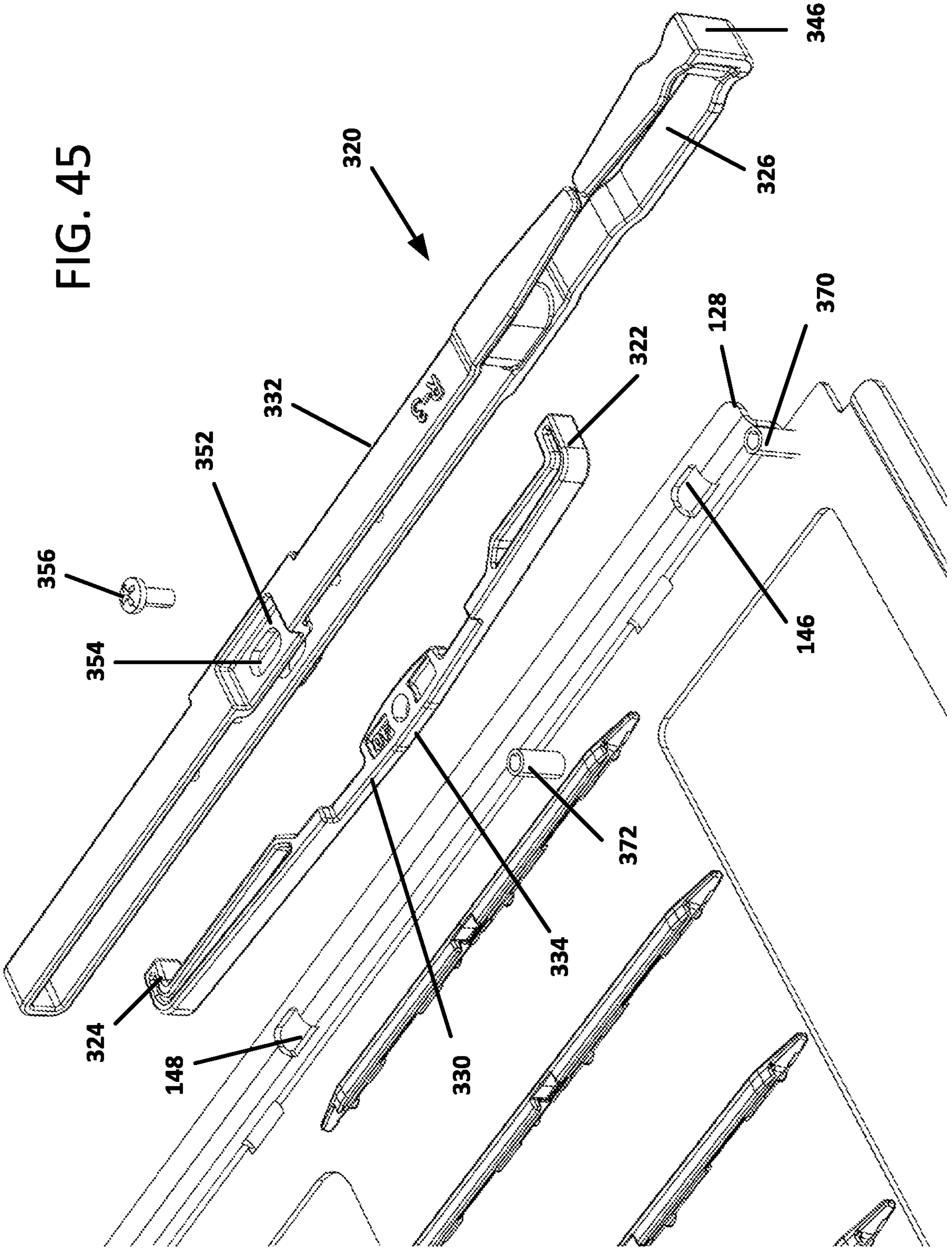
FIG. 45 shows the latching arrangement of FIG. 44 with the components exploded away from each other.

As shown in FIG. 45, each latching arrangement 320 includes a biasing member 330 having a mounting section 334 fixedly coupled to the tray arrangement 120 and an actuation member 332 slidably mounted to the tray arrangement 120. The actuation member 332 is configured to slide relative to the biasing member 330. In certain implementations, the actuation member 332 slides along a length LB of the biasing member 330 between a neutral position, a first actuated position, and a second actuated position. In certain examples, the neutral position is disposed between the first and second actuated positions along the length La of the biasing member 330.

Figure 46:
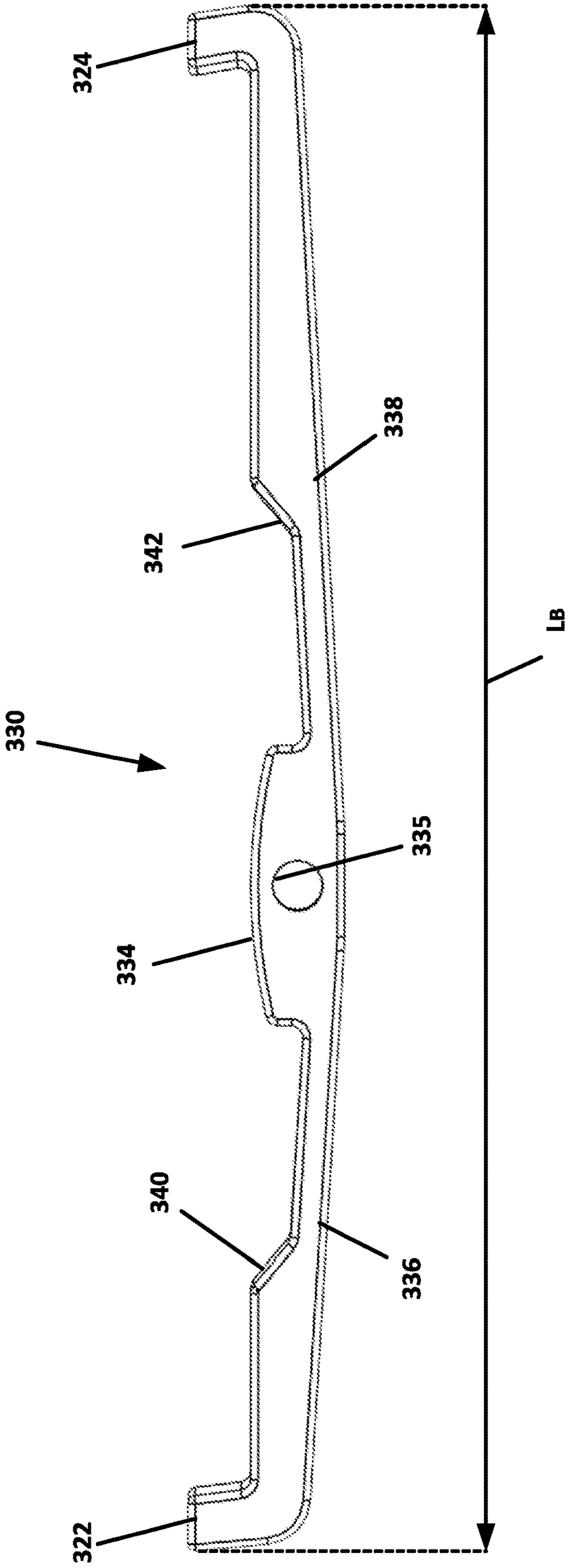
FIG. 46 is a plan view of a biasing member of the latching arrangement of FIG. 45.

As shown in FIG. 46, the biasing member 330 includes a first arm 336 extending outwardly from the mounting section 334 in a first direction and a second arm 338 extending outwardly from the mounting section 334 in a generally opposite second direction. The first and second arms 336, 338 are deflectable relative to the mounting section 334. The first stop member 322 is defined or carried at the free end of the first arm 336 to deflect relative to the mounting section 334 and the second stop member 324 is defined or carried at the free end of the second arm 338 to deflect relative to the mounting section 334. Each of the arms 336, 338 defines a ramped portion 340, 342, respectively.

Figure 47:
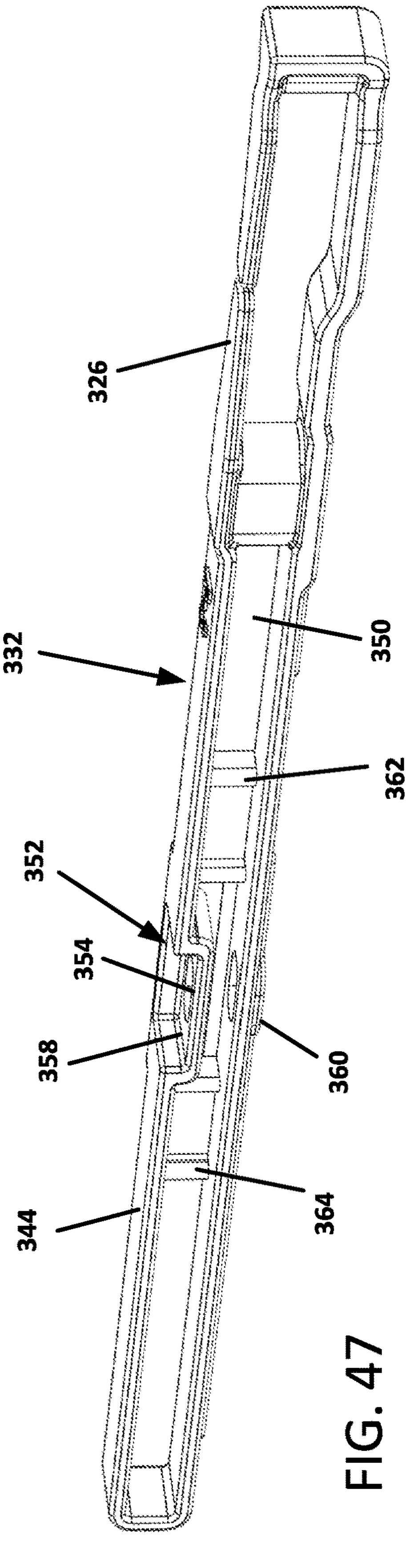
FIGS. 47 and 48 are perspective views of an actuation member of the latching arrangement of FIG. 45.
Figure 48:
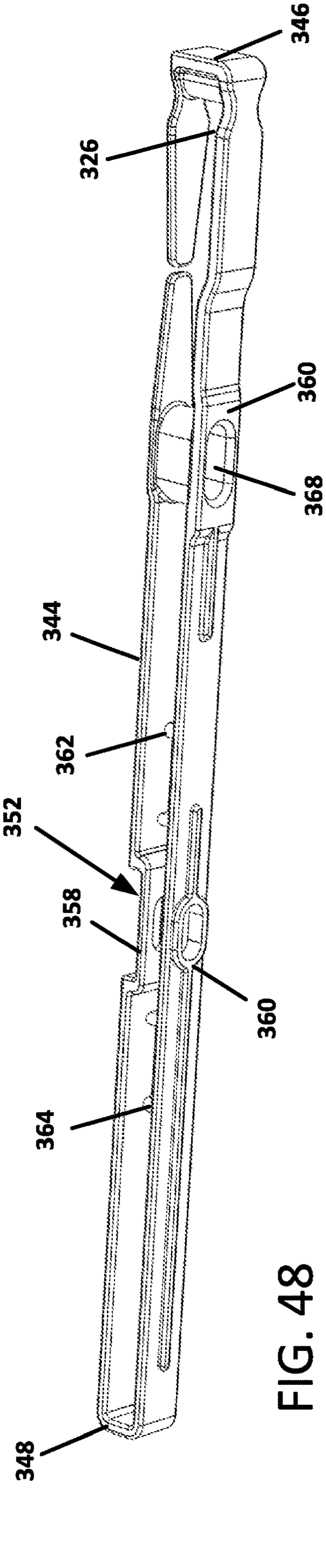
Figure 49:
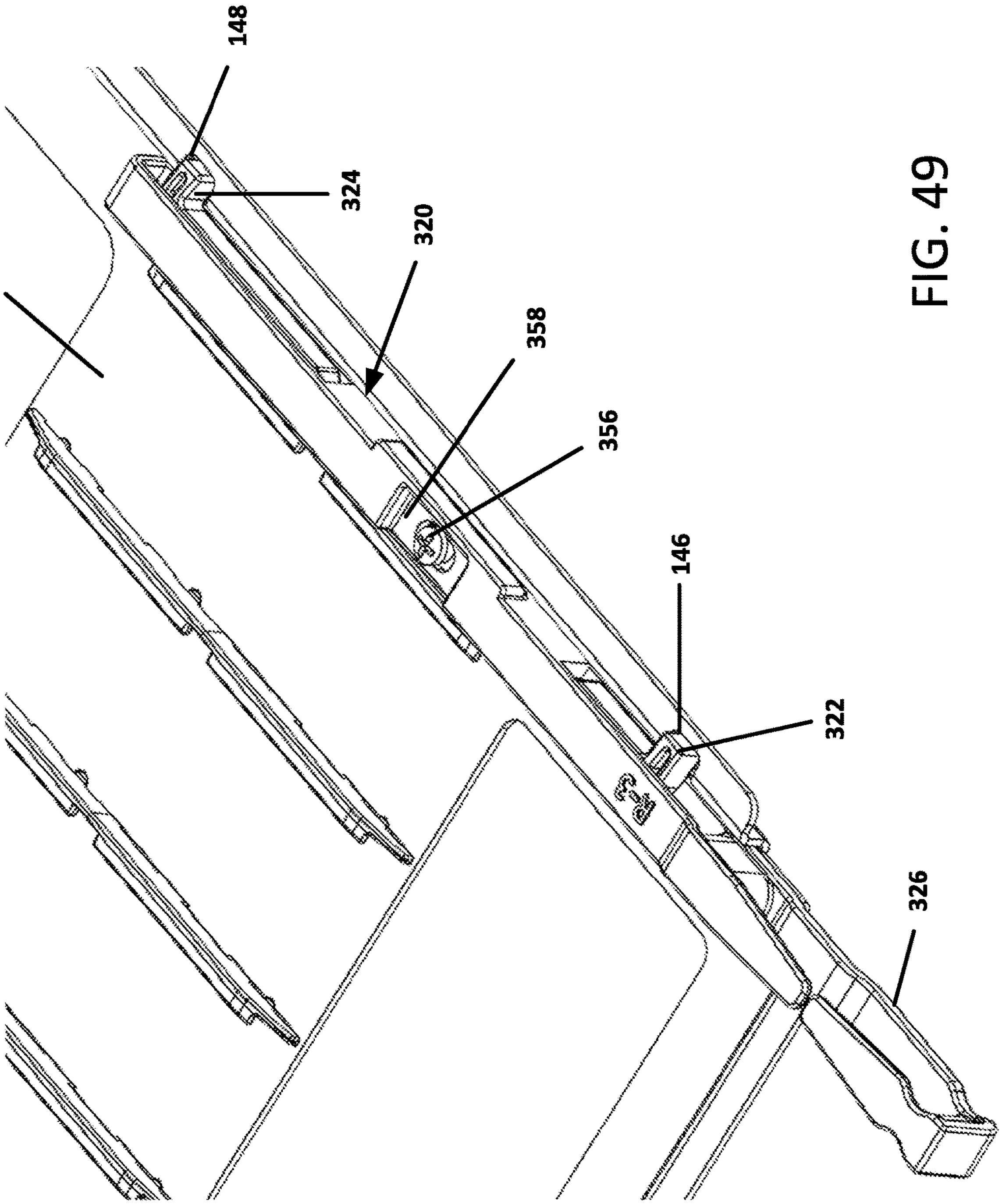
FIG. 49 is an enlarged view of a portion of the tray arrangement and latching arrangement of FIG. 44.

FIGS. 47-48 illustrate an example implementation of the actuation member 332. The actuation member 332 includes a body 344 that is elongate between opposite first and second ends 346, 348. The first end 346 of the actuation member body 344 defines the cable guide 326. In certain implementations, the actuation member body 344 defines an interior 350 in which the biasing member 330 may be disposed (see FIGS. 44 and 49). The actuation member body 344 defines a mounting section 352 that aligns with the mounting section 334 of the biasing member 330. The mounting section 352 defines an opening 354 that aligns with an opening 335 defined at the mounting section 334 of the biasing member 330. Accordingly, a screw or other fastener 356 may be inserted through both openings 354, 335 to attach both the actuation member 332 and the biasing member 330 to the tray arrangement 120.

Figure 50:
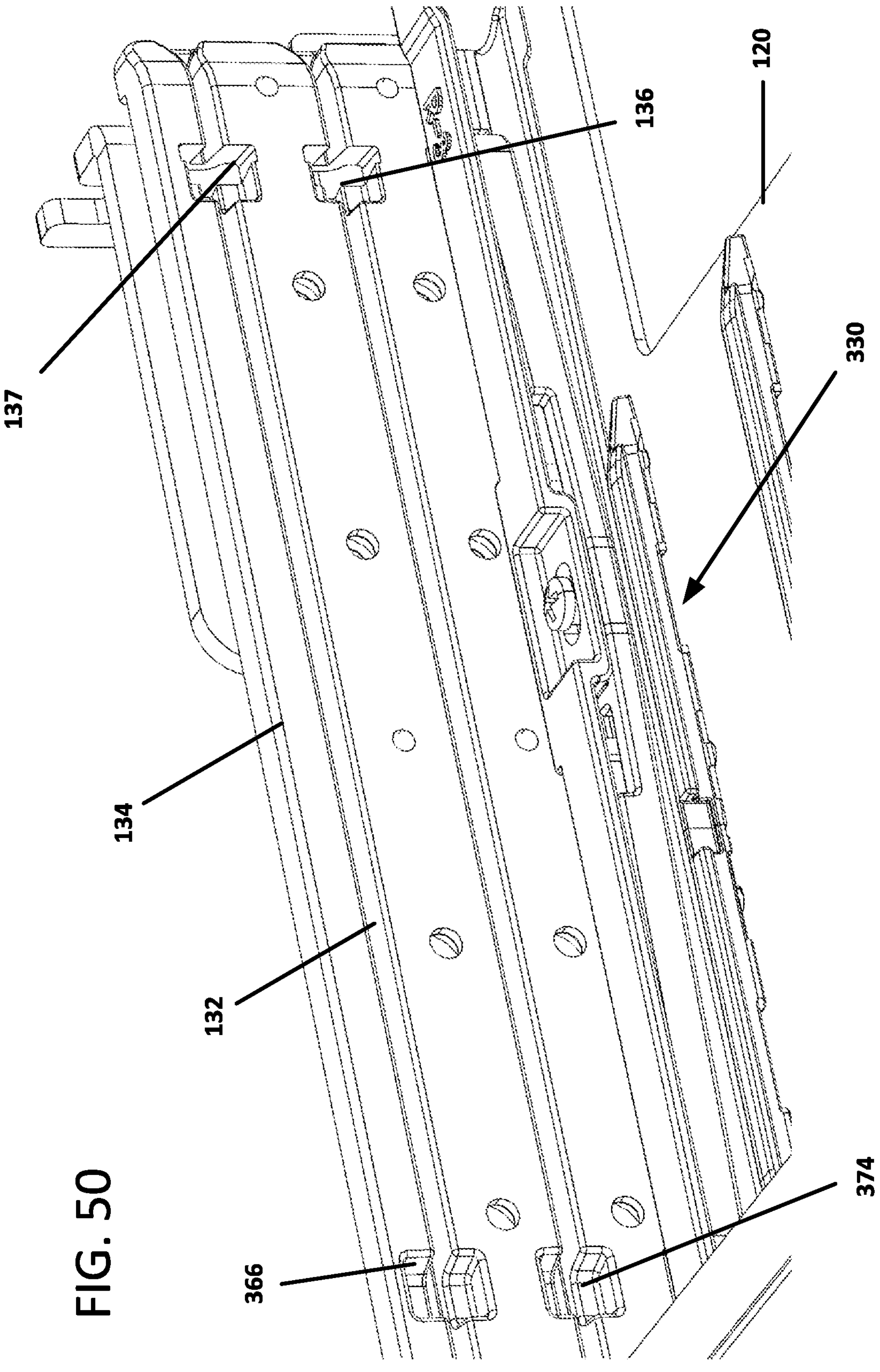
FIG. 50 is a perspective view of a chassis sidewall defining front and rear pockets disposed along guides.

FIG. 50 illustrates an interior sidewall 134 of the chassis 102 defining front and rear pockets 136, 374 disposed along guides 132. The front pocket 136 defines the rearwardly-facing catch surface 137. The rear pocket 374 defines a rearwardly-facing catch surface 366. The rear pocket 374 is about the same size as the front pocket 136. In certain implementations, the catch surface 137 of the front pocket 136 angles forwardly as the catch surface 137 extends outwardly away from the tray arrangement 120 (e.g., see FIG. 51). The angle of the catch surface 137 causes the first stop member 322 to extend further into the pocket 136 as the biasing member 330 is translated forwardly relative to the chassis 102, which further secures the latch. Accordingly, the angle of the catch surface 137 guards against accidental opening of the tray arrangement 120.

The actuation member 332 translates relative to the biasing member 330 along a translation axis T that extends parallel to the forward-rearward axis FR of the tray arrangement 120. The actuation member 332 translates from a neutral position to either a first actuation position that is forward of the neutral position or a second actuation position that is rearward of the neutral position. When the actuation member 332 is disposed in the neutral position, the first and second stop members 322, 324 align with and extend into the apertures 146, 148 and engage catch surface 137, 366 of the chassis 102 (e.g., see FIG. 50). Engagement between the first stop member 322 and the catch surface 137 inhibits forward movement of the tray arrangement 120 relative to the chassis 102.

The actuation member 332 carries a first actuator member 362 and a second actuator member 364 at opposite ends of the mounting section 352. The first and second actuator members 362, 364 align with the ramped portions 340, 342 of each arm 336, 338 of the biasing member 330 so that, when the actuator member 332 is disposed in the neutral position, the actuator members 362, 364 allow the arms 336, 338 to bias the stop members 322, 324 into engagement with the catch surfaces 137, 366 (e.g., see FIG. 50).

When a user wishes to pull out the tray arrangement 120 to the forward position (e.g., see FIG. 52), the user pulls on the cable guide 326 to translate the actuation member 332 along the translation axis T. During translation of the actuation member 332, the elongate opening 354 moves relative to the biasing member 330 until the fastener 356 abuts an edge of the elongate opening 354. The first actuator member 362 engages the ramped portion 340 of the first arm 336 to deflect the first arm 336 inwardly towards the tray arrangement 120 to move the first stop member 322 out of engagement with the first catch surface 137 (e.g., see FIG. 52). Continuing to pull on the cable guide 326 pulls the tray arrangement 120 forwardly relative to the chassis 102. The second stop member 324 cams over a catch surface 366 defined in the rear pocket 374. Accordingly, the second stop member 324 does not interfere with forward movement of the tray arrangement 120 from the retracted position to the extended position.

Figure 51:
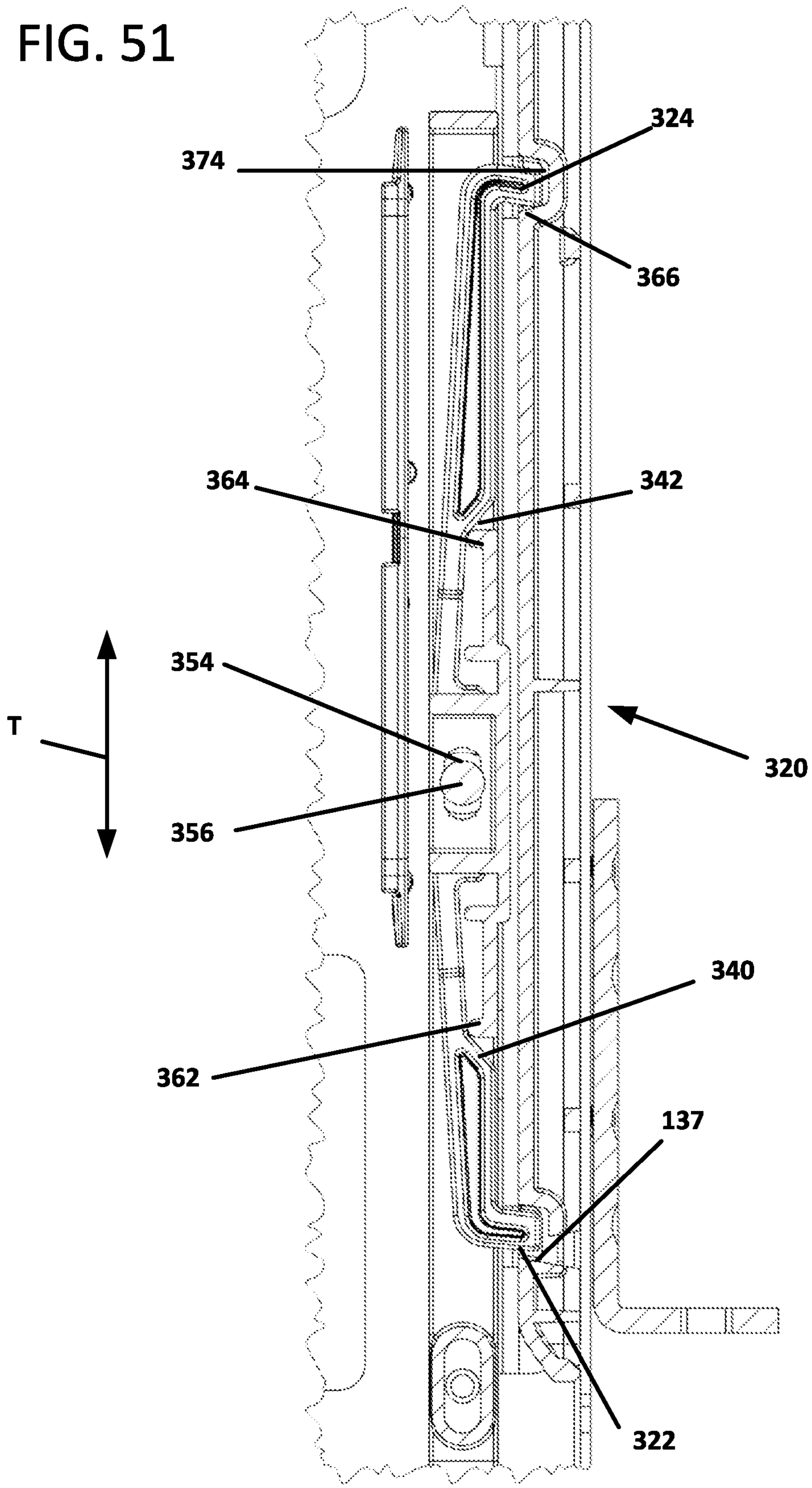
FIG. 51 is a cross-sectional view of the latching arrangement of FIG. 49 showing the actuation member in a neutral position and the tray arrangement in a retracted position.
Figure 52:
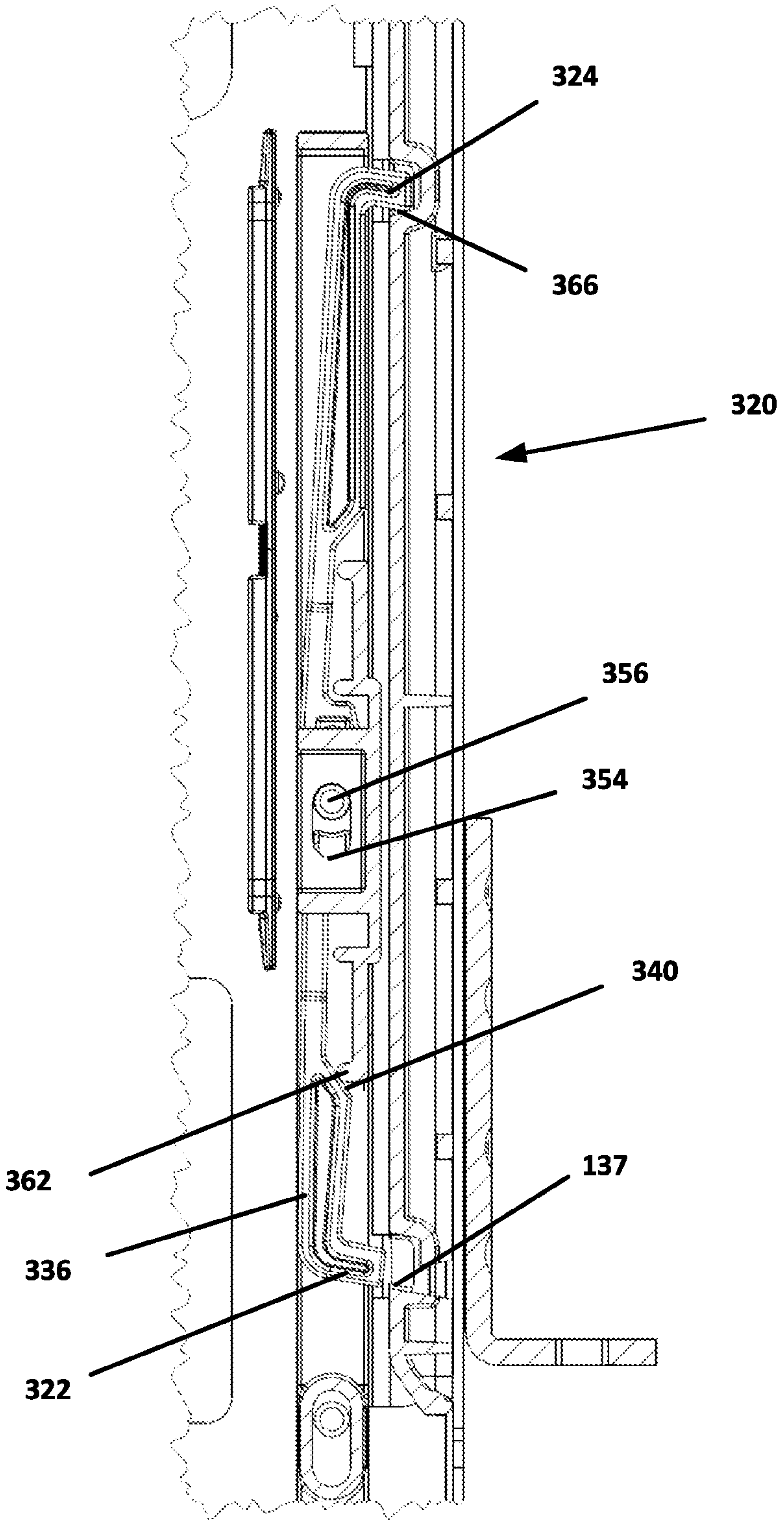
FIG. 52 shows the actuation member of the latching arrangement of FIG. 51 in a first actuation position and a first stop member of the latching arrangement in a deflected position.

In certain implementations, the catch surface 366 extends rearwardly as the catch surface 366 extends outwardly away from the tray arrangement 120 (e.g., see FIG. 51). Engagement between the catch surface 366 and the second stop member 324 inhibits forward translation of the biasing member 330 relative to the chassis 102. Accordingly, when the actuation member 332 is initially translated forwardly to release the tray arrangement 120, the engagement between the second stop member 324 and the catch surface 366 resists translation of the biasing member 330 and thereby allows the first stop member 322 to be deflected out of the forward pocket instead of being pushed against the catch surface 137 and hence further into the forward pocket 136. The catch surface 366 is angled so that continued pulling on actuation member 332 after the first stop member 322 is deflected out of engagement with the catch surface 137 causes the second stop member 324 to cam over the catch surface 366, thereby allowing the tray arrangement 120 to be pulled out of the chassis 102.

Figure 53:
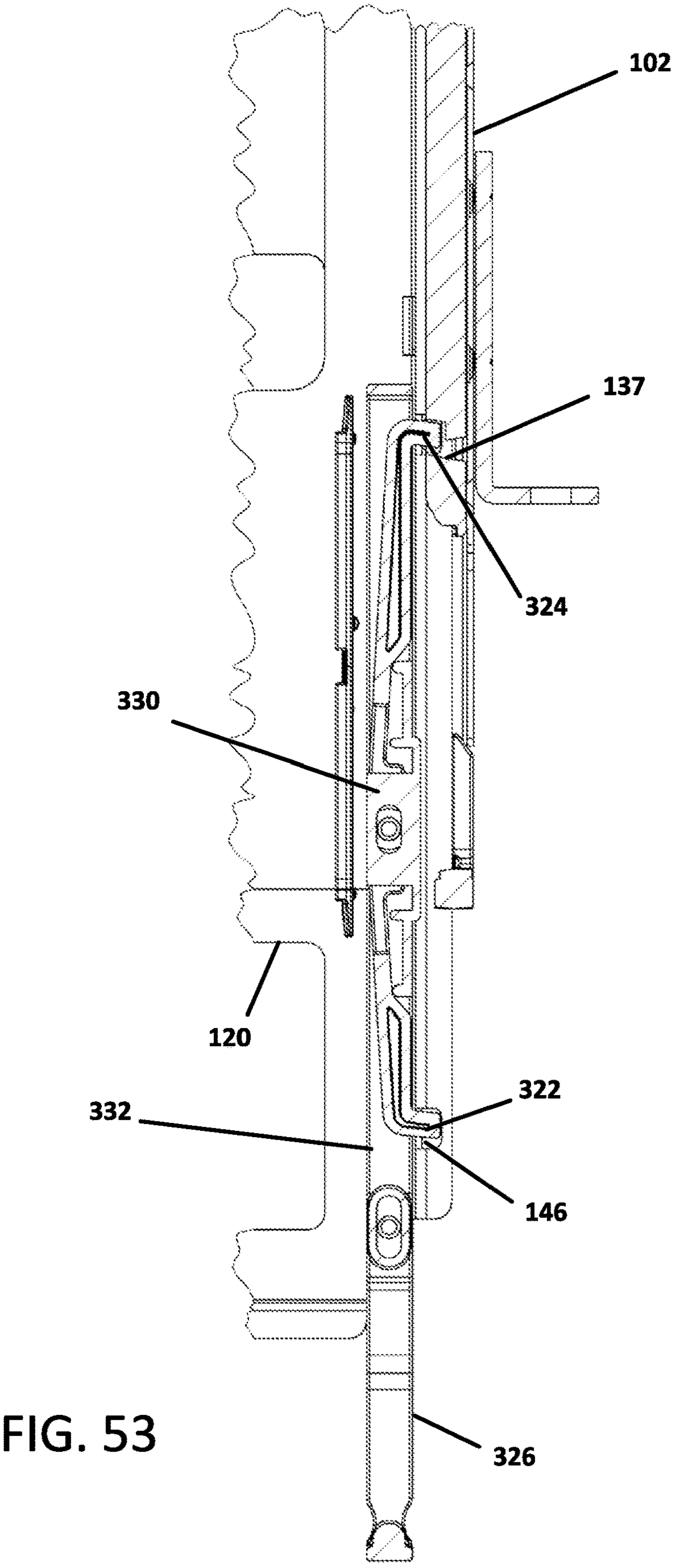
FIG. 53 shows the tray arrangement in a forwardly extended position and the actuation member of the latching arrangement disposed in a neutral position.

FIG. 53 shows the tray arrangement 120 disposed in the forwardly extended position relative to the chassis 102. When the user releases the cable guide 326, the biasing member 330 has sufficient biasing force to push the actuation member 332 back to the neutral position through camming action of the ramped portion 340 of the first arm 336 and the first actuator member 362. The second stop member 324 is biased into engagement with the first catch surface 137 by the second arm 338 of the biasing member 330. Engagement between the second stop member 324 and the first catch surface 137 inhibits rearward movement of the tray arrangement 120 back into the chassis 102.

Figure 54:
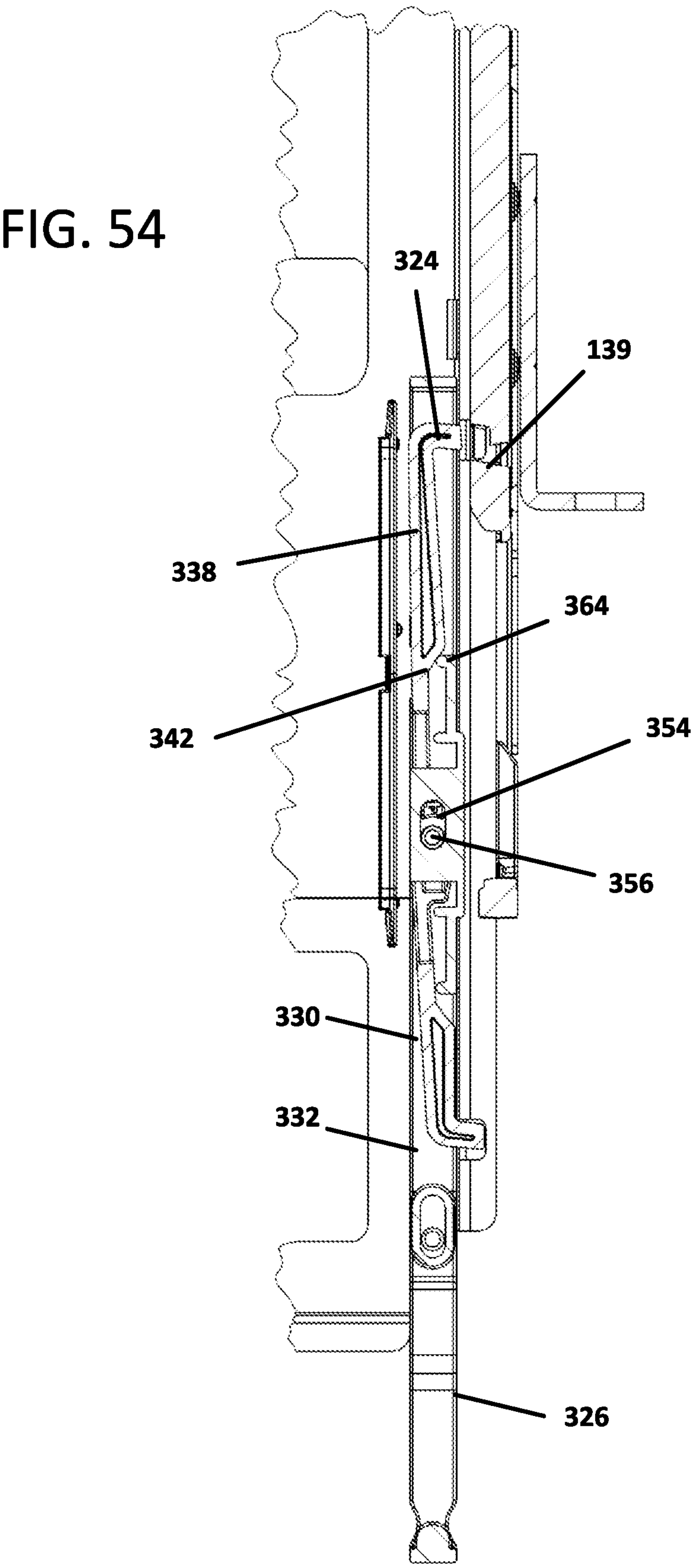
FIG. 54 shows the actuation member of the latching arrangement in a second actuation position and a second stop member of the latching arrangement in a deflected position.
Figure 55:
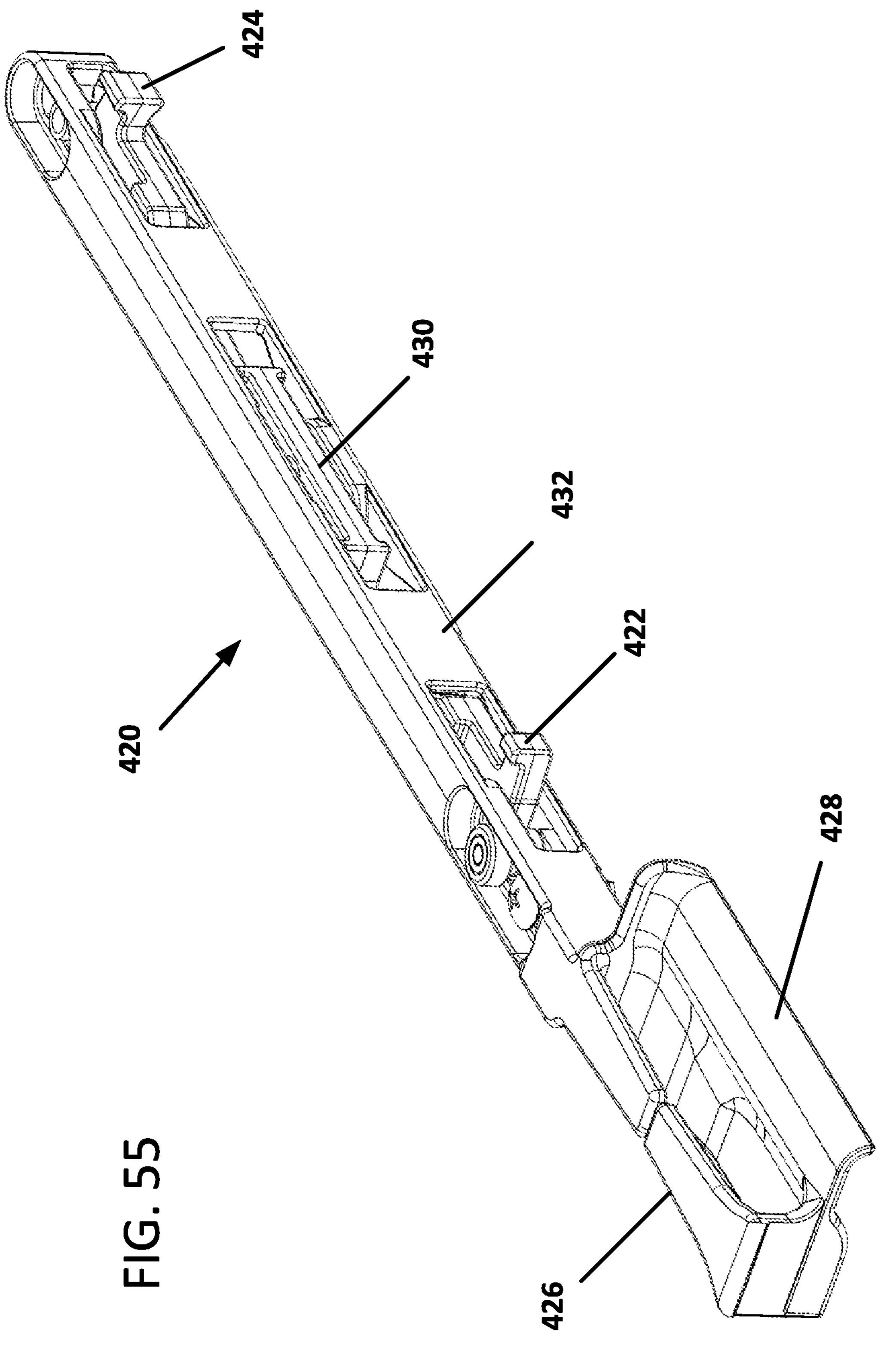
FIG. 55 is a perspective view of another example implementation of a latching arrangement to releasably secure the tray arrangement at the chassis, the latching arrangement being configured in accordance with the principles of the present disclosure.
Figure 56:
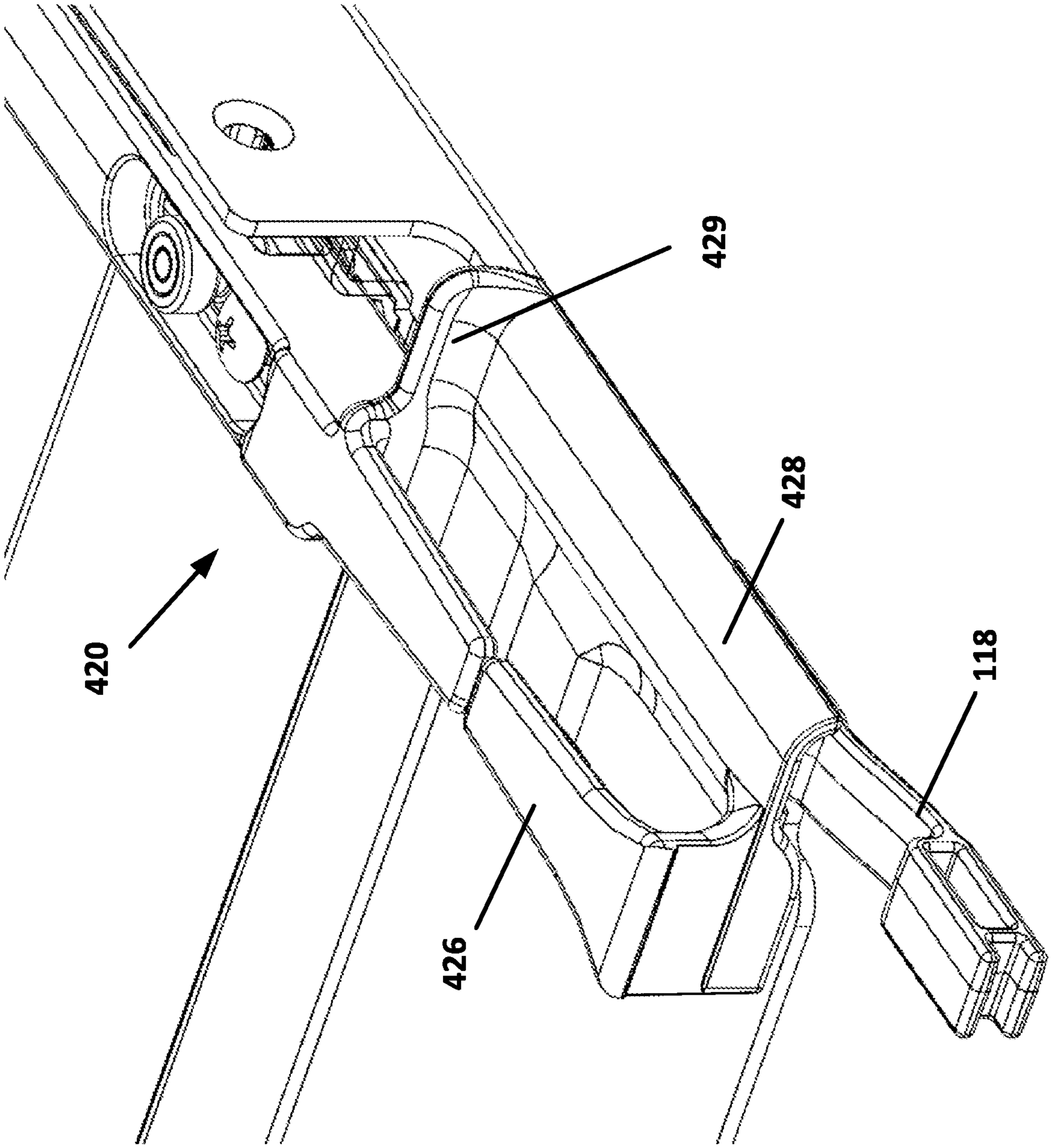
FIG. 56 shows a cable guide of the latching arrangement of FIG. 55 assembled on the tray arrangement, which is disposed within the chassis.
Figure 57:
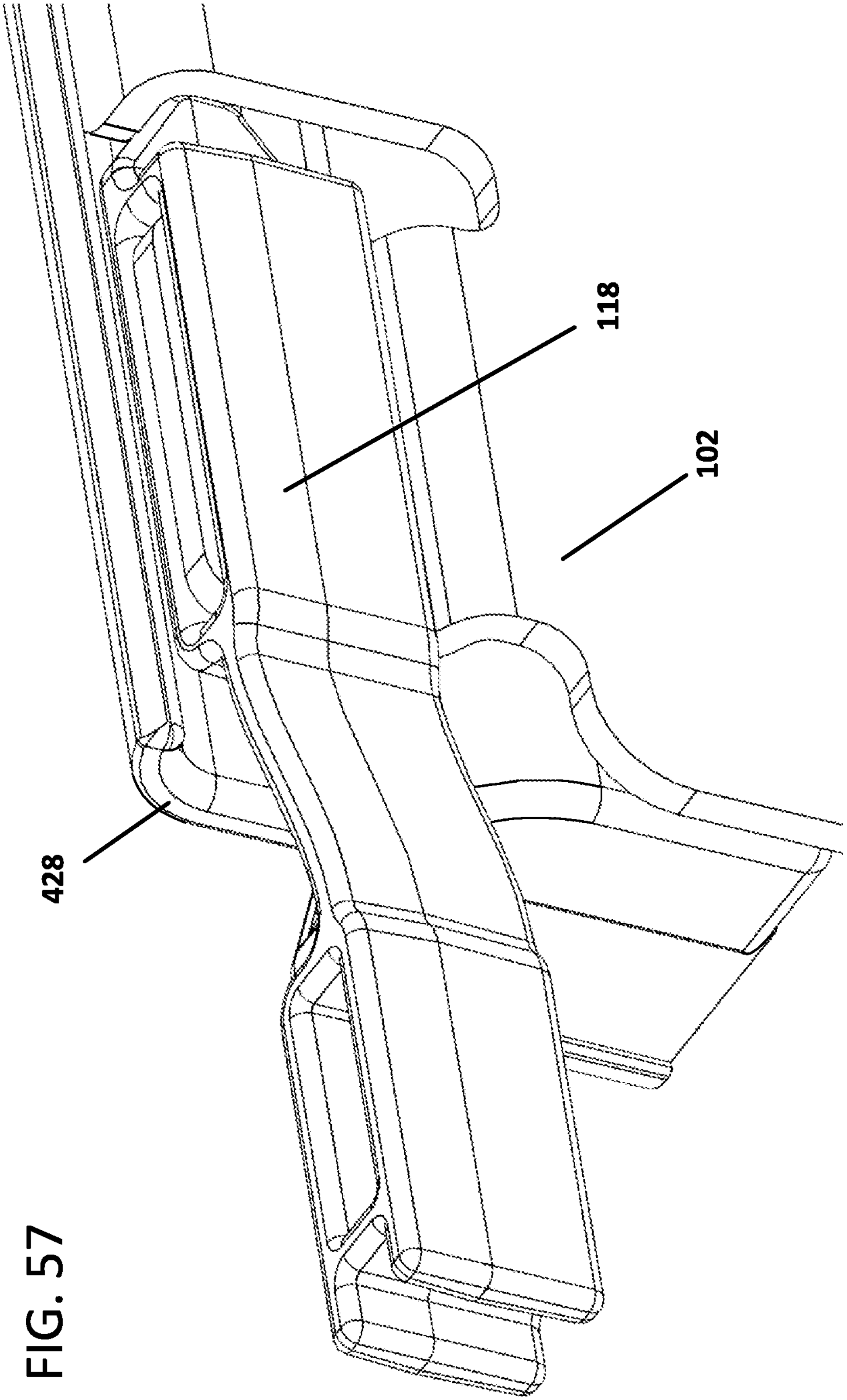
FIG. 57 shows a bottom view of FIG. 56 showing a guide surface of the cable guide curving over part of the chassis door mounting structure.
Figure 58:
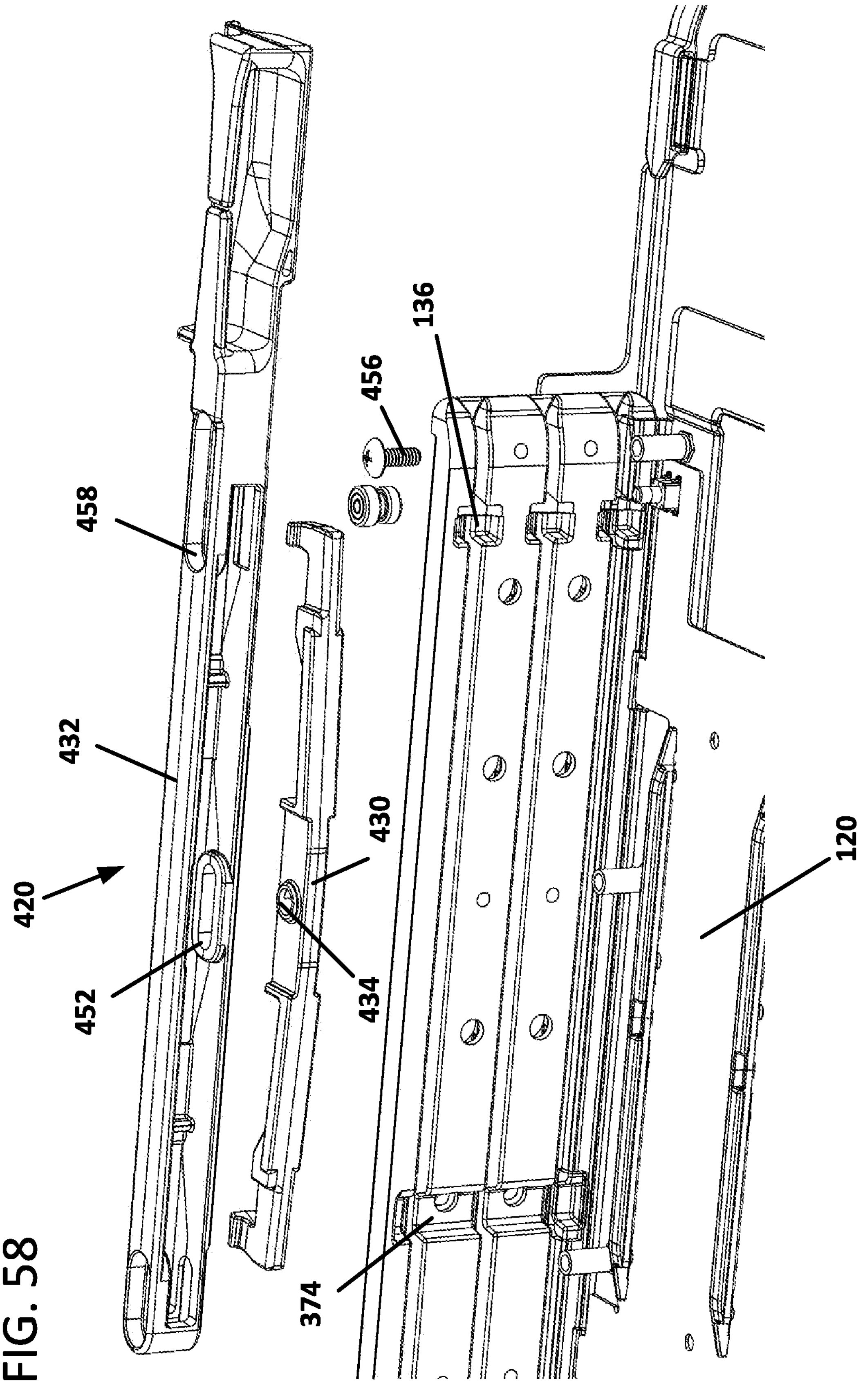
FIG. 58 shows the latching arrangement of FIG. 55 with the components exploded away from each other and away from a chassis and tray arrangement.
Figure 59:
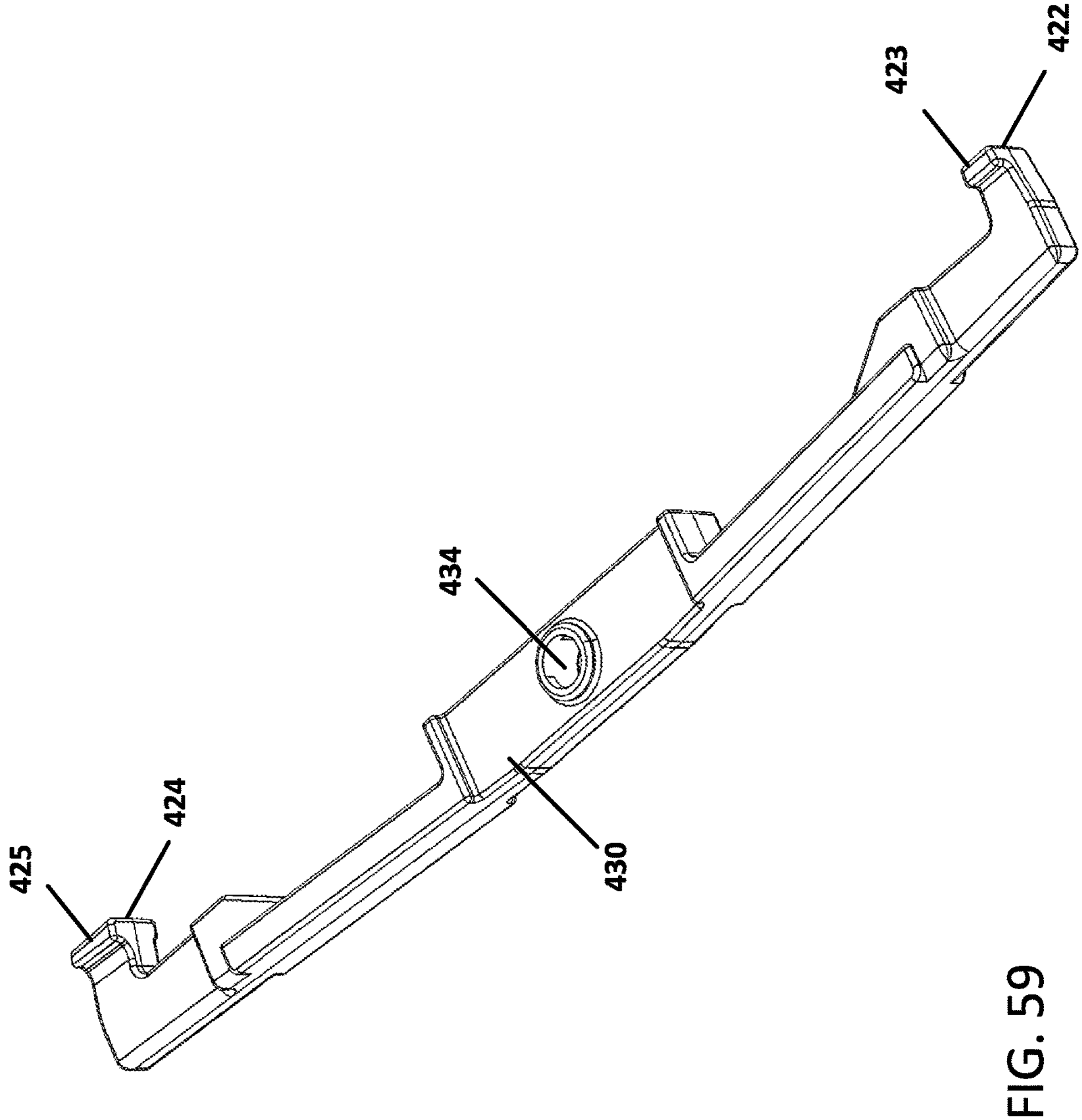
FIG. 59 is a perspective view of an example biasing member of the latching arrangement of FIG. 55.
Figure 60:
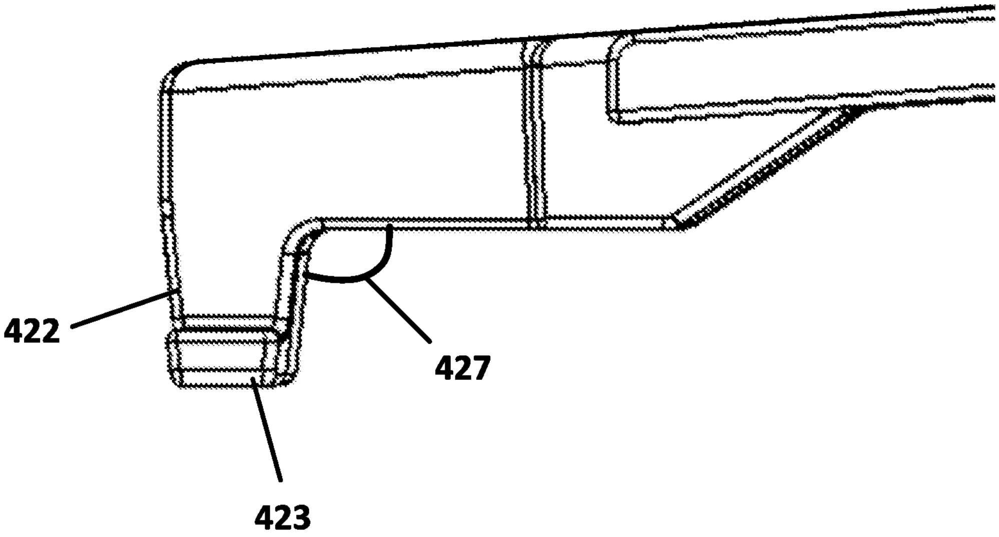
FIG. 60 is an enlarged view of the first stop member of the latching arrangement of FIG. 55.
Figure 61:
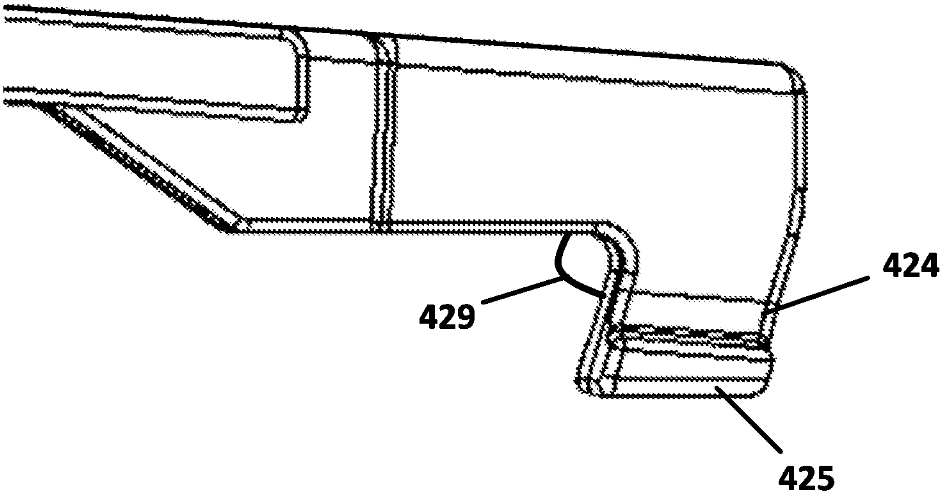
FIG. 61 is an enlarged view of the second stop member of the latching arrangement of FIG. 55.
Figure 62:
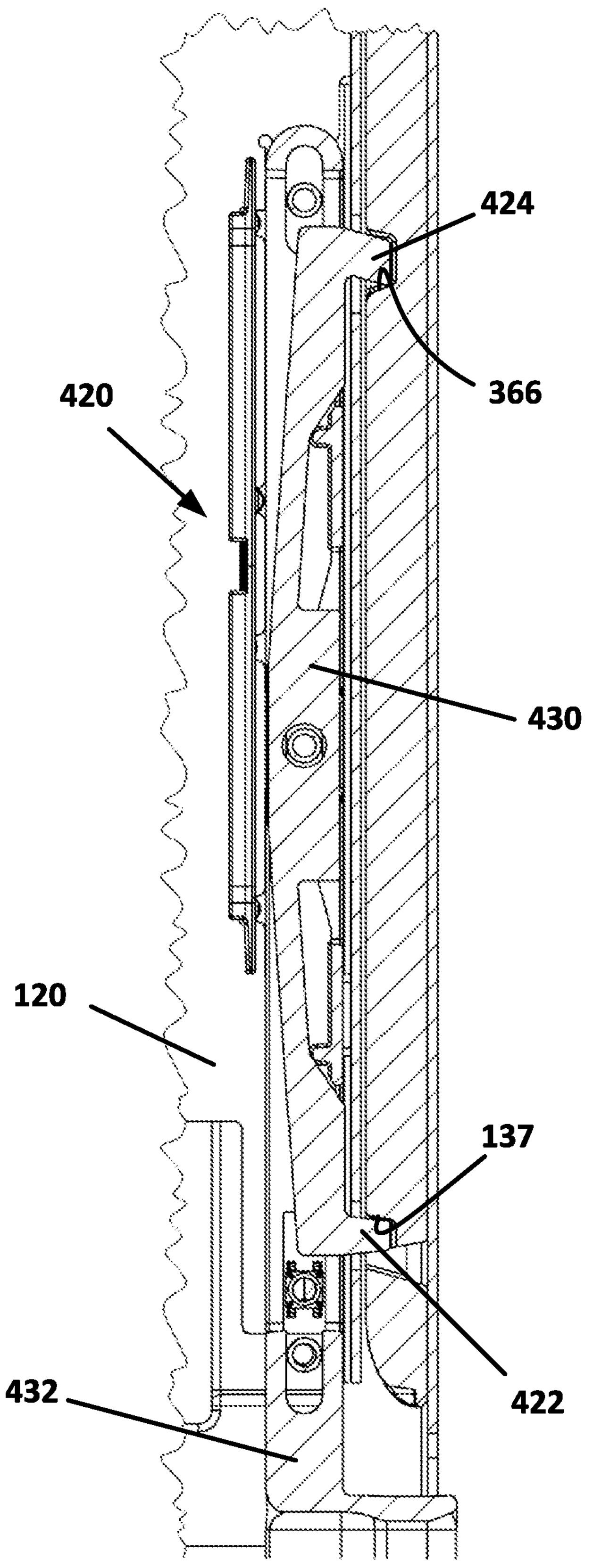
FIG. 62 is a cross-sectional view of the latching arrangement of FIG. 55 with the first and second stop members engaging respective pockets of the chassis while the tray arrangement is disposed in a retracted position relative to the chassis.

To move the tray arrangement 120 back to the retracted position, a user pushes against the cable guide 326 to move the actuation member 332 along the translation axis T from the neutral position to the second actuation position (e.g., see FIG. 54). In the second actuation position, the second actuator member 364 pushes against the ramped portion 342 of the second arm 338 to deflect the second arm 338 inwardly towards the tray arrangement 120 to move the second stop member 324 out of engagement with the first catch surface 137. Continuing to push on the cable guide 326 pushes the tray arrangement 120 rearwardly relative to the chassis 102 until the first stop member 322 snaps into the chassis pocket defining the first catch surface 137.

In certain implementations, the translation of the actuation member 332 is limited by interaction between the actuation member and the fastener 356 holding the actuation member 332 and biasing member 330 to the chassis. For example, in certain examples, the opening 354 is oblong and elongate compared to the opening 335. Accordingly, the actuation member 332 can translate relative to the biasing member 330 as the fastener 356 slides along the elongate opening 354. In certain examples, the opening 354 is defined at a recessed pocket 358 in the actuation member body 344 so that a head of the fastener 356 does not extend past a top of the actuation member 332. Rather, the head of the fastener 356 is accommodated in the pocket 358.

In certain implementations, the actuation member 332 also defines an elongate cavity 368 that receives a pem 370 extending upwardly from the tray arrangement 120. The pem 370 translates within the elongate cavity as the actuation member 332 slides relative to the tray 121. Accordingly, translation of the actuation member 332 is limited by the size of the cavity 368. In certain examples, a second pem 372 extends upwardly from the tray 121 to receive the fastener 356 to secure the fastener 356 to the tray arrangement 120.

In certain examples, the actuation member body 344 includes glide surfaces 360 that protrude downwardly from a bottom of the actuation member body 344 to provide a limited surface area on which the actuation member body 344 slides over the tray arrangement 120. Providing the glide surfaces 360 limits the friction acting against the actuation member body 344 during translation.

FIGS. 55-62 illustrate another example tray latching arrangement 420 including first and second stop members 422, 424 that are each movable between a latch position and a release position. The latching arrangement 420 is substantially the same as the tray latching arrangement 320 described above except where otherwise indicated. The tray latching arrangement 420 includes a biasing member 430 having a mounting section 434 fixedly coupled to the tray arrangement 120 and an actuation member 432 slidably mounted to the tray arrangement 120 along the forward-rearward axis FR. The tray latching arrangement 420 is actuated by movement of a cable guide 426 defined by the actuation member 432 relative to the tray arrangement 120.

The actuation member 432 includes a body that is elongate between opposite first and second ends. The first end of the actuation member body defines the cable guide 426. In certain implementations, the actuation member body defines an interior in which the biasing member 430 may be disposed. The actuation member body defines a mounting section 452 that aligns with the mounting section 434 of the biasing member 430. The mounting section 452 defines a slot that aligns with an opening defined at the mounting section 434 of the biasing member 430. Accordingly, a screw or other fastener may be inserted through both openings to attach both the actuation member 432 and the biasing member 430 to the tray arrangement 120. The slot is sufficiently large to accommodate movement of the actuation member 432 relative to the fastener. In certain examples, the fastener does not extend fully through the actuation member 432 so that an upper surface of the actuation member 432 is unbroken above the mounting section 434 of the biasing member 430. In certain implementations, the actuation member 432 defines a slot 458 through which a fastener 456 extends to mount the actuation member 432 to the tray 120. In certain examples, the slot 458 and fastener 456 are offset (e.g., forwardly offset) from the biasing member 430. In certain examples, the offset slot 458 extends full a through a top surface of the actuation member 432.

In certain implementations, the cable guide 426 includes a contoured guide surface 428 that extends outwardly from the cable guide 426 to guide fibers passing through the cable guide 426 over part 118 of the door attachment structure. In certain examples, the guide surfaces 428 of the cable guides 426 at opposite sides of the tray 120 extend in opposite directions. The guide surfaces 428 inhibit fiber pinching between the tray 120 and the door attachment structure. In certain examples, the guide surface 428 curves downwardly towards a bottom of the chassis 102. In certain examples, a retention wall 429 extends upwardly from a rear of the cable guide surface 428 to inhibit fiber from being pinched between the tray 120 and the chassis 102.

Referring to FIGS. 59-62, each stop member 422, 424 is configured to automatically engage a chassis catch surface 137, 366 (FIG. 50) through the respective tray aperture 146, 148 when in the latch positions. In certain implementations, each stop member 422, 424 includes an enlarged tip 423, 425, respectively. In certain examples, the enlarged tips 423, 425 are enlarged along a height of the chassis 102 compared to a remainder of the stop members 422, 424. In certain examples, the tips 423, 425 extend upwardly along the height relative to the stop members 422, 424 (e.g., see stop member 422 in FIG. 55). In certain examples, the tips 423, 425 extend both upwardly and downwardly along the height relative to the stop members 422, 424 (e.g., see stop member 424 in FIG. 55). Enlarging the tips 423, 425 inhibits the stop members 422, 424 from catching on the guides 132 before reaching a pocket 136, 138 of the chassis 102.

In some examples, the stop members 422, 424 extend outwardly from the biasing member 430 at a common angle. In other examples, the first stop members 422 and second stop members 424 extend outwardly from the biasing member 430 at different angles 427, 429, respectively. In certain examples, the angle 427 of the first stop member 422 is larger than the angle 429 of the second stop member 422. In certain examples, the first stop member 422 extends outwardly at an obtuse angle while the second stop member 422 extends outwardly at an acute angle. In certain examples, the angle 427 of the first stop member is between 80 degrees and 100 degrees while the angle 429 of the second angle is between 60 degrees and 85 degrees. In certain examples, the angle 427 of the first stop member is between 85 degrees and 95 degrees while the angle 429 of the second angle is between 65 degrees and 80 degrees. The more acute angle 429 of the second stop member 424 aids in retaining the second stop member 424 at the catch surface 366 until the latching arrangement 420 is actuated.

Aspects of the Disclosure

1. A panel system comprising:
a chassis extending along a forward-rearward axis; and
a tray configured to slide relative to the chassis along the forward-rearward axis, the tray carrying a cable guide during the sliding, the tray also carrying a latching arrangement that releasably latches the tray to the chassis at a position along the forward-rearward axis, the latching arrangement being actuatable by movement of a cable guide relative to the tray.

2. The panel system of aspect 1, wherein the latching arrangement releasably latches the tray to the chassis in a retracted position and in an extended position.

3. The panel system of aspect 1 of aspect 2, wherein the latching arrangement is actuatable by sliding movement of the cable guide along the forward-rearward axis.

4. The panel system of aspect 3, wherein the latching arrangement includes an actuation member and a deflection arrangement, the actuation member defining the cable guide, the deflection arrangement including a stop member movable between a latch position and a release position in response to movement of the actuation member.

5. The panel system of aspect 4, wherein the actuation member defines first and second camming surfaces and wherein the stop member of the deflection arrangement is disposed between first and second cam followers, the stop member being flexibly coupled to the cam followers and the cam followers being flexibly coupled to the tray.

6. The panel system of aspect 5, wherein the stop member is flexibly coupled to the cam followers by flexural pivots.

7. The panel system of aspect 3, wherein the latching arrangement includes a biasing member and an actuation member, the biasing member including a first deflectable arm carrying a first stop member and a second deflectable arm carrying a second stop member, the actuation member being slidable relative to the biasing member.

8. The panel system of aspect 1 or aspect 2, wherein the latching arrangement is actuatable by pivotal movement of the cable guide.

9. The panel system of aspect 8, wherein the latch arrangement includes a first deflection member and a second deflection member, the first deflection member defining the cable guide, and the second deflection member defining a stop member.

10. The panel system of aspect 9, wherein the first deflection member defines a second stop member.

11. The panel system of aspect 9, wherein the second deflection member defines a second stop member.

12. The panel system of any of aspects 1-11, wherein the cable guide is a first of a plurality of cable guides.

13. The panel system of aspect 12, wherein a second of the cable guides is magnetically coupled to the tray separate from the first cable guide, the second cable guide spaced along a lateral axis from the first cable guide, the lateral axis being transverse to the forward-rearward axis.

14. The panel system of aspect 12, wherein a second of the cable guides is releasably latched to the tray separate from the first cable guide, the second cable guide spaced along a lateral axis from the first cable guide, the lateral axis being transverse to the forward-rearward axis.

15. The panel system of any of aspects 9-11, wherein the second deflection member defines a resilient section that biases the cable guide to a neutral position.

16. The panel system of any of aspects 9-11, wherein the first deflection member defines a resilient section that biases the second deflection member to a latch position.

17. The panel system of any of aspects 9-11, wherein the latching arrangement is actuatable by pivoting the cable guide towards a first direction; and wherein the stop member is movable from a latch position to a release position by pushing a portion of the second deflection member towards a second direction that is opposite the first direction.

18. The panel system of aspect 17, wherein the portion of the second deflection member is a resilient portion.

19. The panel system of aspect 17, wherein the portion of the second deflection member is a rigid end of the second deflection member.

20. The panel system of any of aspects 1-19, wherein the chassis defines an interior extending between opposite first and second inner surfaces, the chassis interior also extends along the forward-rearward axis between a front of the chassis and a rear of the chassis, the first inner surface defining:

- a first channel extending parallel to the forward-rearward axis;
- a front catch surface recessed into the first inner surface, the front catch surface extending from the first channel along a vertical axis transverse to the forward-rearward axis; and
- a rear catch surface recessed into the first inner surface, the rear catch surface extending from the first channel along the vertical axis, the rear catch surface facing in an opposite direction than the front catch surface.

21. The panel system of aspect 20, wherein the tray includes a first rail configured to slide along the first channel, and wherein the latching arrangement includes a stop member configured to releasably engage the front catch surface.

22. The panel system of aspect 21, wherein a second channel is defined at the second inner surface of the chassis, the second channel opposing the first channel, wherein a second rail of the tray is configured to slide along the second channel.

23. The panel system of aspect 22, wherein the first channel is one of a plurality of first channels and the second channel is one of a plurality of second channels, each of the second channels opposing one of the first channels.

24. The panel system of aspect 23, wherein the tray is one of a plurality of trays, wherein each tray is configured to slide along a respective pair of the first and second channels.

25. The panel system of any of aspects 21-24, wherein the tray defines a hole aligned with the stop member so that the stop member extends through the hole when disposed in the latching position.

26. The panel system of any of aspects 20-25, wherein the inner surfaces of the chassis are defined by guide members mounted to sidewalls of the chassis so that the first channel is defined by one of the guide members.

27. The panel system of any of aspects 20-26, further comprising a plurality of cable guides removably mounted to the tray separate from the latching arrangement.

28. The panel system of aspect 27, wherein the cable guides are magnetically mounted to the tray.

29. The panel system of aspect 27, wherein the cable guides define a slot of variable width.

30. A tray arrangement comprising:

- a tray extending along a forward-rearward axis between a front and a rear and along a lateral axis between opposite first and second sides; and
- a latching arrangement carried by the tray at the first side of the tray, the latching arrangement including:
  - a biasing member having a mounting section that is fixedly coupled to the tray, the biasing member includes a first arm extending outwardly from the mounting section in a first direction and a second arm extending outwardly from the mounting section in a generally opposite second direction, the first arm being deflectable to carry a first stop member between latched and unlatched positions, the second arm being deflectable to carry a second stop member between latched and unlatched positions, the first arm defining a first ramped portion and the second arm defining a second ramped portion; and
  - an actuation member having a mounting section that aligns with the mounting section of the biasing member, the actuation member being slidably mounted to the tray to slide relative to the biasing member between a neutral position, a first actuated position, and a second actuated position, the actuation member carrying a first actuator and a second actuator at opposite ends of the mounting section, the first and second actuators being aligned with the first and second ramped portions so that:

the first and second actuators are spaced from the first and second ramped portions when the actuation member is disposed in the neutral position, the first actuator camming over the first ramped portion to deflect the first stop member to the unlatched position when the actuation member is moved from the neutral position to the first actuated position, and the second actuator camming over the second ramped portion to deflect the second stop member to the unlatched position when the actuation member is moved from the neutral position to the second actuated position.

31. The tray arrangement of aspect 30, wherein the neutral position is disposed between the first and second actuated positions along a length of the biasing member.

32. The tray arrangement of aspect 30, wherein the first stop member is angled obliquely relative to the first arm and the second stop member is angled acutely relative to the second arm.

33. The tray arrangement of aspect 30, wherein the actuation member defines an interior between upper and lower sections, and wherein the biasing member is disposed within the interior.

34. The tray arrangement of aspect 30, wherein the actuation member defines a cable guide that slides with the actuation member.

35. The tray arrangement of aspect 34, wherein the cable guide includes a contoured guide surface that extends outwardly from the cable guide.

36. A cable guide arrangement comprising:

a body defining a through-passage, the body including a bend radius limiting surface facing an interior of the through-passage at a first end of the body; and a release member extending outwardly from the first end of the body, the release member being movable relative to the body, the release member cooperating with the body to define a slot that extends parallel with the through-passage.

37. The cable guide of aspect 36, wherein deflection of the release member relative to the body changes a size of the slot.

38. The cable guide of aspect 36 or aspect 37, wherein the release member curves away from the body.

39. The cable guide of aspect 36 or aspect 37, wherein the release member is coupled to the body by a flexible web.

40. The cable guide of aspect 36 or aspect 37, wherein the release member has an accordion shape.

41. A cable guide arrangement comprising:

a base defining a bend radius limiter facing in a first direction, the base defining an interior cavity accessible from a bottom of the base along an insertion axis;

a guide member extending outwardly from the base in the first direction that is transverse to the insertion axis, the guide member defining a through-passage extending transverse to the first direction and transverse to the insertion axis, the through-passage being elongate along the first direction; and a magnet disposed within the cavity, the magnet configured to magnetically hold the base to a surface.

42. The cable guide of aspect 41, wherein the magnet is adhesively held in the cavity.

43. The cable guide of aspect 41, wherein the magnet is frictionally held within the cavity.

44. The cable guide of any of aspects 41-43, wherein the base is a first base and the magnet is a first magnet; and wherein the cable guide arrangement further comprises:

a second base defining an interior cavity accessible from a bottom of the second base; and a second magnet disposed within the cavity of the second base;

wherein the guide member extends between the first and second bases.

45. The cable guide of any of aspects 41-44, wherein the guide member defines a slot through which one or more cables can pass to load the cables into the through-passage of the guide member.

46. The cable guide of any of aspects 41-45, wherein the base defines one or more alignment pins extending parallel with the insertion axis.

47. The cable guide of any of aspects 41-46, wherein the cable guide is mounted to a tray so that the cable guide overhangs a front of the tray.

48. The cable guide of aspect 47, wherein the cable guide extends into a finger access opening defined by the tray.

49. A panel system comprising:

a chassis extending along a forward-rearward axis;

a tray configured to slide relative to the chassis along the forward-rearward axis, the tray carrying a latching arrangement that releasably latches the tray to the chassis at a position along the forward-rearward axis;

a plurality of cable guides magnetically mounted to the tray;

each cable guide including:

a base defining a bend radius limiter facing in a first direction, the base defining a vertical axis;

a guide member extending outwardly from the base in the first direction that is transverse to the vertical axis, the guide member defining a through-passage extending transverse to the first direction and transverse to the vertical axis, the through-passage being elongate along the first direction, wherein the guide member defines a slot through which one or more cables can pass to load the cables into the through-passage of the guide member; and a magnet disposed within the base;

wherein at least one of the plurality of the cable guides is mounted to the tray so that the cable guide overhangs a front of the tray, the magnet configured to magnetically hold the base to the tray.

50. The panel system of aspect 49, wherein at least one of the plurality of cables guides includes:

a second base defining a bend radius limiter facing in a first direction, the second base defining a vertical axis;

a second magnet disposed within the second base;

wherein the guide member extends between the first and second bases.

51. The panel system of aspects 49 and 50, wherein the base of at least one of the plurality of cable guides defines one or more alignment pins extending parallel with the vertical axis.

52. The panel system of aspect 49, wherein the at least one of the plurality of cable guides extends into a finger access opening defined by the tray.

53. The panel system of aspect 49, wherein the at least one of the plurality of cable guides has a contoured surface forming a surface under the base including a bottom recess extending along the forward-rearward axis between a forward-facing wall and a rearward-facing wall.

54. A tray arrangement comprising:
- a tray extending between a first rail and a second rail;
- a first deflection member mounted to the tray at the first rail, the first deflection member extending between opposite first and second ends of the first deflection member, the first deflection member being rotatably coupled to the tray at a pivot point disposed intermediate the first and second ends of the first deflection member; and
- a second deflection member mounted to the tray at the first rail, the second deflection member extending between opposite first and second ends of the second deflection member, the second deflection member being rotatably coupled to the tray at a pivot point disposed intermediate the first and second ends of the second deflection member, the first end defining a stop member, the pivot point of the second deflection member being coaxial with the pivot point of the first deflection member.

55. The tray arrangement of aspect 54, wherein the stop member is a first stop member; and wherein the tray arrangement further comprises a second stop member that is movable independent of the first stop member.

56. The tray arrangement of aspect 55, wherein the second stop member is disposed on the first deflection member.

57. The tray arrangement of aspect 55, wherein the second stop member is disposed on the second deflection member.

58. The tray arrangement of any of aspects 54-57, wherein one of the first deflection member and the second deflection member includes a resilient leg that extends from the respective pivot point to the respective second end.

59. The tray arrangement of aspect 54, wherein the resilient leg is defined by the second deflection member and biases the first deflection member to a neutral position.

60. The tray arrangement of aspect 54, wherein the resilient leg is defined by the first deflection member and biases the second deflection member to a neutral position.

61. The tray arrangement of any of aspects 54-60, further comprising a plurality of cable guides magnetically mounted to the tray.

62. A tray arrangement comprising:
- a tray extending laterally between a first rail and a second rail and extending along a forward-rearward axis between a front and a rear;
- a bistable mechanism mounted to the tray at the first rail, the bistable mechanism including first and second mounting members spaced from each other along the forward-rearward axis of the tray, the bistable mechanism also including a stop member that is laterally movable relative to the first and second mounting members, the stop member being coupled to the first and second mounting members via a plurality of legs, each leg being flexibly coupled to the stop member and flexibly coupled to one of the first and second mounting members, the bistable mechanism also including a first cam follower attached to one of the legs and a second cam follower attached to another of the legs; and
- an actuator member coupled to the bistable mechanism, the actuator member being movable relative to the tray along the forward-rearward axis between a neutral position and an actuated position, the actuator member defining a first camming surface and a second camming surface,
- wherein the first cam follower of the bistable mechanism is configured to ride along the first camming surface and the second cam follower of the bistable mechanism is configured to ride along the second camming surface.

63. The tray arrangement of aspect 62, wherein the actuator member defines a cable guide.

64. The tray arrangement of aspect 62 or aspect 63, further comprising a plurality of cable guides magnetically mounted to the tray.

65. A panel system comprising:
- a chassis extending along a forward-rearward axis;
- a tray configured to slide relative to the chassis along the forward-rearward axis, the tray carrying a latching arrangement that releasably latches the tray to the chassis at a position along the forward-rearward axis;
- a cable guide magnetically mounted to the tray;
- the cable guide including:
- a first base defining a bend radius limiter facing in a first direction, the first base defining a vertical axis;
- a guide member extending outwardly from the first base in the first direction that is transverse to the vertical axis, the guide member defining a through-passage extending transverse to the first direction and transverse to the vertical axis, the through-passage being elongate along the first direction, wherein the guide member defines a slot through which one or more cables can pass to load the cables into the through-passage of the guide member; and
- a first magnet disposed within the first base;
- a second base defining a bend radius limiter facing in a first direction, the second base defining a vertical axis;
- a second magnet disposed within the second base;
- wherein the guide member extends between the first and second bases;
- wherein the cable guide is mounted to the tray so that the cable guide extends in a transverse direction to the forward rear axis.

66. The panel system of aspect 65, wherein the first base and the second base define one or more alignment pins extending parallel with the vertical axis.

67. A tray arrangement comprising:
- a tray extending along a width between opposite first and second rails;
- a latching arrangement mounted to the tray at the first rail, the latching arrangement including:
  - a cable guide extending forwardly from the tray, the cable guide being pivotal relative to the tray between a neutral position and an actuated position;
  - a front stop member configured to be carried with the cable guide as the cable guide is pivoted to the actuated position.

68. The tray arrangement of aspect 67, wherein the latching arrangement also includes a rear stop member that is movable between a latch position and a release position, wherein the rear stop member is configured to be actuated separate from the front stop member.

69. The tray arrangement of aspect 68, wherein the rear stop member is defined by a separate part than the front stop member.

70. The tray arrangement of aspect 68, wherein the front and rear stop members are defined by a common part.

71. The tray arrangement of any of aspects 68-70, wherein the rear stop member is pivotal between the latch and release positions.

72. The tray arrangement of aspect 71, wherein the rear stop member is configured to pivot about a common pivot axis with the cable guide.

73. The tray arrangement of aspect 68, wherein the rear stop member is defined by a deflection member, the deflection member defining a pivot location at which the deflection member mounts to the tray, the deflection member including a beam extending outwardly from the pivot location to the rear stop member, and the deflection member including an actuation leg extending outwardly from the pivot location opposite from the beam.

74. The tray arrangement of aspect 73, wherein the actuation leg is resilient and configured to be deformed to pivot the rear stop member.

75. The tray arrangement of aspect 73, wherein the actuation leg is rigid and configured to be deflected to pivot the rear stop member.

76. The tray arrangement of aspect 68, wherein the forward and rearward stop members are carried by a biasing member, and wherein the rear stop member extends from the biasing member at a more acute angle than the forward stop member.

77. The tray arrangement of any of aspects 67-76, wherein the front stop member is integrally formed with the cable guide.

78. The tray arrangement of any of aspects 67-76, wherein the front stop member is defined by a part that is separate from the cable guide.

79. The tray arrangement of any of aspects 67-78, wherein the cable guide includes a guide surface that curves outwardly and downwardly away from an passage of the cable guide.

80. The tray arrangement of any of aspects 67-79, wherein the front stop member has an enlarged tip.

81. The tray arrangement of any of aspects 67-77, further comprising a second cable guide mounted to the tray at a location offset along the width of the tray from the cable guide.

82. The tray arrangement of aspect 81, wherein the second cable guide is one of a plurality of second cable guides magnetically mounted to the tray is a row.

83. The tray arrangement of aspect 81, wherein the second cable guide is one of a plurality of second cable guides snap-fit to the tray is a row.

Having described the preferred aspects and implementations of the present disclosure, modifications and equivalents of the disclosed concepts may readily occur to one skilled in the art. However, it is intended that such modifications and equivalents be included within the scope of the claims which are appended hereto.

What is claimed is:

1. A panel system comprising:
a chassis extending along a forward-rearward axis; and
a tray configured to slide relative to the chassis along the forward-rearward axis, the tray carrying a latching arrangement that releasably latches the tray to the chassis at a position along the forward-rearward axis, the latching arrangement being actuatable by movement of a cable guide carried by the tray.

2. The panel system of claim 1, wherein the latching arrangement releasably latches the tray in a retracted position and in an extended position.

3. The panel system of claim 1, wherein the latching arrangement is actuatable by pivotal movement of the cable guide.

4. The panel system of claim 3, wherein the latching arrangement includes a first deflection member and a second deflection member, the first deflection member defining the cable guide, and the second deflection member defining a stop member.

5. The panel system of claim 1, wherein the latching arrangement is actuatable by sliding movement of the cable guide along the forward-rearward axis.

6. The panel system of claim 5, wherein the latching arrangement includes an actuation member and a deflection arrangement, the actuation member defining the cable guide, the deflection arrangement including a stop member movable between a latch position and a release position in response to movement of the actuation member.

7. The panel system of claim 6, wherein the actuation member defines first and second camming surfaces and wherein the stop member of the deflection arrangement is disposed between first and second cam followers, the stop member being flexibly coupled to the cam followers and the cam followers being flexibly coupled to the tray.

8. The panel system of claim 7, wherein the stop member is flexibly coupled to the cam followers by flexural pivots.

9. The panel system of claim 5, wherein the latching arrangement includes a biasing member and an actuation member, the biasing member including a first deflectable arm carrying a first stop member and a second deflectable arm carrying a second stop member, the actuation member being slidable relative to the biasing member.

10. The panel system of claim 5, wherein the latching arrangement includes a biasing member having a mounting section fixedly coupled to the tray and an actuation member slidably mounted to the tray, the actuation member being configured to slide relative to the biasing member.

11. The panel system of claim 10, wherein the biasing member includes a first arm extending outwardly from the mounting section in a first direction and a second arm extending outwardly from the mounting section in a generally opposite second direction, the first and second arms being deflectable relative to the mounting section, a first stop member being defined or carried at a free end of the first arm to deflect relative to the mounting section and a second stop member being defined or carried at a free end of the second arm to deflect relative to the mounting section.

12. The panel system of claim 11, wherein each of the arms defines a ramped portion, wherein the actuation member carries an actuator member, the actuator member aligning with the ramped portion of the first arm of the biasing member so that, when the actuation member is disposed in a neutral position, the actuator member allows the first arm to bias the first stop member into engagement with a respective catch surface.

13. The panel system of claim 10, wherein the actuation member defines a mounting section that aligns with the mounting section of the biasing member.

14. The panel system of claim 1, further comprising a plurality of removable cable guides separately mounted to the tray.

15. The panel system of claim 14, wherein a first of the removable cable guides includes a guide body, the guide body defining a through-passage, the first removable cable guide also including a release member extending outwardly from the guide body, the release member cooperating with the guide body to define a tray-receiving slot, the release member being sufficiently flexible to enable selective enlargement of the tray-receiving slot as the first removable cable guide is mounted to the tray.

16. The panel system of claim 15, wherein the tray-receiving slot extends between opposing first and second retaining tabs, the first retaining tab being defined by the guide body and the second retaining tab being defined by the release member.

17. The panel system of claim 1, wherein the cable guide defines a through-passage along which one or more cables can be guided.

18. The panel system of claim 12, wherein the actuator member is a first actuator member; wherein the actuation member also carries a second actuator member at an opposite end of a mounting section from the first actuator member, the second actuator member aligning with the ramped portion of the second arm of the biasing member so that, when the actuation member is disposed in a neutral position, the second actuator member allows the second arm to bias the second stop member into engagement with a respective catch surface.

* * * * *